(12) United States Patent
Fazan

(10) Patent No.: US 11,081,486 B2
(45) Date of Patent: Aug. 3, 2021

(54) INTEGRATED CIRCUIT HAVING MEMORY CELL ARRAY INCLUDING BARRIERS, AND METHOD OF MANUFACTURING SAME

(71) Applicant: OVONYX MEMORY TECHNOLOGY, LLC, Alexandria, VA (US)

(72) Inventor: Pierre C. Fazan, Lonay (CH)

(73) Assignee: OVONYX MEMORY TECHNOLOGY, LLC, Alexandria, VA (US)

( * ) Notice: Subject to any disclaimer, the term of this patent is extended or adjusted under 35 U.S.C. 154(b) by 108 days.

(21) Appl. No.: 16/424,344

(22) Filed: May 28, 2019

(65) Prior Publication Data

US 2019/0279985 A1    Sep. 12, 2019

Related U.S. Application Data

(60) Continuation of application No. 14/028,309, filed on Sep. 16, 2013, now Pat. No. 10,304,837, which is a
(Continued)

(51) Int. Cl.
*H01L 27/105* (2006.01)
*G11C 11/404* (2006.01)
(Continued)

(52) U.S. Cl.
CPC ........ *H01L 27/1052* (2013.01); *G11C 11/404* (2013.01); *H01L 21/84* (2013.01);
(Continued)

(58) Field of Classification Search
CPC . H01L 29/788; H01L 27/1052; H01L 27/108; H01L 27/10802; H01L 27/10844;
(Continued)

(56) References Cited

U.S. PATENT DOCUMENTS

| 3,439,214 A | 4/1969 | Kabell |
| 3,997,799 A | 12/1976 | Baker |

(Continued)

FOREIGN PATENT DOCUMENTS

| CA | 272437 A | 7/1927 |
| EP | 030856 A1 | 6/1981 |

(Continued)

OTHER PUBLICATIONS

Arimoto et al., A Configurable Enhanced T2RAM Macro for System-Level Power Management Unified Memory, 2006, VLSI Symposium, 2 pages.
(Continued)

*Primary Examiner* — Quoc D Hoang
(74) *Attorney, Agent, or Firm* — Wilmer Cutler Pickering Hale and Dorr LLP

(57) ABSTRACT

An integrated circuit device having (i) a memory cell array which includes a plurality of memory cells arranged in a matrix of rows and columns, wherein each memory cell includes at least one transistor having a gate, gate dielectric and first, second and body regions, wherein: (i) the body region of each transistor is electrically floating and (ii) the transistors of adjacent memory cells have a common first region and/or a common second region. Each common first region and/or second regions of transistors of adjacent memory cells includes a barrier disposed therein and/or therebetween, wherein each barrier provides a discontinuity in the common regions and/or includes one or more electrical characteristics that are different from one or more corresponding electrical characteristics of the common regions.

20 Claims, 62 Drawing Sheets

US 11,081,486 B2
Page 2

Related U.S. Application Data division of application No. 12/268,671, filed on Nov. 11, 2008, now Pat. No. 8,536,628.

(60) Provisional application No. 61/004,672, filed on Nov. 29, 2007.

(51) Int. Cl.
| | | |
|---|---|---|
| *H01L 21/84* | (2006.01) | |
| *H01L 27/108* | (2006.01) | |
| *H01L 27/12* | (2006.01) | |
| *H01L 29/78* | (2006.01) | |
| *H01L 27/115* | (2017.01) | |
| *H01L 29/16* | (2006.01) | |
| *H01L 29/20* | (2006.01) | |

(52) U.S. Cl.
CPC ...... *H01L 27/108* (2013.01); *H01L 27/10802* (2013.01); *H01L 27/10844* (2013.01); *H01L 27/1203* (2013.01); *H01L 29/7841* (2013.01); *G11C 2211/4016* (2013.01); *H01L 27/115* (2013.01); *H01L 29/1608* (2013.01); *H01L 29/20* (2013.01); *H01L 29/2003* (2013.01)

(58) Field of Classification Search
CPC . H01L 27/1203; H01L 21/84; H01L 29/7841; H01L 29/1608
See application file for complete search history.

(56) References Cited

U.S. PATENT DOCUMENTS

| | | | |
|---|---|---|---|
| 4,032,947 | A | 6/1977 | Kesel et al. |
| 4,250,569 | A | 2/1981 | Sasaki et al. |
| 4,262,340 | A | 4/1981 | Sasaki et al. |
| 4,298,962 | A | 11/1981 | Hamano et al. |
| 4,371,955 | A | 2/1983 | Sasaki |
| 4,630,089 | A | 12/1986 | Sasaki et al. |
| 4,658,377 | A | 4/1987 | McElroy |
| 4,791,610 | A | 12/1988 | Takemae |
| 4,807,195 | A | 2/1989 | Busch et al. |
| 4,954,989 | A | 9/1990 | Auberton-Herve et al. |
| 4,979,014 | A | 12/1990 | Hieda et al. |
| 5,010,524 | A | 4/1991 | Fifield et al. |
| 5,144,390 | A | 9/1992 | Matloubian |
| 5,164,805 | A | 11/1992 | Lee |
| 5,258,635 | A | 11/1993 | Nitayama et al. |
| 5,313,432 | A | 5/1994 | Lin et al. |
| 5,315,541 | A | 5/1994 | Harari et al. |
| 5,350,938 | A | 9/1994 | Matsukawa et al. |
| 5,355,330 | A | 10/1994 | Hisamoto et al. |
| 5,388,068 | A | 2/1995 | Ghoshal et al. |
| 5,397,726 | A | 3/1995 | Bergemont |
| 5,432,730 | A | 7/1995 | Shubat et al. |
| 5,446,299 | A | 8/1995 | Acovic et al. |
| 5,448,513 | A | 9/1995 | Hu et al. |
| 5,466,625 | A | 11/1995 | Hsieh et al. |
| 5,489,792 | A | 2/1996 | Hu et al. |
| 5,506,436 | A | 4/1996 | Hayashi et al. |
| 5,515,383 | A | 5/1996 | Katoozi |
| 5,526,307 | A | 6/1996 | Yiu et al. |
| 5,528,062 | A | 6/1996 | Hsieh et al. |
| 5,568,356 | A | 10/1996 | Schwartz |
| 5,583,808 | A | 12/1996 | Brahmbhatt |
| 5,593,912 | A | 1/1997 | Rajeevakumar |
| 5,606,188 | A | 2/1997 | Bronner et al. |
| 5,608,250 | A | 3/1997 | Kalnitsky |
| 5,627,092 | A | 5/1997 | Alsmeier et al. |
| 5,631,186 | A | 5/1997 | Park et al. |
| 5,677,867 | A | 10/1997 | Hazani |
| 5,696,718 | A | 12/1997 | Hartmann |
| 5,740,099 | A | 4/1998 | Tanigawa |
| 5,754,469 | A | 5/1998 | Hung et al. |
| 5,774,411 | A | 6/1998 | Hsieh et al. |
| 5,778,243 | A | 7/1998 | Aipperspach et al. |
| 5,780,906 | A | 7/1998 | Wu et al. |
| 5,784,311 | A | 7/1998 | Assaderaghi et al. |
| 5,798,968 | A | 8/1998 | Lee et al. |
| 5,811,283 | A | 9/1998 | Sun |
| 5,847,411 | A | 12/1998 | Morii |
| 5,877,978 | A | 3/1999 | Morishita et al. |
| 5,886,376 | A | 3/1999 | Acovic et al. |
| 5,886,385 | A | 3/1999 | Arisumi et al. |
| 5,897,351 | A | 4/1999 | Forbes |
| 5,929,479 | A | 7/1999 | Oyama |
| 5,930,648 | A | 7/1999 | Yang |
| 5,936,265 | A | 8/1999 | Koga |
| 5,939,745 | A | 8/1999 | Park et al. |
| 5,943,258 | A | 8/1999 | Houston et al. |
| 5,943,581 | A | 8/1999 | Lu et al. |
| 5,960,265 | A | 9/1999 | Acovic et al. |
| 5,963,473 | A | 10/1999 | Norman |
| 5,968,840 | A | 10/1999 | Park et al. |
| 5,977,578 | A | 11/1999 | Tang |
| 5,982,003 | A | 11/1999 | Hu et al. |
| 5,986,914 | A | 11/1999 | McClure |
| 6,018,172 | A | 1/2000 | Hidaka et al. |
| 6,048,756 | A | 4/2000 | Lee et al. |
| 6,081,443 | A | 6/2000 | Morishita et al. |
| 6,096,598 | A | 8/2000 | Furukawa et al. |
| 6,097,056 | A | 8/2000 | Hsu et al. |
| 6,097,624 | A | 8/2000 | Chung et al. |
| 6,111,778 | A | 8/2000 | MacDonald et al. |
| 6,121,077 | A | 9/2000 | Hu et al. |
| 6,133,597 | A | 10/2000 | Li et al. |
| 6,157,216 | A | 12/2000 | Lattimore et al. |
| 6,171,923 | B1 | 1/2001 | Chi et al. |
| 6,177,300 | B1 | 1/2001 | Houston et al. |
| 6,177,698 | B1 | 1/2001 | Gruening et al. |
| 6,177,708 | B1 | 1/2001 | Kuang et al. |
| 6,214,694 | B1 | 4/2001 | Leobandung et al. |
| 6,222,217 | B1 | 4/2001 | Kunikiyo |
| 6,225,158 | B1 | 5/2001 | Furukawa et al. |
| 6,229,161 | B1 | 5/2001 | Nemati et al. |
| 6,245,613 | B1 | 6/2001 | Hsu et al. |
| 6,252,281 | B1 | 6/2001 | Yamamoto et al. |
| 6,262,935 | B1 | 7/2001 | Parris et al. |
| 6,292,424 | B1 | 9/2001 | Ohsawa |
| 6,297,090 | B1 | 10/2001 | Kim |
| 6,300,649 | B1 | 10/2001 | Hu et al. |
| 6,333,532 | B1 | 12/2001 | Davari et al. |
| 6,333,866 | B1 | 12/2001 | Ogata |
| 6,350,653 | B1 | 2/2002 | Adkisson et al. |
| 6,351,426 | B1 | 2/2002 | Ohsawa |
| 6,359,802 | B1 | 3/2002 | Lu et al. |
| 6,384,445 | B1 | 5/2002 | Hidaka et al. |
| 6,391,658 | B1 | 5/2002 | Gates et al. |
| 6,403,435 | B1 | 6/2002 | Kang et al. |
| 6,421,269 | B1 | 7/2002 | Somasekhar et al. |
| 6,424,011 | B1 | 7/2002 | Assaderaghi et al. |
| 6,424,016 | B1 | 7/2002 | Houston |
| 6,429,477 | B1 | 8/2002 | Mandelman et al. |
| 6,432,769 | B1 | 8/2002 | Fukuda et al. |
| 6,440,872 | B1 | 8/2002 | Mandelman et al. |
| 6,441,435 | B1 | 8/2002 | Chan |
| 6,441,436 | B1 | 8/2002 | Wu et al. |
| 6,466,511 | B2 | 10/2002 | Fujita et al. |
| 6,479,862 | B1 | 11/2002 | King et al. |
| 6,480,407 | B1 | 11/2002 | Keeth |
| 6,492,211 | B1 | 12/2002 | Divakaruni et al. |
| 6,518,105 | B1 | 2/2003 | Yang et al. |
| 6,531,754 | B1 | 3/2003 | Nagano et al. |
| 6,537,871 | B2 | 3/2003 | Forbes et al. |
| 6,538,916 | B2 | 3/2003 | Ohsawa |
| 6,544,837 | B1 | 4/2003 | Divakauni et al. |
| 6,548,848 | B2 | 4/2003 | Horiguchi et al. |
| 6,549,450 | B1 | 4/2003 | Hsu et al. |
| 6,552,398 | B2 | 4/2003 | Hsu et al. |
| 6,552,932 | B1 | 4/2003 | Cernea |
| 6,556,477 | B2 | 4/2003 | Hsu et al. |
| 6,560,142 | B1 | 5/2003 | Ando |
| 6,563,733 | B2 | 5/2003 | Liu et al. |
| 6,566,177 | B1 | 5/2003 | Radens et al. |

(56) References Cited

U.S. PATENT DOCUMENTS

| | | |
|---|---|---|
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,891,225 B2 | 5/2005 | Horiguchi et al. |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portman et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Leong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi et al. |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller et al. |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,460,395 B1 | 12/2008 | Cho et al. |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,688,629 B2 | 3/2010 | Kim |
| 7,696,032 B2 | 4/2010 | Kim et al. |
| 8,315,099 B2 | 11/2012 | Van Buskirk et al. |
| 2001/0020718 A1 | 9/2001 | Takahashi et al. |
| 2001/0050406 A1 | 12/2001 | Akita et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1* | 8/2002 | Iwata .................. G11C 11/404 |
| | | 365/185.23 |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0141548 A1 | 7/2003 | Anderson et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0203546 A1 | 10/2003 | Burbach et al. |
| 2003/0231521 A1 | 12/2003 | Ohsawa |
| 2004/0021137 A1 | 2/2004 | Fazan et al. |
| 2004/0021179 A1 | 2/2004 | Lee et al. |
| 2004/0029335 A1 | 2/2004 | Lee et al. |
| 2004/0075143 A1 | 4/2004 | Bae et al. |
| 2004/0108532 A1 | 6/2004 | Forbes |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0179079 A1 | 8/2005 | Wu |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2006/0256606 A1 | 11/2006 | Park |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |

(56) References Cited

U.S. PATENT DOCUMENTS

| | | |
|---|---|---|
| 2007/0263466 A1 | 11/2007 | Morishita et al. |
| 2007/0278578 A1 | 12/2007 | Yoshida et al. |
| 2008/0049486 A1 | 2/2008 | Gruening-Von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Deml et al. |
| 2008/0144378 A1 | 6/2008 | Park et al. |
| 2008/0165577 A1 | 7/2008 | Fazan et al. |
| 2008/0251830 A1 | 10/2008 | Higashi et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | Ei-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 175378 A2 | 3/1986 |
| EP | 202515 A1 | 11/1986 |
| EP | 207619 A1 | 1/1987 |
| EP | 245515 A1 | 11/1987 |
| EP | 253631 A2 | 1/1988 |
| EP | 300157 A2 | 1/1989 |
| EP | 333426 A2 | 9/1989 |
| EP | 350057 A1 | 1/1990 |
| EP | 354348 A2 | 2/1990 |
| EP | 359551 A2 | 3/1990 |
| EP | 362961 A1 | 4/1990 |
| EP | 366882 A2 | 5/1990 |
| EP | 465961 A1 | 1/1992 |
| EP | 510607 A1 | 10/1992 |
| EP | 513923 A1 | 11/1992 |
| EP | 537677 A2 | 4/1993 |
| EP | 564204 A2 | 10/1993 |
| EP | 579566 A2 | 1/1994 |
| EP | 599388 A1 | 6/1994 |
| EP | 599506 A1 | 6/1994 |
| EP | 601590 A2 | 6/1994 |
| EP | 606758 A1 | 7/1994 |
| EP | 642173 A1 | 3/1995 |
| EP | 682370 A1 | 11/1995 |
| EP | 689252 A1 | 12/1995 |
| EP | 694977 A2 | 1/1996 |
| EP | 725402 A2 | 8/1996 |
| EP | 726601 A1 | 8/1996 |
| EP | 727820 A1 | 8/1996 |
| EP | 727822 A2 | 8/1996 |
| EP | 731972 A1 | 9/1996 |
| EP | 739097 A2 | 10/1996 |
| EP | 744772 A1 | 11/1996 |
| EP | 788165 A1 | 8/1997 |
| EP | 801427 A2 | 10/1997 |
| EP | 836194 A2 | 4/1998 |
| EP | 844671 A1 | 5/1998 |
| EP | 858109 A2 | 8/1998 |
| EP | 860878 A2 | 8/1998 |
| EP | 869511 A2 | 10/1998 |
| EP | 878804 A2 | 11/1998 |
| EP | 920059 A2 | 6/1999 |
| EP | 924766 A2 | 6/1999 |
| EP | 933820 A1 | 8/1999 |
| EP | 951072 A1 | 10/1999 |
| EP | 971360 A1 | 1/2000 |
| EP | 980101 A2 | 2/2000 |
| EP | 993037 A2 | 4/2000 |
| EP | 1073121 A2 | 1/2001 |
| EP | 1162663 A2 | 12/2001 |
| EP | 1162744 A1 | 12/2001 |
| EP | 1179850 A2 | 2/2002 |
| EP | 1180799 A2 | 2/2002 |
| EP | 1191596 A2 | 3/2002 |
| EP | 1204146 A1 | 5/2002 |
| EP | 1204147 A1 | 5/2002 |
| EP | 1209747 A2 | 5/2002 |
| EP | 1233454 A2 | 8/2002 |
| EP | 1237193 A2 | 9/2002 |
| EP | 1241708 A2 | 9/2002 |
| EP | 1253634 A2 | 10/2002 |
| EP | 1280205 A2 | 1/2003 |
| EP | 1288955 A2 | 3/2003 |
| FR | 2197494 A5 | 3/1974 |
| GB | 1414228 A | 11/1975 |
| JP | S62-007149 | 1/1987 |
| JP | 62-272561 A | 11/1987 |
| JP | 02-294076 A | 12/1990 |
| JP | 03-171768 A | 7/1991 |
| JP | H04-176163 U | 6/1992 |
| JP | 04-239177 A | 8/1992 |
| JP | 05-347419 A | 12/1993 |
| JP | 08-213624 A | 8/1996 |
| JP | 08-274277 A | 10/1996 |
| JP | H08-316337 | 11/1996 |
| JP | 09-046688 A | 2/1997 |
| JP | 09-082912 A | 3/1997 |
| JP | 10-242470 A | 9/1998 |
| JP | 11-087649 A | 3/1999 |
| JP | 12-247735 | 8/2000 |
| JP | 12-389106 A | 12/2000 |
| JP | 2002-009081 A | 1/2002 |
| JP | 2002-094027 A | 3/2002 |
| JP | 2002-176154 A | 6/2002 |
| JP | 2002-246571 A | 8/2002 |
| JP | 2002-329795 A | 11/2002 |
| JP | 2002-343886 A | 11/2002 |
| JP | 2002-353080 A | 12/2002 |
| JP | 2003-031693 A | 1/2003 |
| JP | 2003-68877 | 3/2003 |
| JP | 2003-086712 A | 3/2003 |
| JP | 2003-100641 A | 4/2003 |
| JP | 2003-100900 A | 4/2003 |
| JP | 2003-132682 A | 5/2003 |
| JP | 2003-203967 A | 7/2003 |
| JP | 2003-243528 A | 8/2003 |
| JP | 2004-335553 A | 11/2004 |
| JP | 13-180633 A | 6/2011 |
| WO | WO-2001/024268 A1 | 4/2001 |
| WO | WO-2005/008778 A1 | 1/2005 |

OTHER PUBLICATIONS

Arimoto, A High-Density Scalable Twin Transistor RAM (TTRAM) With Verify Control for SOI Platform Memory IPs, Nov. 2007, IEEE J. Solid-State Circuits, vol. 22, No. 11, p. 2611-2619.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, p. 809-812.

Assaderaghi et al., "A Dynamic Threshold Voltage Mosfet (DTMOS) for Very Low Voltage Operation", IEEE Electron Device Letters, vol. 15, No. 12, Dec. 1994, p. 510-512.

Assaderaghi et al., "A Novel Silicon-On-Insulator (SOI) MOSFET for Ultra Low Voltage Operation", 1994 IEEE Symposium on Low Power Electronics, p. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, p. 414-422.

Assaderaghi et al., "High-Field Transport of Inversion-Layer Electrons and Holes Including Velocity Overshoot", IEEE Transactions on Electron Devices, vol. 44, No. 4, Apr. 1997, p. 664-671.

Avci, Floating Body Cell (FBC) Memory for 16-nm Technology with Low Variation on Thin Silicon and 10-nm BOX, Oct. 2008, SOI Conference, 2 pages.

Bae, Evaluation of 1T RAM using Various Operation Methods with SOONO (Silicon-On-ONO) device, Dec. 2008, IEDM, p. 805-808.

(56) References Cited

OTHER PUBLICATIONS

Ban et al., Integration of Back-Gate Doping for 15-nm Node Floating Body Cell (FBC) Memory, Components Research, Process Technology Modeling, presented in the 2010 VLSI Symposium on Jun. 17, 2010, 2 pages.
Ban, A Scaled Floating Body Cell (FBC) Memory with High-k+ Metal Gate on Thin-Silicon and Thin-BOX for 16-nm Technology Node and Beyond, Jun. 2008, VLSI Symposium, p. 92-93.
Ban, Ibrahim, et al., "Floating Body Cell with Independently-Controlled Double Gates for High Density Memory," Electron Devices Meeting, 2006. IEDM '06. International, IEEE, p. 1-4, Dec. 2006.
Bawedin, Maryline, et al., A Capacitorless 1T Dram on SOI Based on Dynamic Coupling and Double-Gate Operation, IEEE Electron Device Letters, vol. 29, No. 7, Jul. 2008, p. 795-798.
Blagojevic et al., Capacitorless 1T DRAM Sensing Scheme Automatice Reference Generation, IEEE J.Solid State Circuits, vol. 41, No. 6, pp. 1463-1470, 2006.
Blalock, T. "A High-Speed Clamped Bit-Line Current-Mode Sense Amplifier", IEEE Journal of Solid-State Circuits, vol. 26, No. 4, Apr. 1991, p. 542-548.
Butt, Scaling Limits of Double Gate and Surround Gate Z-RAM Cells, IEEE Trans. Elec. Dev., vol. 54, No. 9, p. 2255-2262, Sep. 2007.
Chan et al., "Effects of Floating Body on Double Polysilicon Partially Depleted SOI Nonvolatile Memory Cell", IEEE Electron Device Letters, vol. 24, No. 2, Feb. 2003, p. 75-77.
Chan, et al., "SOI MOSFET Design for All-Dimensional Scaling with Short Channel, Narrow Width and Ultra-thin Films", IEEE IEDM, 1995, pp. 631-634.
Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.
Cho et al., "Novel DRAM Cell with Amplified Capacitor for Embedded Application", IEEE, Jun. 2009, p. 11.2.1-11.2.4.
Cho, A novel capacitor-less DRAM cell using Thin Capacitively-Coupled Thyristor (TCCT), 2005, IEDM, 4 pages.
Choi et al., Current Flow Mechanism in Schottky-Barrier MOSFET and Application to the 1T-DRAM, 2008, International Conference on SSDM, pp. 226-227.
Choi, High Speed Flash Memory and 1T-DRAM on Dopant Segregated Schottky Barrier (DSSB) FinFET SONOS Device for Multi-functional SoC Applications, Dec. 2008, IEDM, pp. 223-226.
Clarke, Junctionless Transistors Could Simply Chip Making, Say Researchers, EE Times, Feb. 2010, www.eetimes.com/showArticle.jhtml?articleID=223100050, 3 pages.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, IEEE EDL, vol. 30, No. 12, pp. 1377-1379, Dec. 2009.
Collaert, Comparison of scaled floating body RAM architectures, Oct. 2008, SOI Conference, 2 pages.
Ershov, Optimization of Substrate Doping for Back-Gate Control in SOI T-RAM Memory Technology, 2005, SOI Conference, pp. 1-2.
Ertosun et al., A Highly Scalable Capacitorless Double Gate Quantum Well Single Transistor DRAM: 1T-QW DRAM, 2008, IEEE EDL, pp. 1-3.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE, 14 pages.
Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).
Fisch, et al., Soft Error Performance of Z-RAM Floating Body Memory, 2006, SOI Conference, Lausanne, Switzerland, 2 pages.
Fisch, et al., Customizing SOI Floating Body Memory Architecture for System Performance and Lower Cost, 2006, SAME Forum, Lausanne, Switzerland, 3 pages.
Fisch, Z-RAM® Ultra-Dense Memory for 90nm and Below, 2006, Hot Chips, 35 pages.
Fossum et al., New Insights on Capacitorless Floating Body DRAM Cells, IEEE EDL, vol. 28, No. 6, pp. 513-516, Jun. 2007.
Fujita, Array Architecture of Floating Body Cell (FBC) with Quasi-Shielded Open Bit Line Scheme for sub-40nm Node, 2008, SOI Conference, 2 pages.
Furuhashi, et al., Scaling Scenario of Floating Body Cell (FBC) Suppressing $V_{th}$ Variation Due to Random Dopant Fluctuation, Dec. 2008, SOI Conference, 2 pages.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.
Gupta et al., SPICE Modeling of Self Sustained Operation (SSO) to Program Sub-90nm Floating Body Cells, Oct. 2009, Conf on Simulation of Semiconductor Processes & Devices, 4 pages.
Han et al., Bulk FinFET Unified-RAM (URAM) Cell for Multifunctioning NVM and Capacitorless 1T-DRAM, IEEE EDL, vol. 29, No. 6, pp. 632-634, Jun. 2008.
Han et al., Partially Depleted SONOS FinFET for Unified RAM (URAM) Unified Function for High-Speed 1T DRAM and Nonvolatile Memory, IEEE EDL, vol. 29, No. 7, pp. 781-783, Jul. 2008.
Han, Energy Band Engineered Unified-RAM (URAM) for Multi-Functioning 1T-DRAM and NVM, Dec. 2008, IEDM, pp. 227-230.
Han, Parasitic BJT Read Method for High-Performance Capacitorless 1T-DRAM Mode in Unified RAM, IEEE EDL, vol. 30, No. 10, pp. 1108-1110, Oct. 2009.
Hara, Y., "Toshiba's DRAM Cell Piggybacks on SOI Wafer", EE Times, Jun. 2003, 1 page.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI, 21 pages.
Jeong et al., "A Capacitor-less 1T DRAM Cell Based on a Surrounding Gate MOSFET with a Vertical Channel", Technology Development Team, Technology Development Team, Samsung Electronics Co., Ltd., pp. 92-93, May 2007.
Jeong et al., "A New Capacitorless 1T DRAM Cell: Surrounding Gate MOSFET with Vertical Channel (SGVC Cell)", IEEE Transactions on Nanotechnology, vol. 6, No. 3, May 2007, pp. 352-357.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.

(56) References Cited

OTHER PUBLICATIONS

Kim et al., "Chip Level Reliability on SOI Embedded Memory", Proceedings 1998 IEEE International SOI Conference, Oct. 1998, pp. 135-136.
Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub- 100-nm Embedded and Stand-Alone Memory Applications, IEEE Trans. Elec.. Dev., vol. 50, No. 12, pp. 2408-2416, Dec. 2003.
Kwon et al., "A Highly Scalable $4F^2$ DRAM Cell Utilizing a Doubly Gated Vertical Channel", Extended Abstracts of the 2009 International Conference on Solid State Devices and Materials, UC Berkley, p. 142-143, Sendai (2009).
Lee et al., "A Novel Pattern Transfer Process for Bonded SOI Giga-bit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI FLASH Memory Cell", IEEE, Mar. 2000, pp. 12-15.
Liu et al., Surface Generation-Recombination Processes of Gate and STI Oxide Interfaces Responsible for Junction Leakage on SOI, Sep. 2009, ECS Transactions, vol. 25, 10 pages.
Liu, Surface Recombination-Generation Processes of Gate, STI and Buried Oxide Interfaces, Responsible for Junction Leakage on SOI, ICSI, May 19, 2009, 2 pages.
Loncar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.
Lu et al., A Novel Two-Transistor Floating Body/Gate Cell for Low Power Nanoscale Embedded DRAM, Jun. 2008, IEEE Trans. Elec. Dev., vol. 55, No. 6, pp. 1511-1518.
Ma, et al., "Hot-Carrier Effects in Thin-Film Fully Depleted SOI MOSFET's", IEEE Electron Device Letters, vol. 15, No. 6, Jun. 1994, pp. 218-220.
Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.
Malinge, An 8Mbit DRAM Design Using a 1TBulk Cell, 2005 Symposium on VLSI Circuits Digest of Technical Papers, pp. 358-361.
Mandelman et al, "Floating-Body Concerns for SOI Dynamic Random Access Memory (DRAM)", Proceedings 1996 IEEE International SOI Conference, Oct. 1996, pp. 136-137.
Matsuoka et al., FBC Potential of $6F^2$ Single Cell Operation in Multi Gbit Memories Confirmed by a Newly Developed Method for Measuring Signal Sense Margin, 2007, IEEE, pp. 39-42.
Minami, A Floating Body Cell (FBC) fully Compatible with 90nm CMOS Technology(CMOS IV) for 128Mb SOI DRAM, 2005, IEDM Tech. Digest, pp. 317-320 (4 pages).
Mohapatra et al., Effect of Source/Drain Asymmetry on the Performance of Z-RAM® Devices, Oct. 2009, SOI conference, 2 pages.
Morishita, A Capacitorless Twin-Transistor Random Access Memory (TTRAM) on SOI, 2005, CICC, 4 pages.
Morishita, F. et al., "A Configurable Enhanced TTRAM Macro for System-Level Power Management Unified Memory", IEEE Journal of Solid -State Circuits, vol. 42, No. 4, pp. 853-861, Apr. 2007.
Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F. et al. "Dynamic Floating Body Control SOI CMOS Circuits for Power Managed Multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.
Nagoga, Studying of Hot Carrier Effect in Floating Body Soi Mosfets by the Transient Charge Pumping Technique, Switzerland 2003, 2 pages.
Nayfeh, A Leakage Current Model for SOI based Floating Body Memory that Includes the Poole-Frenkel Effect, 2008, SOI Conference, 2 pages.
Nemati, A Novel High Density, Low Voltage SRAM Cell with a Vertical NDR Device, 1998, VLSI Tech. Symp., 2 pages.
Nemati, A Novel Thyristor-based SRAM Cell (T-RAM) for High-Speed, Low-Voltage, Giga-scale Memories, 1999, IEDM Conference, 4 pages.
Nemati, Embedded Volatile Memories-Embedded Tutorial: The New Memory Revolution, New Drives Circuits and Systems, ICCAD 2008, Nov. 2008, San Jose, CA, 23 pages.
Nemati, Fully Planar $0.562\mu m^2$ T-RAM Cell in a 130nm SOI CMOS Logic Technology for High-Density High-Performance SRAMs, 2004, IEDM, 4 pages.
Nemati, Thyristor RAM (T-RAM): A High-Speed High-Density Embedded Memory Technology for Nano-scale CMOS, 2007, Hot Chips Conference, Milpitas, CA, 24 pages.
Nemati, Thyristor-RAM: A Novel Embedded Memory Technology that Outperforms Embedded SRAM/DRAM, 2008, Linley Tech Tour, San Jose, CA, 11 pages.
Nishiguchi et al., Long Retention of Gain-Cell Dynamic Random Access Memory with Undoped Memory Node, IEEE EDL, vol. 28, No. 1, pp. 48-50, Jan. 2007.
Oh, Floating Body DRAM Characteristics of Silicon-On-ONO (SOONO) Devices for System-on-Chip (SoC) Applications, 2007, Symposium on VLSI Technology Digest of Technical Papers, pp. 168-169.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006), 2 pages.
Ohsawa, et al., An 18.5ns 128Mb SOI DRAM with a Floating Body Cell, 2005, ISSCC, pp. 458-459 & 609 (3 pages).
Ohsawa, Autonomous Refresh of Floating Body Cell (FBC), Dec. 2008, IEDM, pp. 801-804.
Ohsawa, Design of a 128-Mb SOI DRAM Using the Floating Body Cell (FBC), IEEE J. Solid-State Circuits, vol. 41, No. 1, Jan. 2006, pp. 135-145.
Okhonin, A Capacitor-Less 1T-DRAM Cell, IEEE Electron Device Letters, vol. 23, No. 2, Feb. 2002, pp. 85-87.
Okhonin, A SOI Capacitor-less 1T-DRAM Concept, pp. 153-154, 2001, SOI Conference.
Okhonin, et al., Charge Pumping Effects in Partially Depleted SOI MOSFETs, 2003, SOI Conference, 2 pages.
Okhonin, et al., New characterization techniques for SOI and related devices, 2003, ECCTD, 1 page.
Okhonin, et al., New Generation of Z-RAM, 2007, IEDM, Lausanne, Switzerland, 3 pages.
Okhonin, Principles of Transient Charge Pumping on Partially Depleted SOI MOSFETs, May 2002, IEEE Electron Device Letters, vol. 23, No. 5, pp. 279-281.
Okhonin, et al., Transient Charge Pumping for Partially and Fully Depleted SOI MOSFETs, 2002, SOI Conference, 2 pages.
Okhonin, Transient effects in PD SOI MOSFETs and potential DRAM applications, 2002, Solid-State Electronics, vol. 46, pp. 1709-1713.

(56) References Cited

OTHER PUBLICATIONS

Okhonin, et al., Ultra-scaled Z-RAM cell, 2008, SOI Conference, 2 pages.
Okhonin, Z-RAM® (Limits of DRAM), 2009, ESSDERC, Lausanne, Switzerland, 64 pages.
Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008, pp. 171-174.
Park, Fully Depleted Double-Gate 1T-DRAM Cell with NVM Function for High Performance and High Density Embedded DRAM, 2009, IMW, pp. 32-33.
Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using Gate-Induced Drain-Leakage (GIDL) Current for High Speed and Low Power applications, 2008, pp. 224-225, SSDM.
Puget et al., Quantum effects influence on thin silicon film capacitor-less DRAM performance, 2006, SOI Conference, 2 pages.
Puget, FDSOI Floating Body Cell eDRAM Using Gate-Induced Drain-Leakage (GIDL) Write Current for High Speed and Low Power Applications, 2009, IMW, pp. 28-29.
Ranica et al., 1T-Bulk DRAM cell with improved performances: the way to scaling, 2005, ICMTD, 4 pages.
Ranica, et al., A capacitor-less DRAM cell on 75nm gate length, 16nm thin Fully Depleted SOI device for high density embedded memories, 2004, IEDM 4 pages.
Ranica, A One Transistor Cell on Bulk Substrate (1T-Bulk) for Low-Cost and High Density eDRAM, 2004, Symposium on VLSI Technology Digest of Technical Papers, pp. 128-129 (2 pages).
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM: Novel Capacitor-less DRAM Memory, SOI Conference, 2009 IEEE International, Oct. 5-8, 2009 pp. 1-2.
Roy, et al., Thyristor-Based Volatile Memory in Nano-Scale CMOS, 2006, ISSCC, 10 pages.
Sailing et al., Reliability of Thyristor Based Memory Cells, 2009, IRPS, 7 pages.
Sasaki et al., Charge Pumping in SOS-MOS Transistors, IEEE Trans. Elec. Dev., vol. ED-28, No. 1, Jan. 1981, pp. 48-52.
Sasaki et al., Charge Pumping SOS-MOS Transistor Memory, 1978, IEDM, pp. 356-359 (4 pages and clear graph of Fig. 10).
Schloesser et al., "A $6F^2$ Buried Wordline DRAM Cell for 40nm and Beyond", IEEE, Qimonda Dresden GmbH & Co., pp. 809-812 (2008).
Shino et al., Floating Body RAM Technology and its Scalability to 32nm Node and Beyond, 2006, IEDM, 4 pages.
Shino et al., Operation Voltage Dependence of Memory Cell Characteristics in Fully Depleted Floating Body Cell, IEEE Trans. Elec. Dev., vol. 25, No. 10, Oct. 2005, pp. 2220-2226.
Shino, et al., Fully-Depleted FBC (Floating Body Cell) with Enlarged Signal Window and Excellent Logic Process Compatibility, 2004, IEDM, 4 pages.
Shino, et al. Highly Scalable FBC (Floating Body Cell) with 25nm BOX Structure for Embedded DRAM Applications, 2004, Symposium on VLSI Technology, pp. 132-133 (2 pages).
Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.
Singh, et al., A 2ns-Read-Latency 4Mb Embedded Floating-Body Memory Macro in 45nm SOI Technology, Feb. 2009, ISSCC, 3 pages.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.
Song, et al., 55 nm Capacitor-less 1T DRAM Cell Transistor with Non-Overlap Structure, Dec. 2008, IEDM, pp. 797-800.
Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).
Suma et al., "An SOI-DRAM with Wide Operating Voltage Range by CMOS/SIMOX Technology", 1994 IEEE International Solid-State Circuits Conference, pp. 138-139.
Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.
Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.
Tack et al., "The Multistable Charge-Controlled Memory Effect in SOI MOS Transistors at Low Temperatures", IEEE Transactions on Electron Devices, vol. 37, No. 5, May 1990, pp. 1373-1382.
Tack, et al., "An Analytical Model for the Misis Structure in SOI MOS Devices", Solid-State Electronics vol. 33, No. 3, 1990, pp. 357-364.
Tanabe et al., a 30-ns 64-MB DRAM with Built-in-Self-Test and Self-Repair Function, IEEE Journal of Solid State Circuits, vol. 27, No. 11, Nov. 1992, pp. 1525-1533.
Tanaka et al., "Scalability Study on a Capacitorless 1T-DRAM: From Single-gate PD-SOI to Double-gate FINDRAM", 2004 IEEE, 4 pages.
Tang, et al., Highly Scalable Capacitorless DRAM Cell on Thin-Body with Band-gap Engineered Source and Drain, Extended Abstracts of the 2009 ICSSDM, Sendai, 2009, pp. 144-145.
Terauchi et al., "Analysis of Floating-Body-Induced Leakage Current in 0.15µ m SOI DRAM", Proceedings 1996 IEEE International SOI Conference, Oct. 1996, pp. 138-139.
Thomas et al., "An SOI 4 Transistors Self-Refresh Ultra-Low-Voltage Memory Cell", IEEE, Mar. 2003, pp. 401-404.
Tomishima, et al., "A Long Data Retention SOI DRAM with the Body Refresh Function", IEICE Trans. Electron., vol. E80-C, No. 7, Jul. 1997, pp. 899-904.
Tsaur et al., "Fully Isolated Lateral Bipolar-MOS Transistors Fabricated in Zone-Melting-Recrystallized Si Films on $SiO_2$", IEEE Electron Device Letters, vol. EDL-4, No. 8, Aug. 1983, pp. 269-271.
Tu, et al., "Simulation of Floating Body Effect in SOI Circuits Using BSIM3SOI", Proceedings of Technical Papers (IEEE Cat No. 97TH8303), Jun. 1997, pp. 339-342.
Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (2 pages).
Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).
Villaret et al., Further Insight into the Physics and Modeling of Floating Body Capacitorless DRAMs, IEEE Trans. Elec. Dev., vol. 52, No. 11, Nov. 2005, pp. 2447-2454.
Wang et al., A Novel $4.5F^2$ Capacitorless Semiconductor Memory Device, 2008, IEEE EDL, pp. 1-2.
Wann et al., "A Capacitorless DRAM Cell on SOI Substrate", IEEE IEDM, 1993, pp. 635-638.
Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

(56) References Cited

OTHER PUBLICATIONS

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, et al., Optimization of Nanoscale Thyristors on SOI for High-Performance High-Density Memories, 2006, SOI Conference, 2 pages.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using Gate-Induced Drain-Leakage (GIDL) Current for Low Power and High Speed Embedded Memory, IEEE Trans. Elec. Dev., vol. 53, No. 4, Apr. 2006, pp. 692-697.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in Silicon-On-ONO (SOONO) Device for the Capacitor-less RAM Applications, 2007, SOI Conference, 2 pages.

Zhou, Physical Insights on BJT-Based 1T DRAM Cells, IEEE Electron Device Letters, vol. 30, No. 5, May 2009, pp. 565-567.

\* cited by examiner

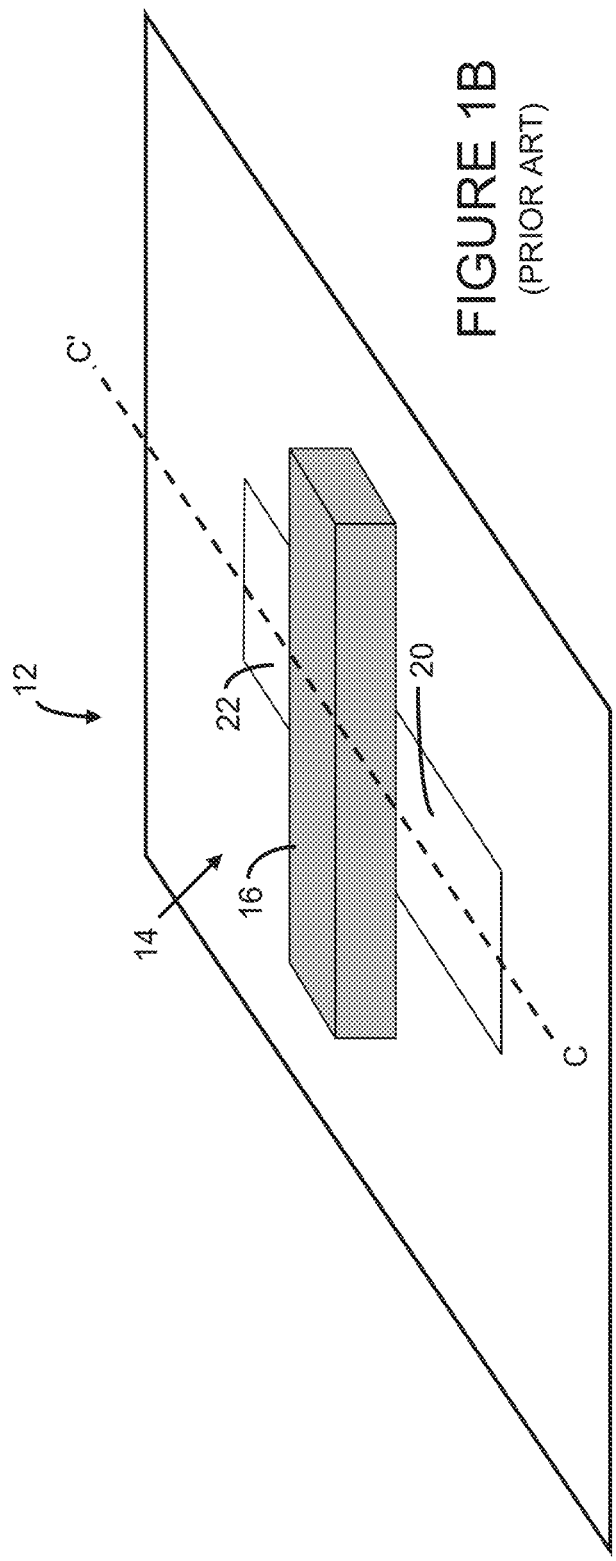
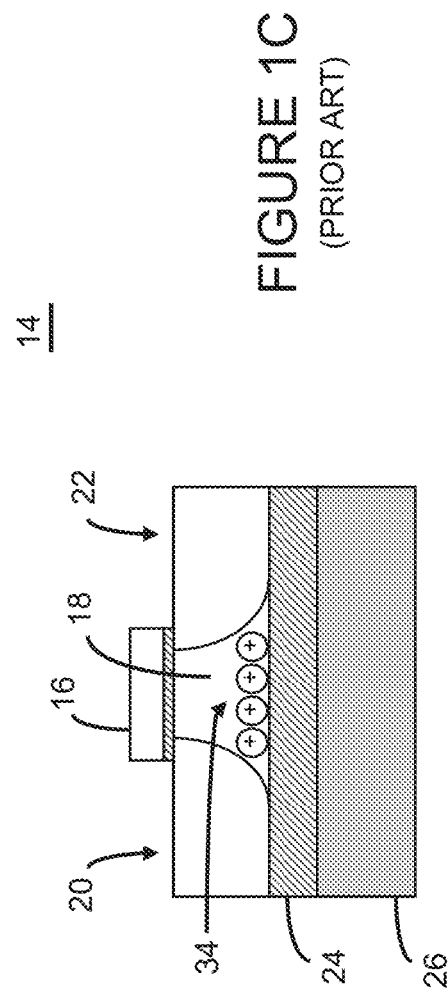

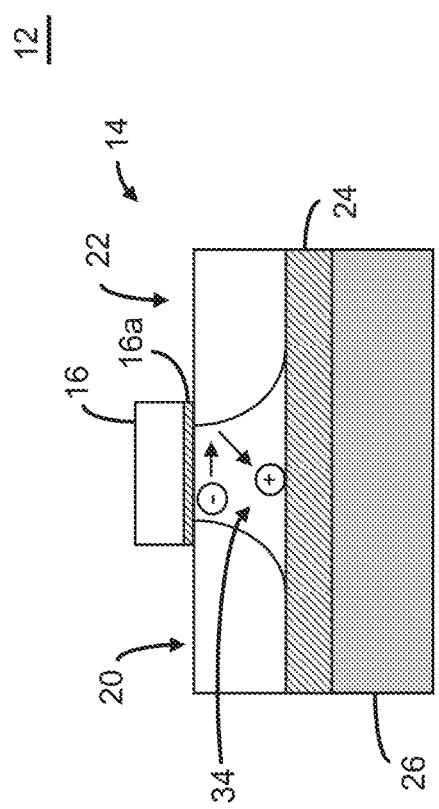
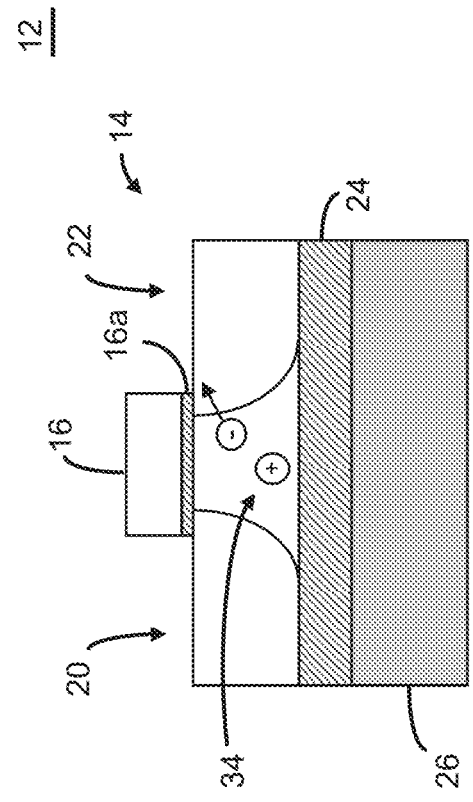

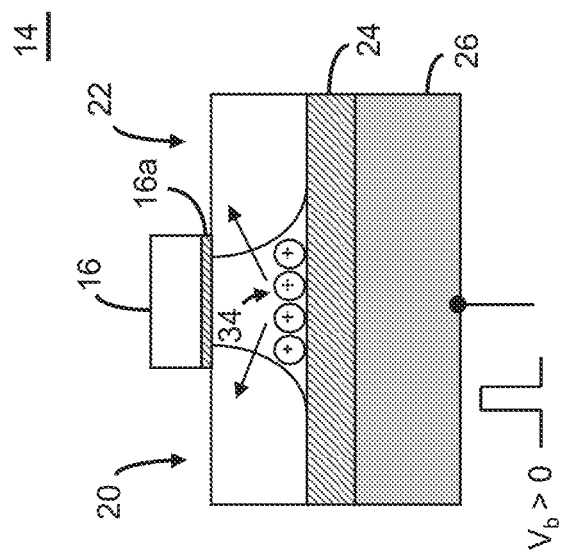
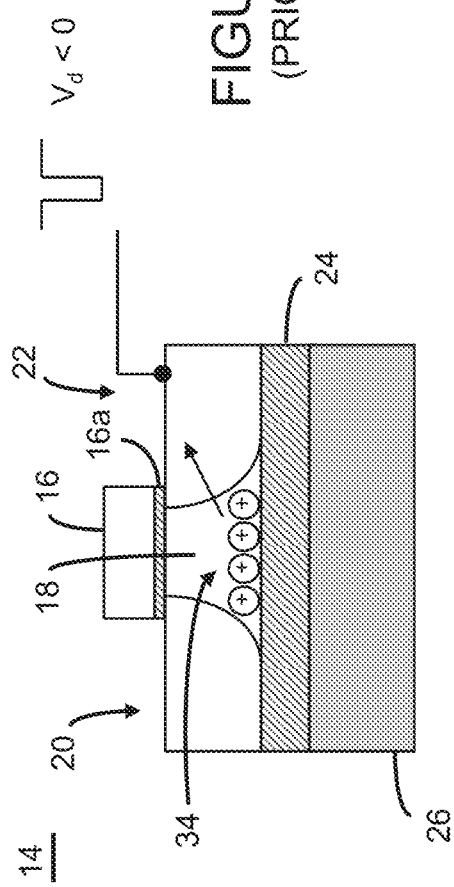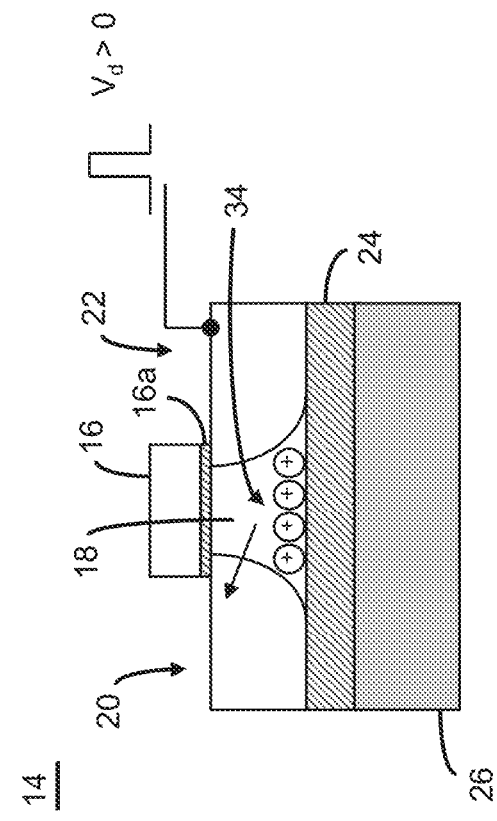
FIGURE 4A (PRIOR ART)
FIGURE 4B (PRIOR ART)
FIGURE 4C (PRIOR ART)

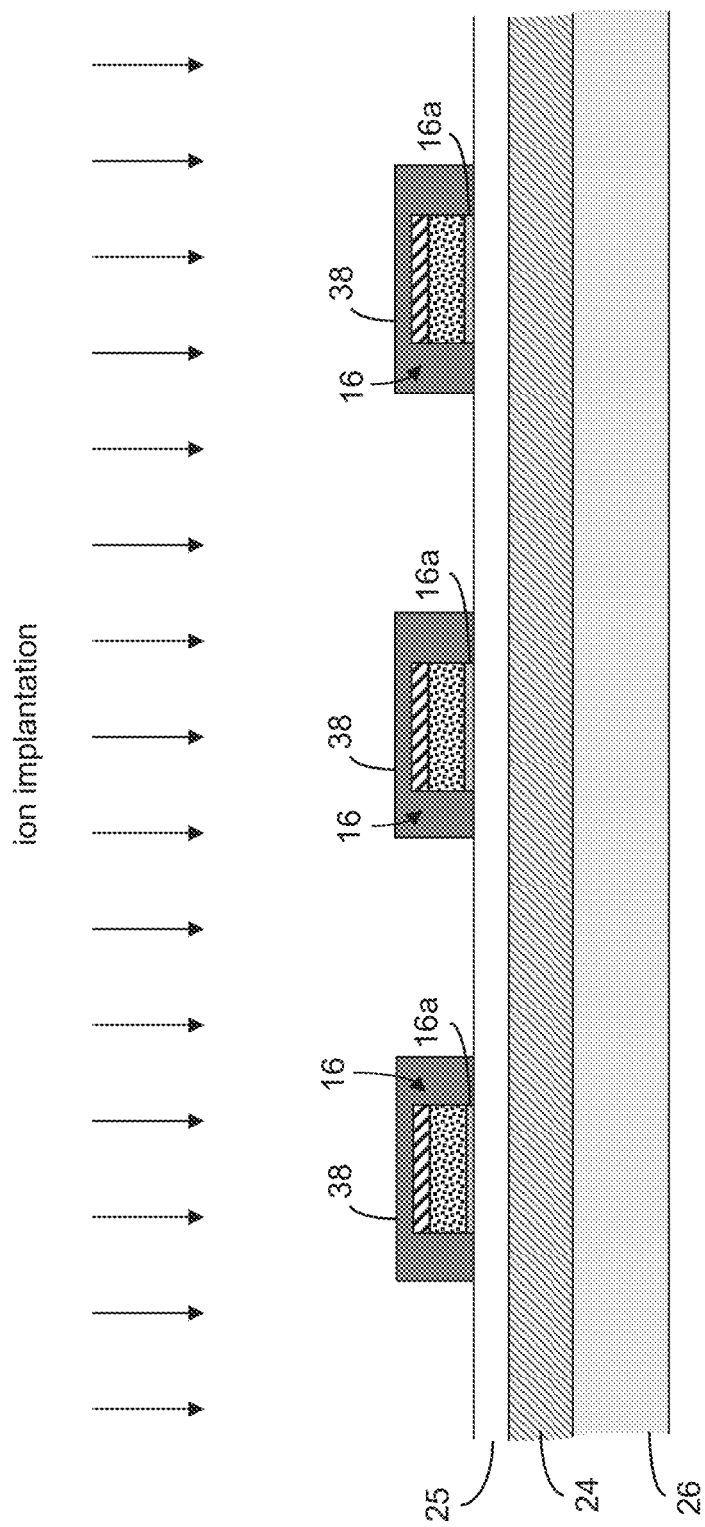

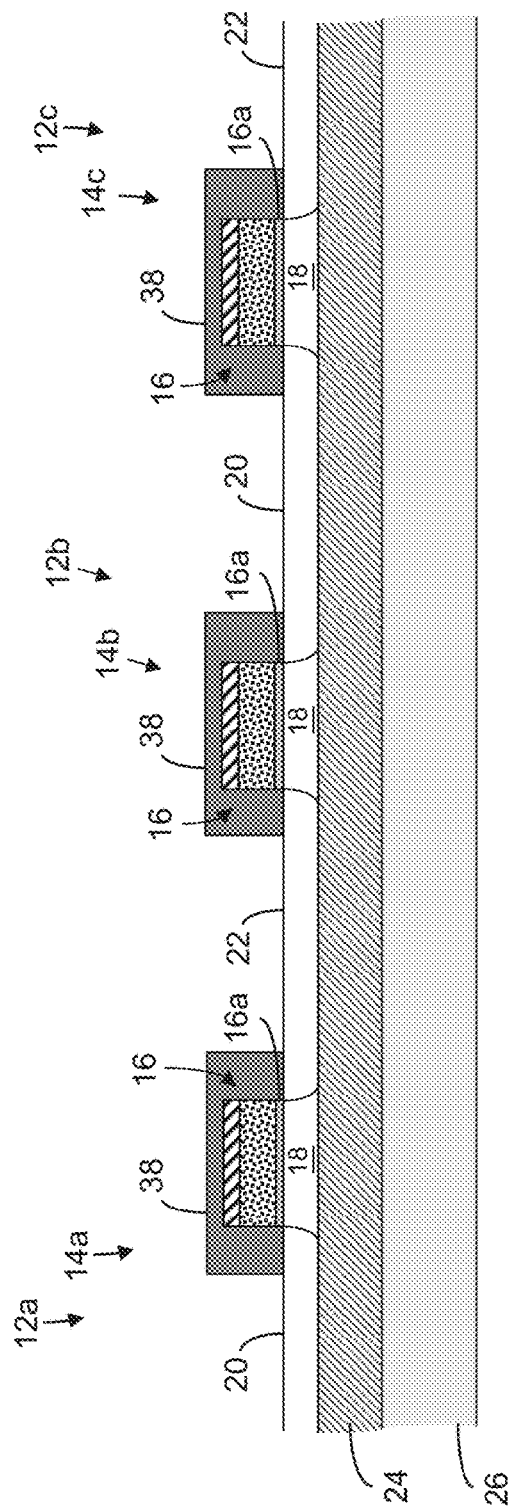
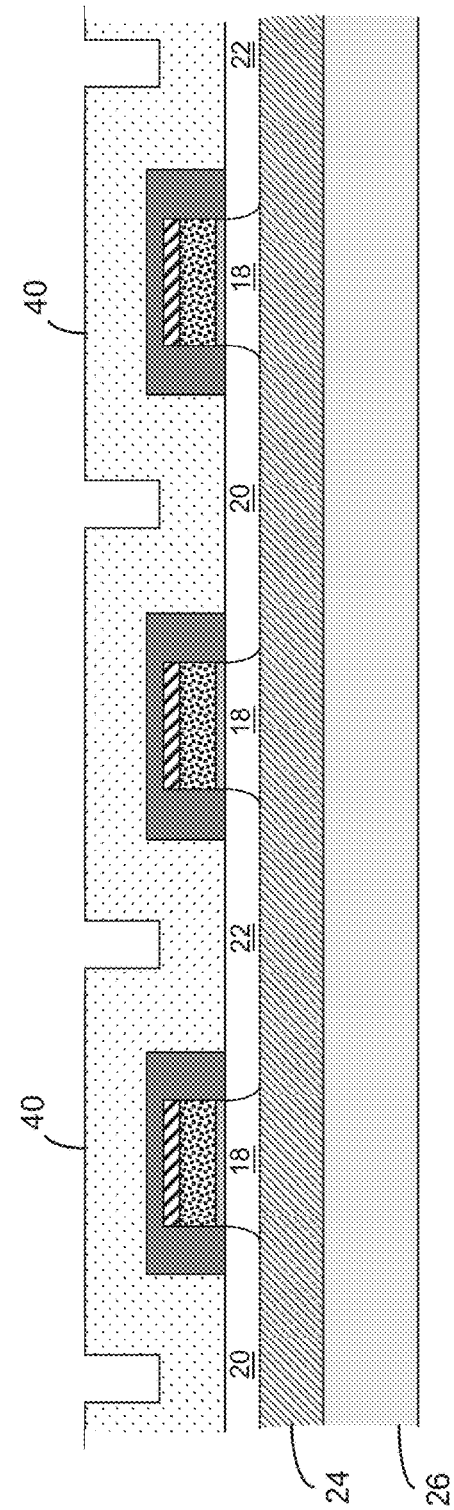

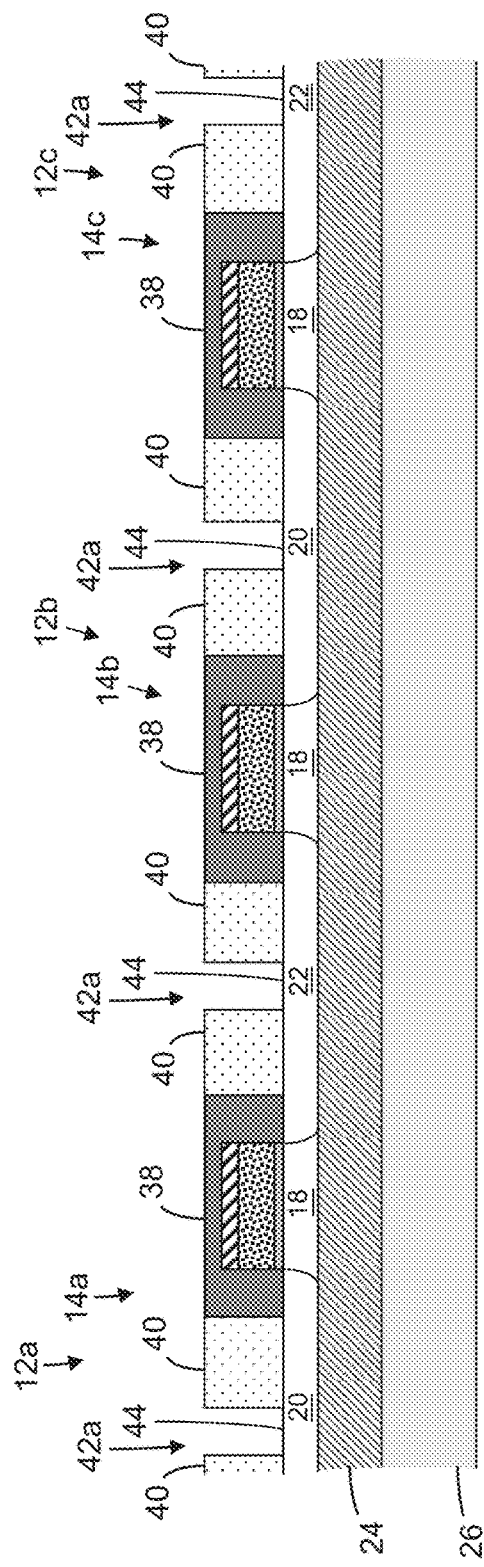
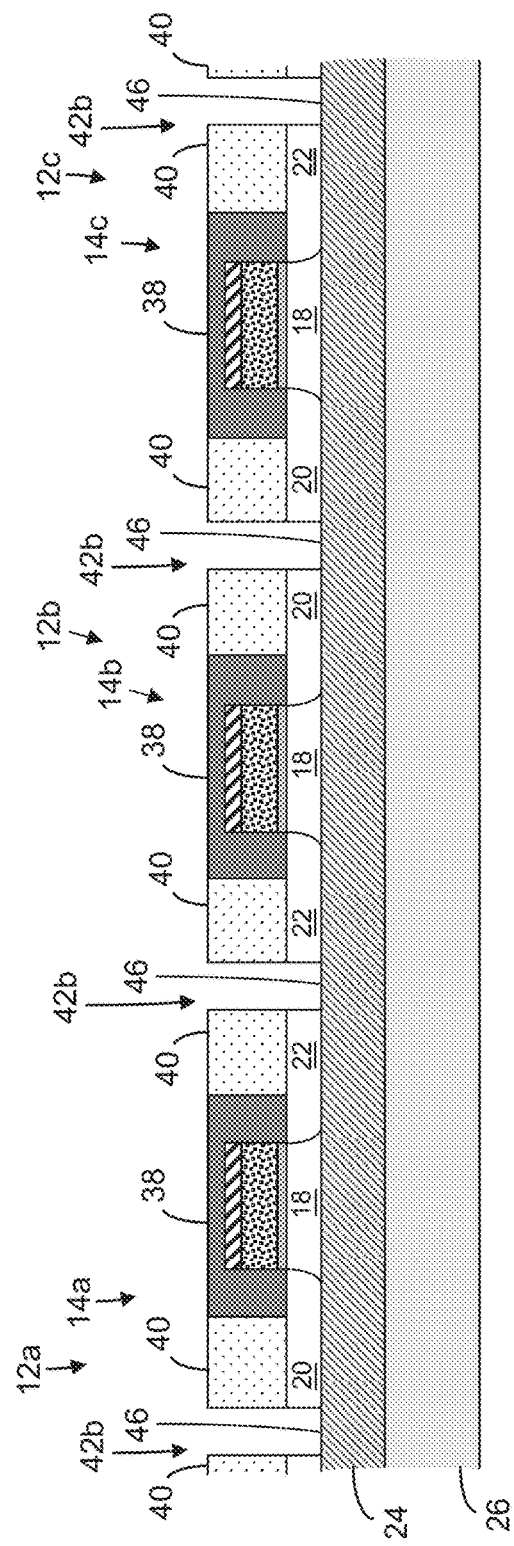

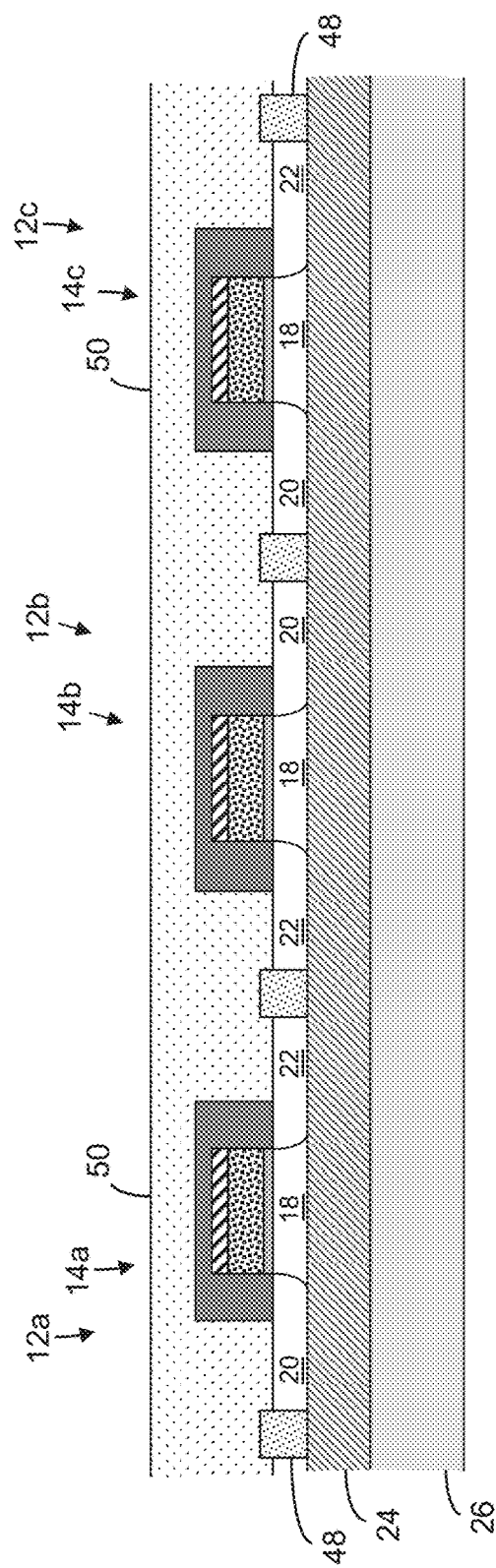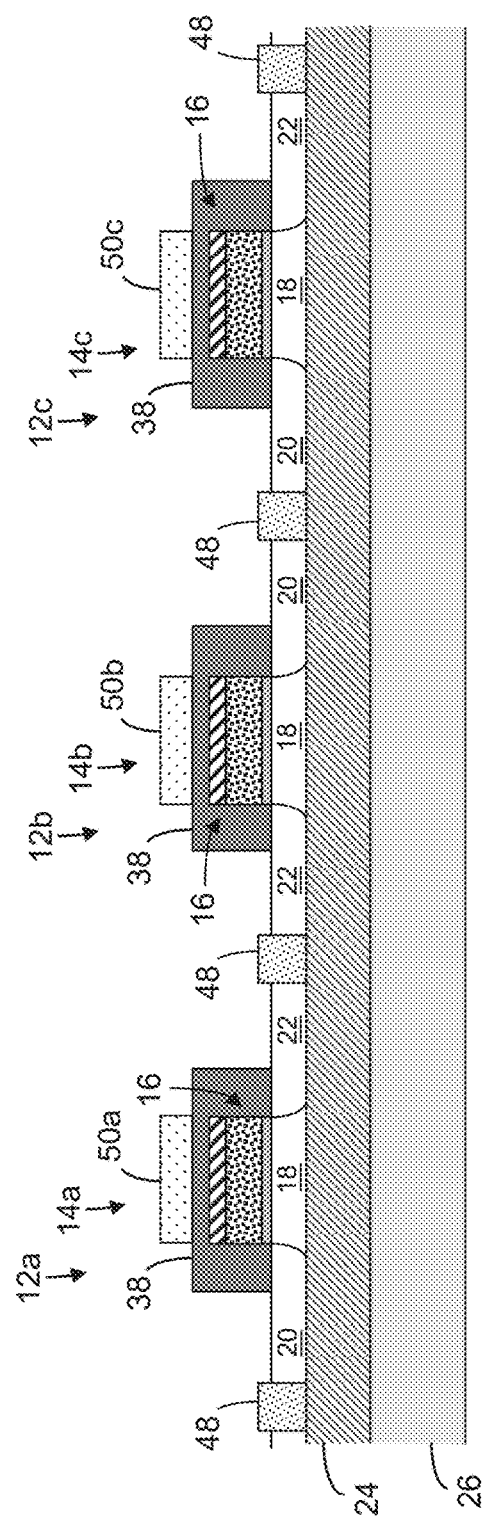

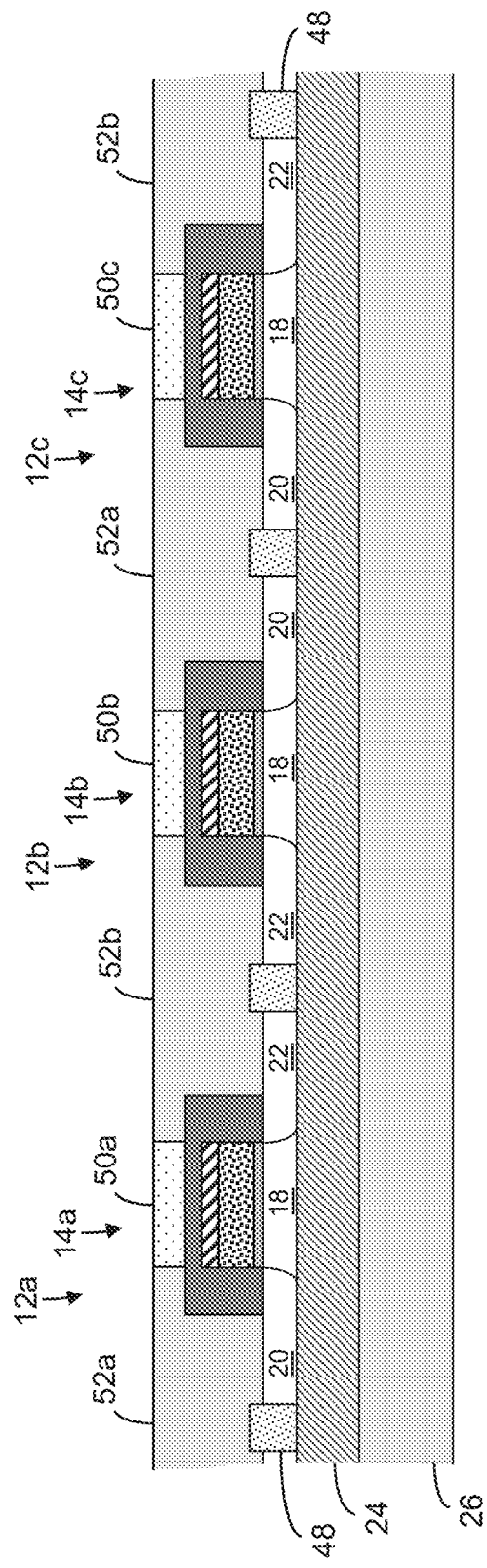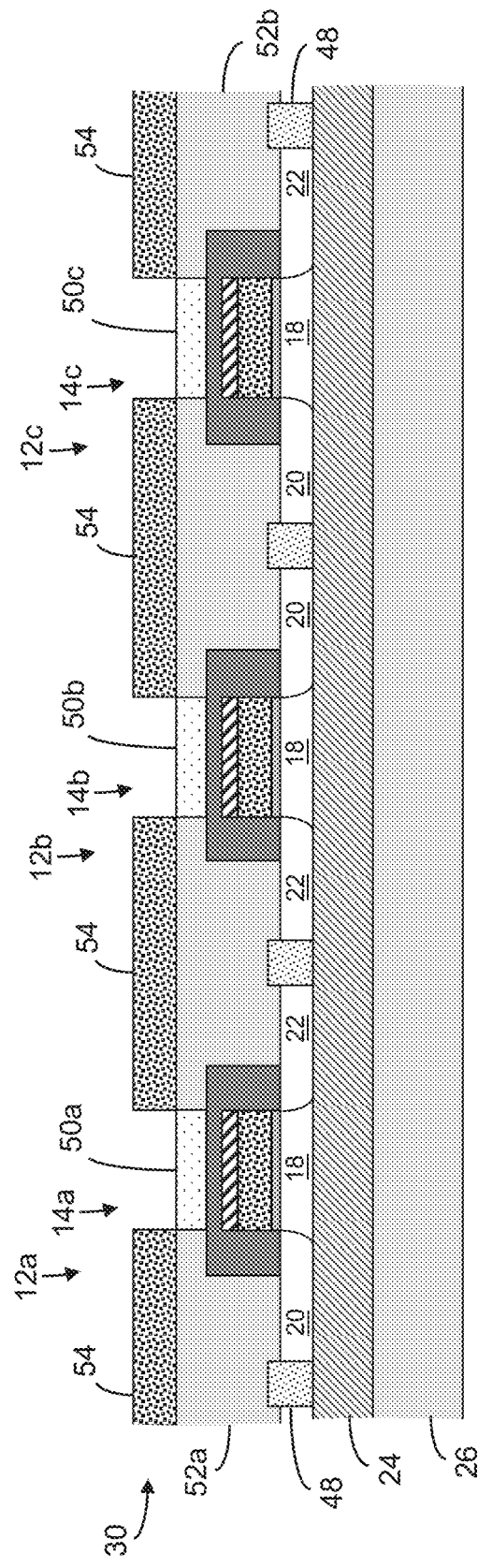

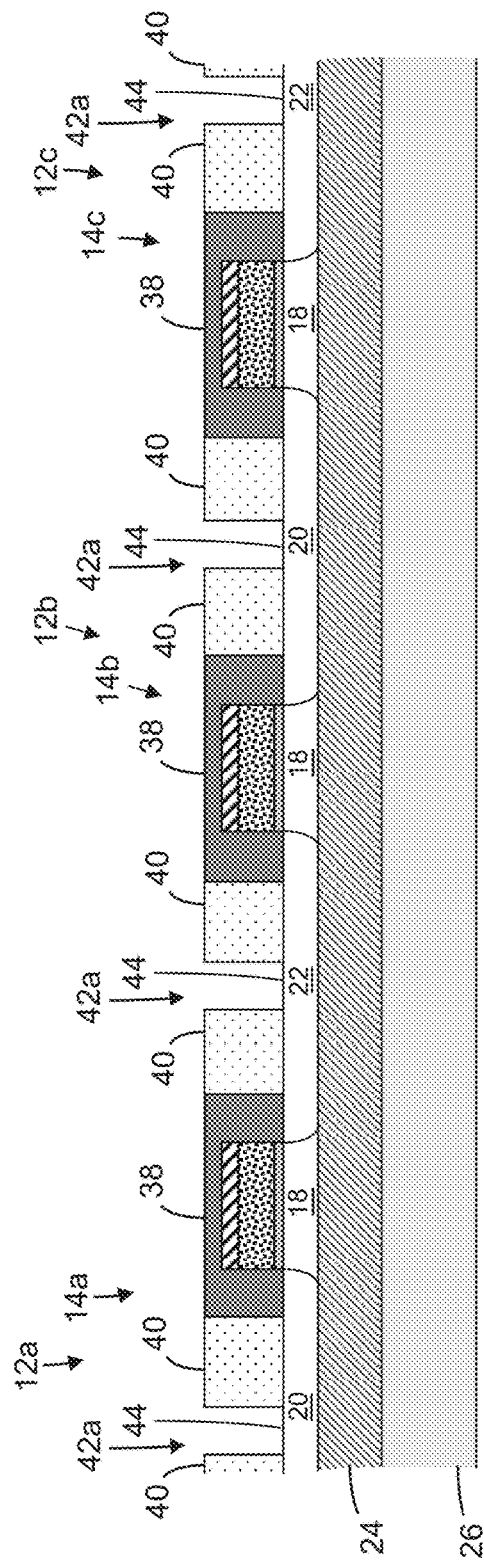
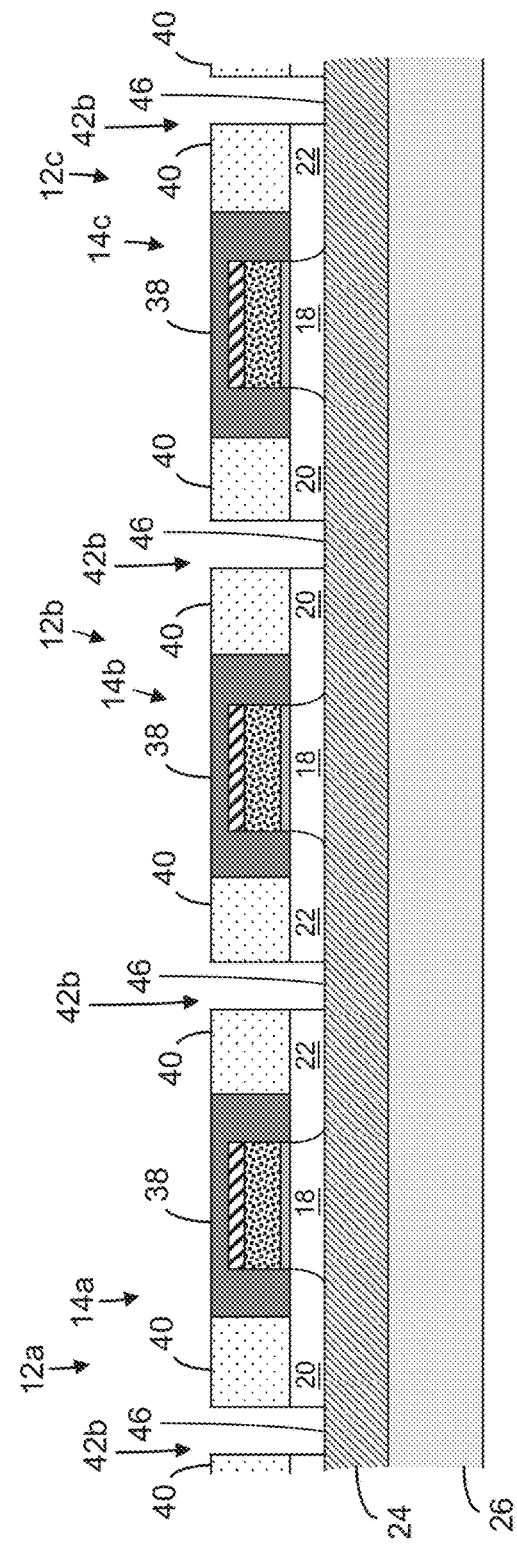

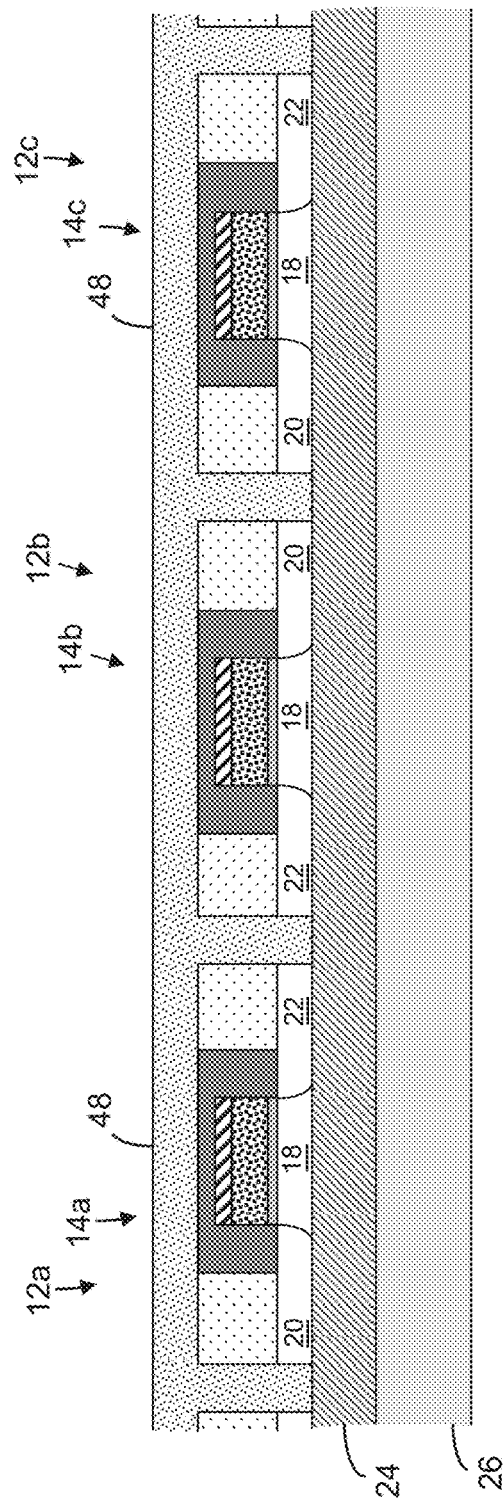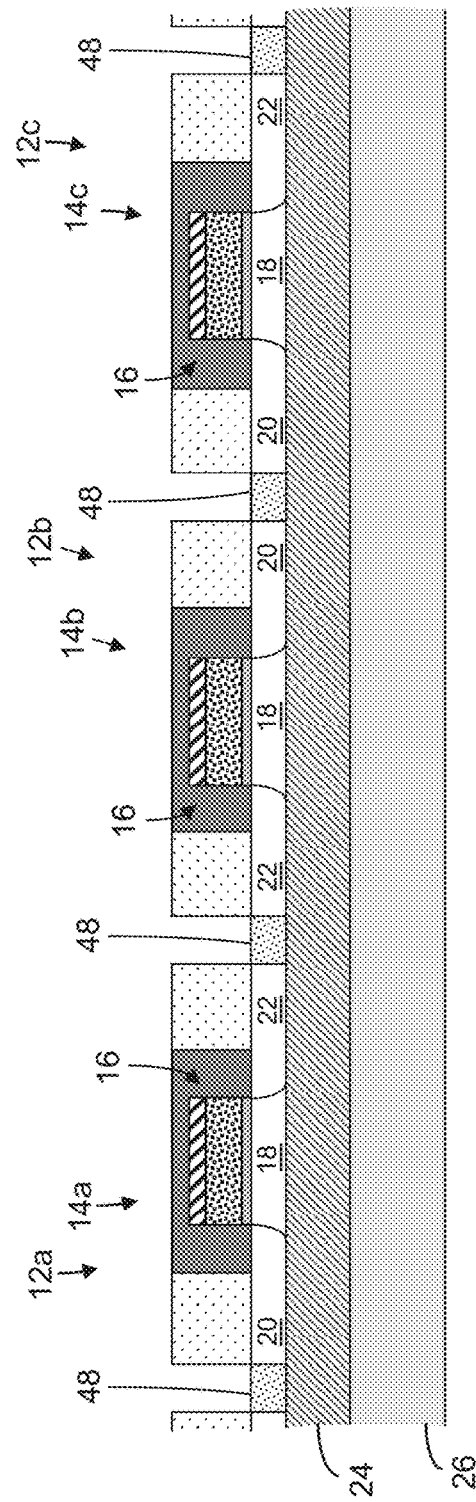

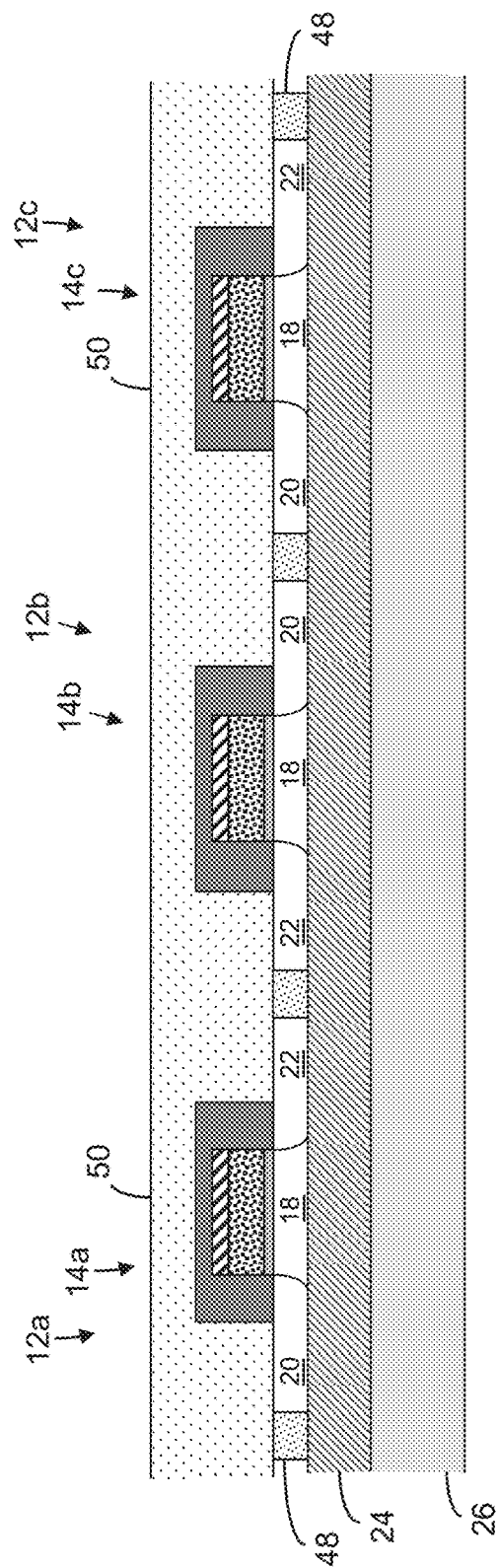
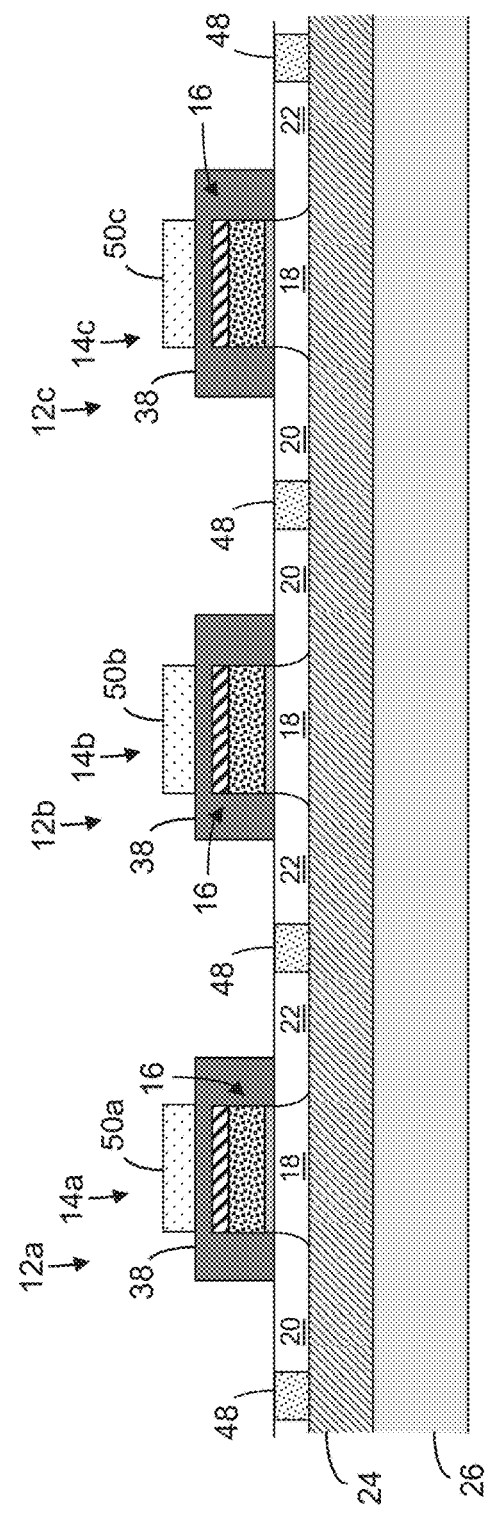
FIGURE 16G
FIGURE 16H

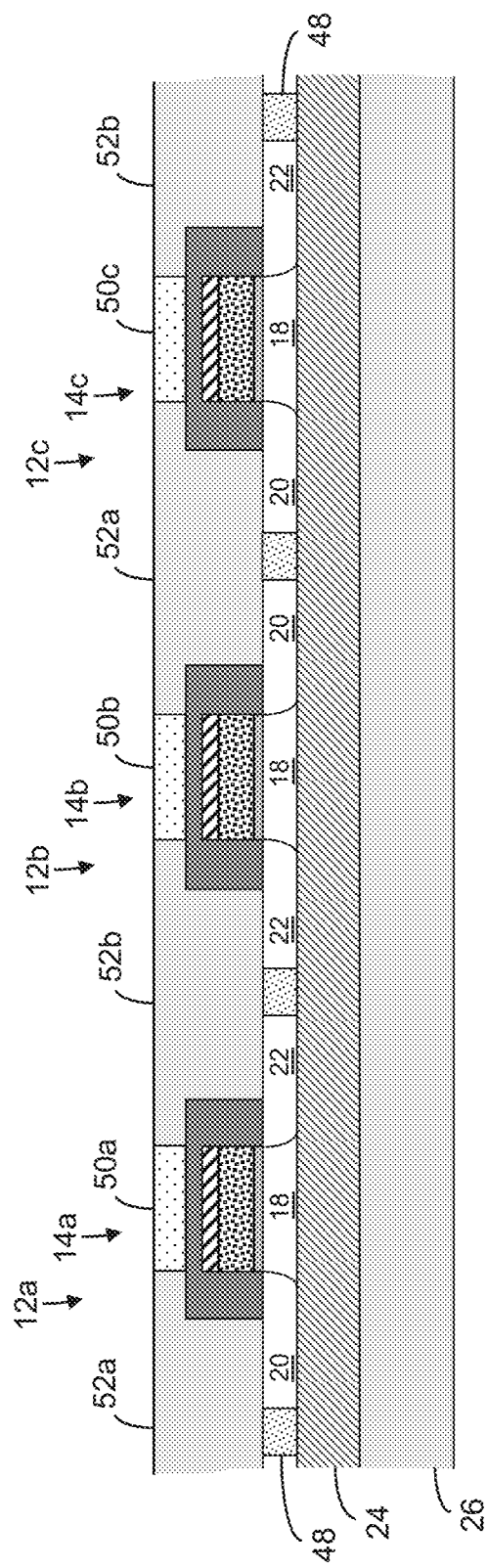
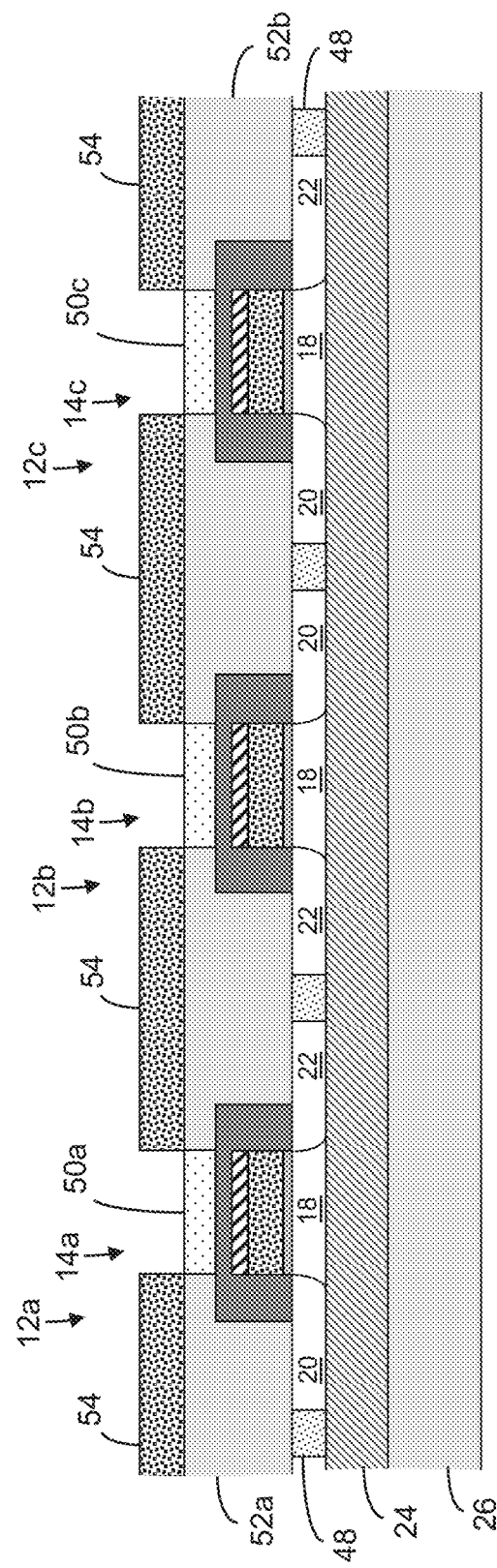
FIGURE 16I
FIGURE 16J

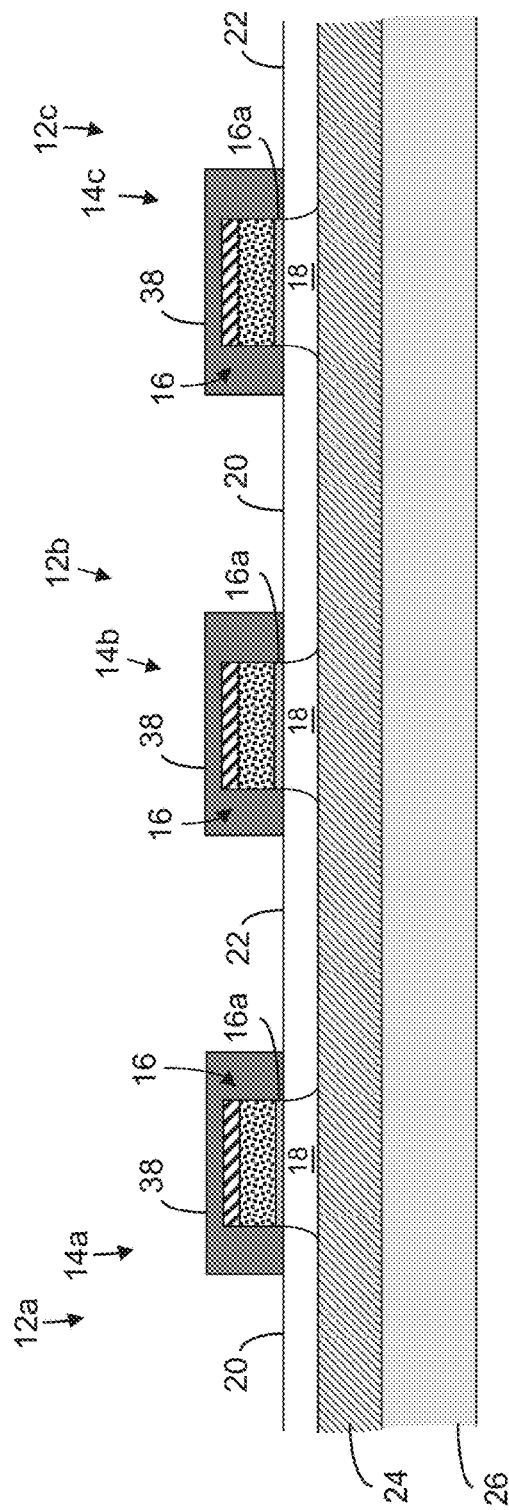
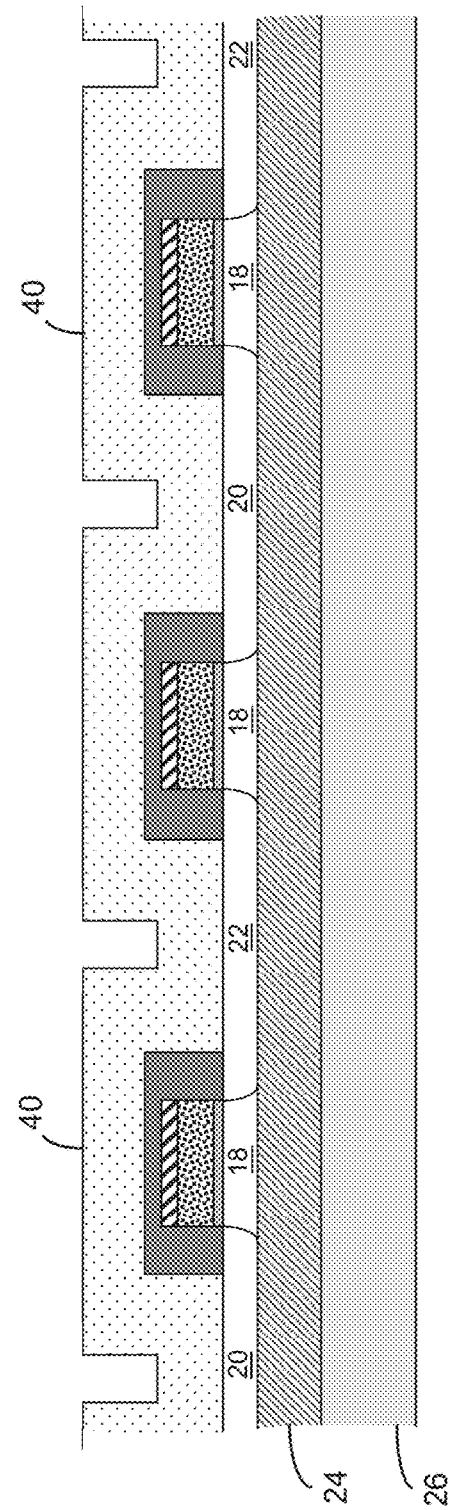
FIGURE 19A
FIGURE 19B

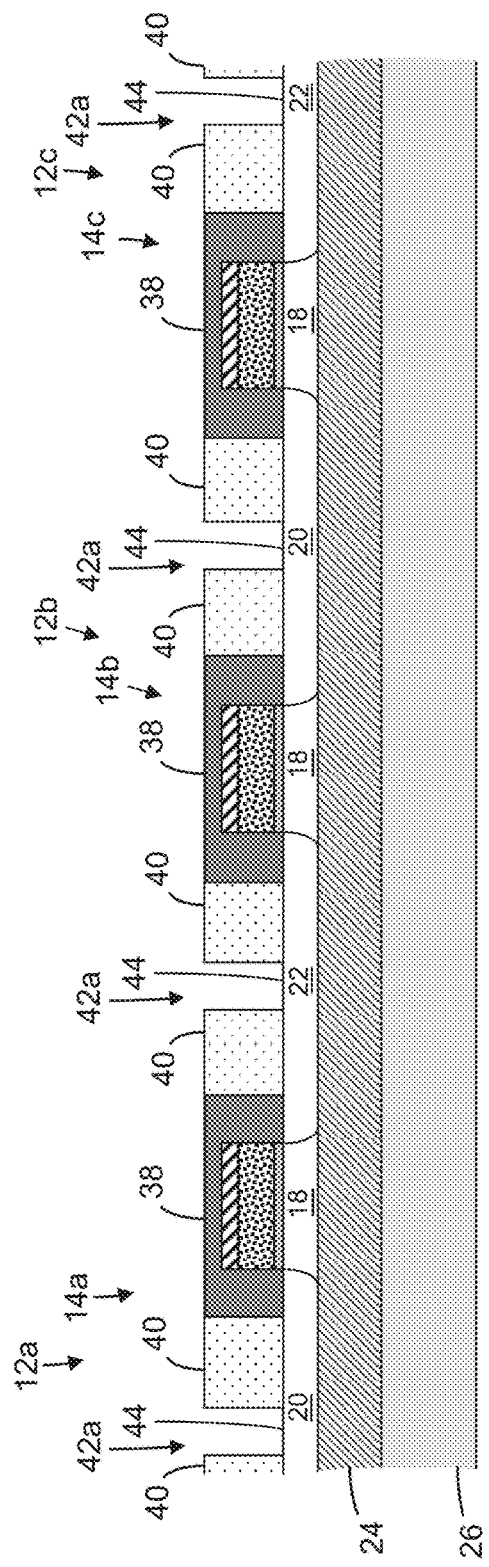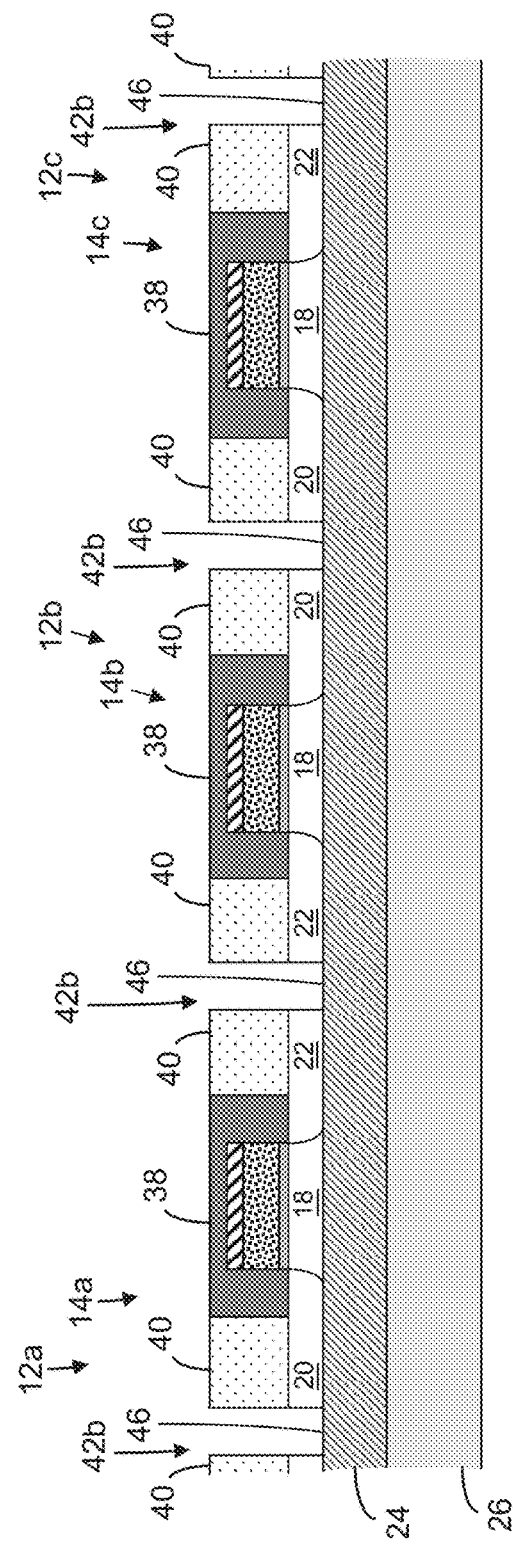

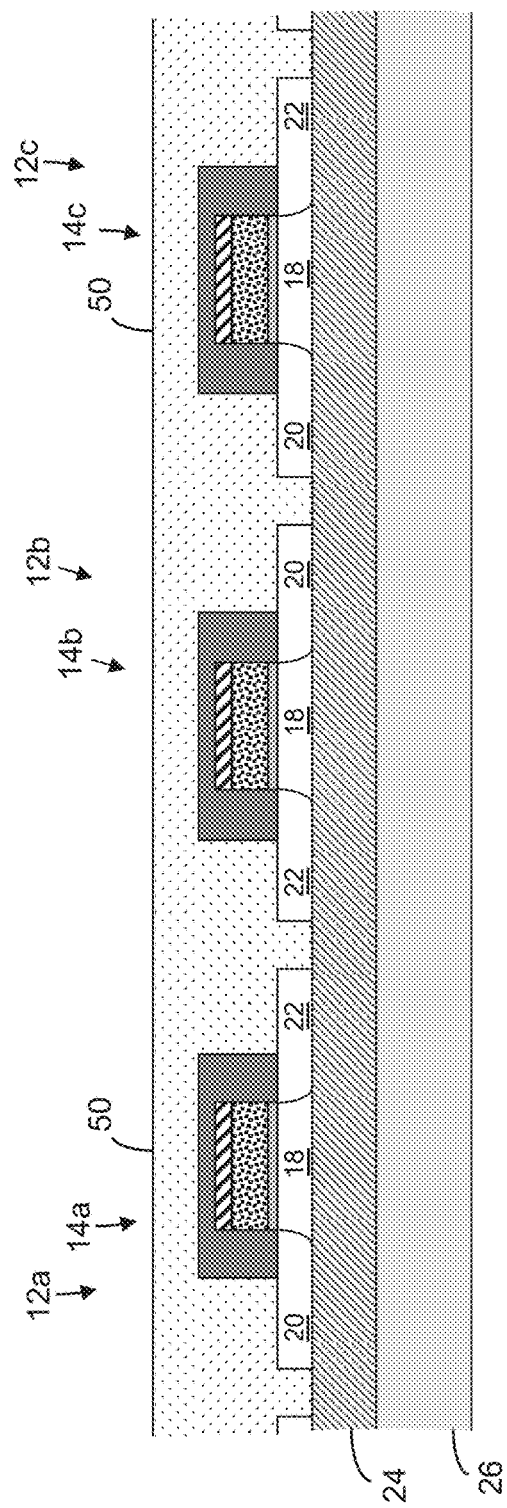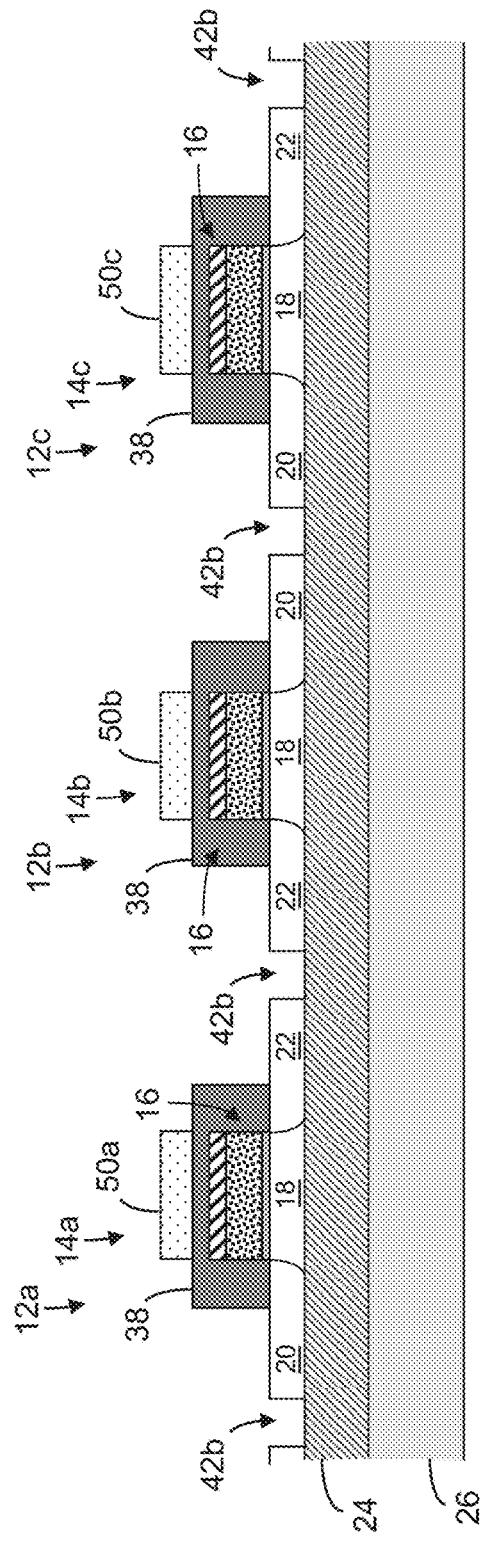
FIGURE 19E
FIGURE 19F

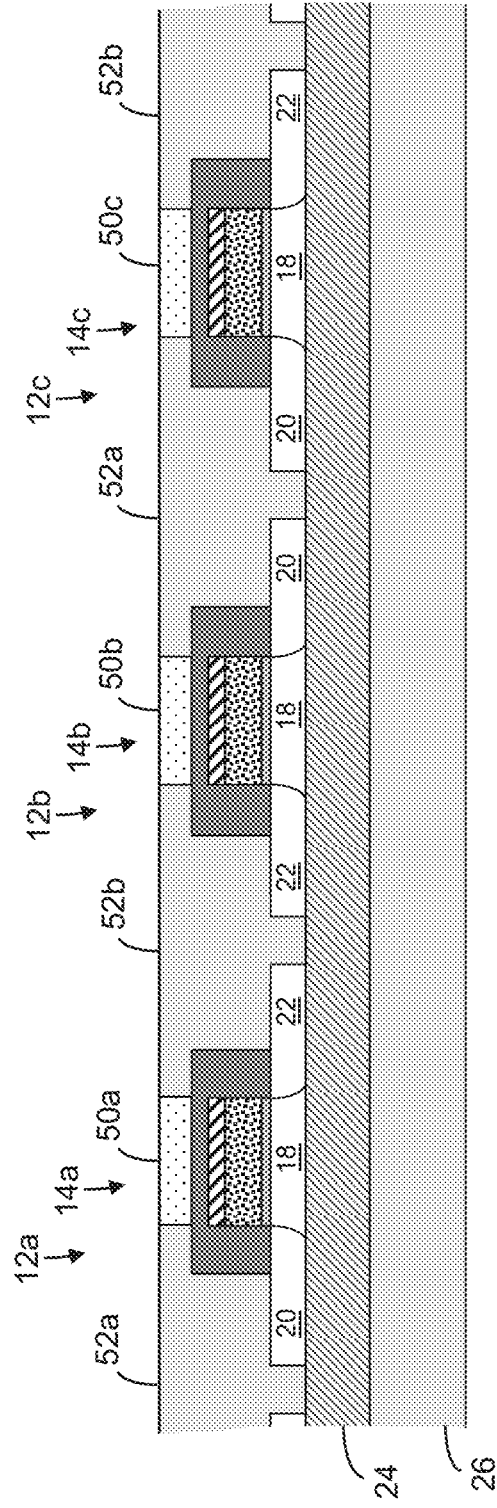
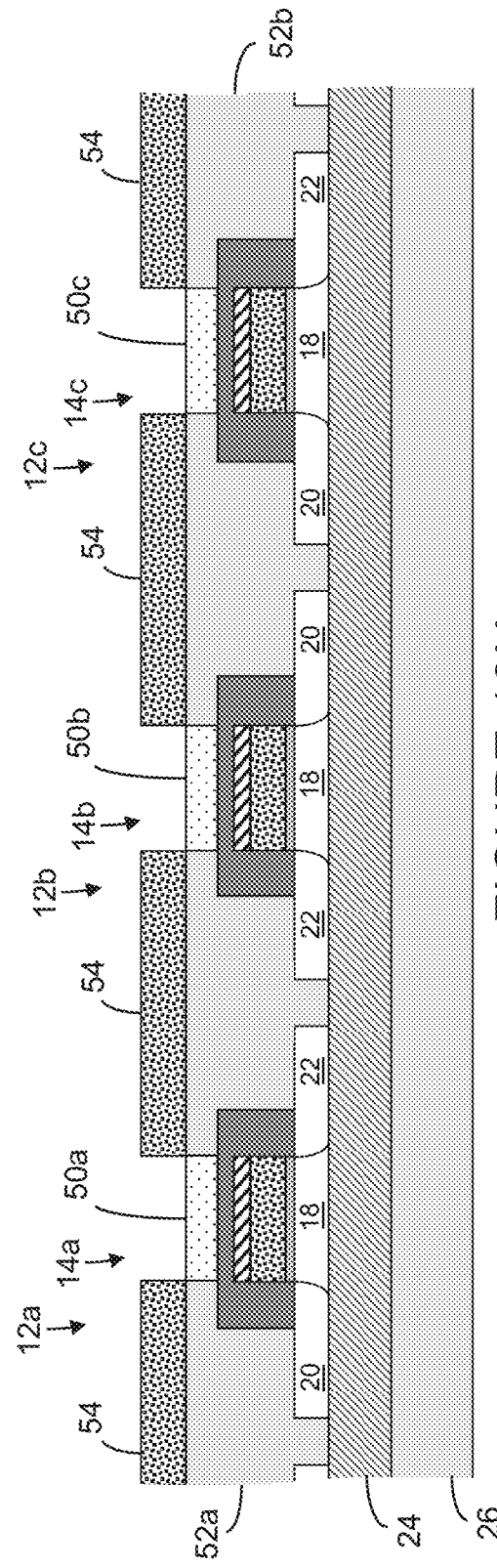

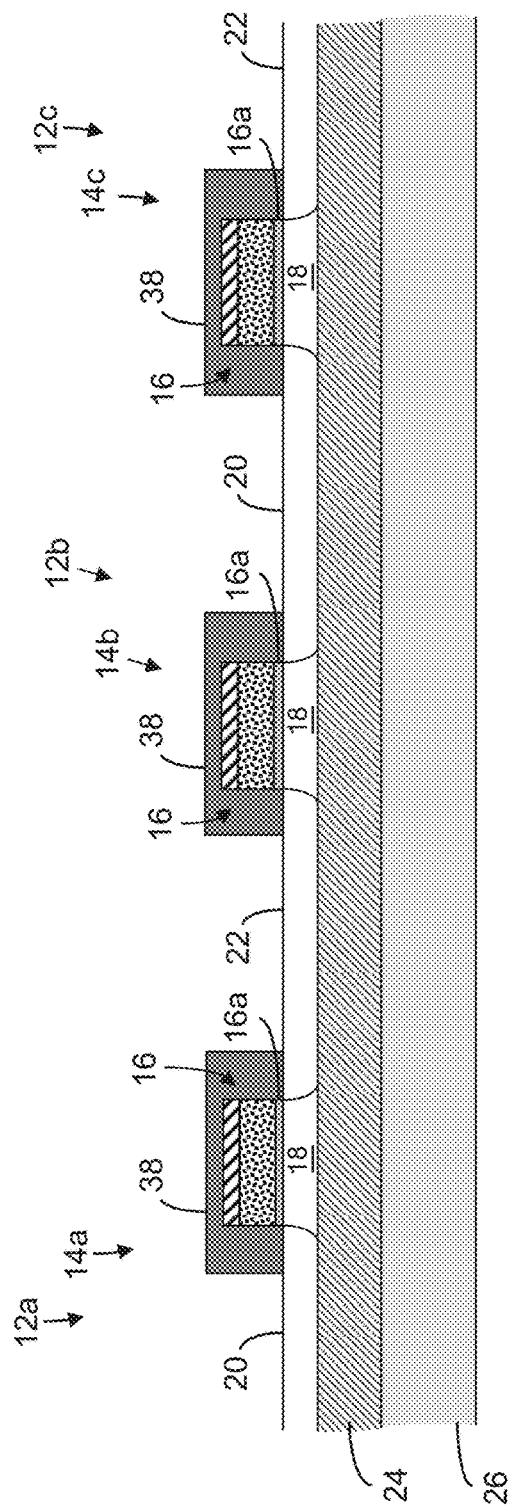
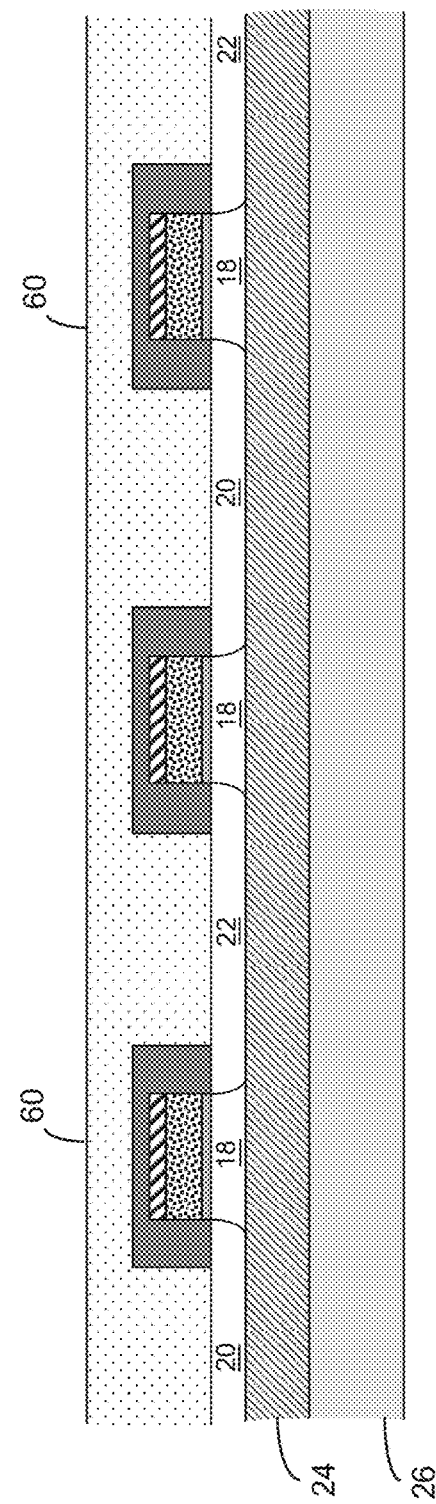
FIGURE 20A
FIGURE 20B

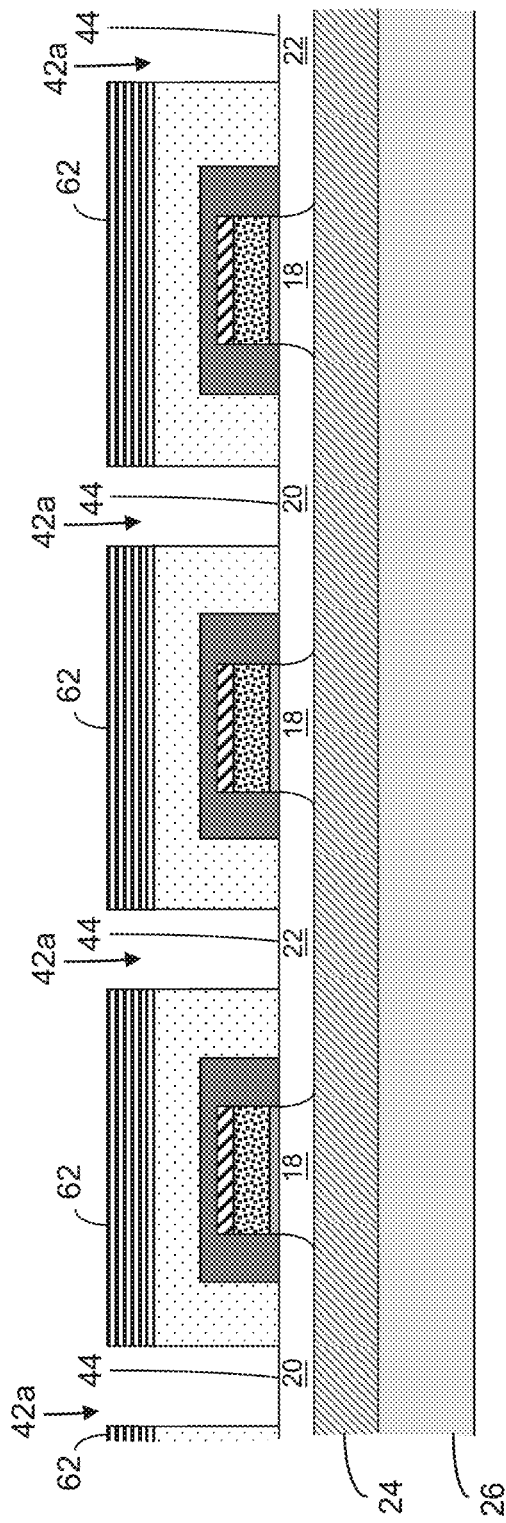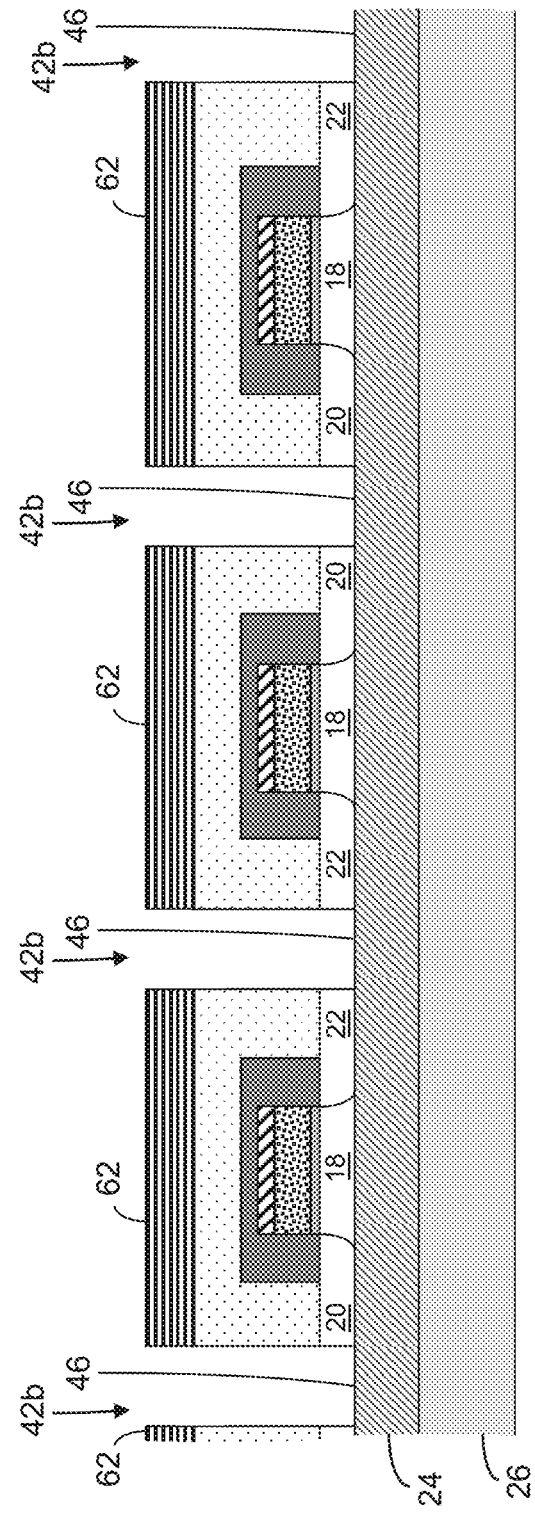

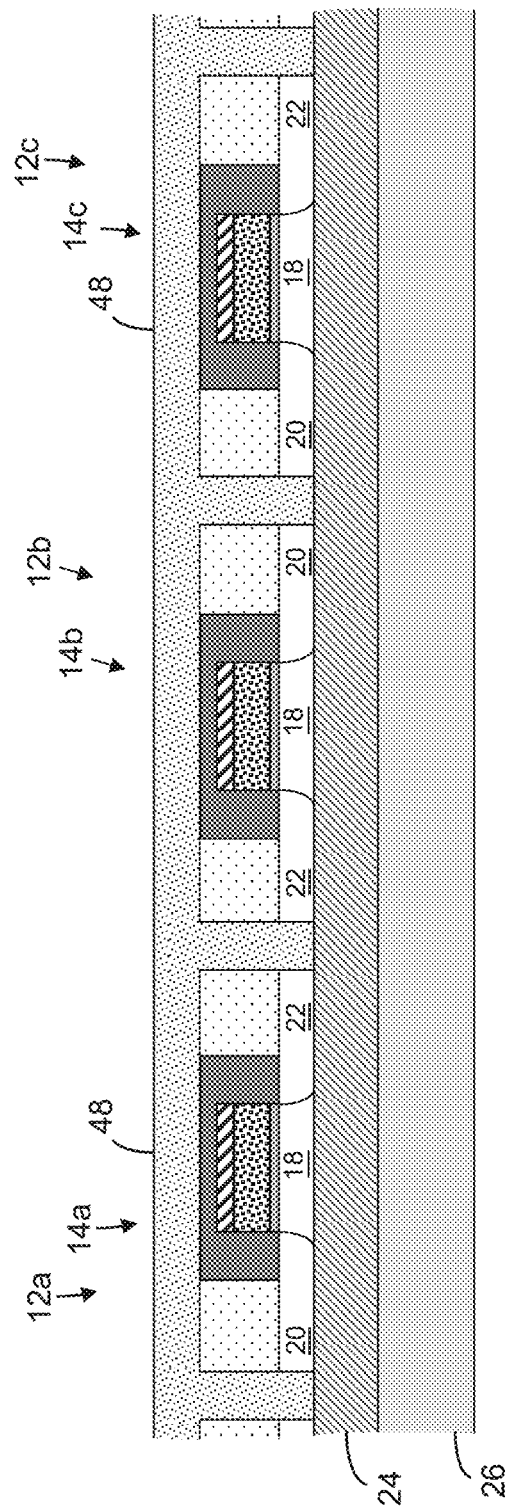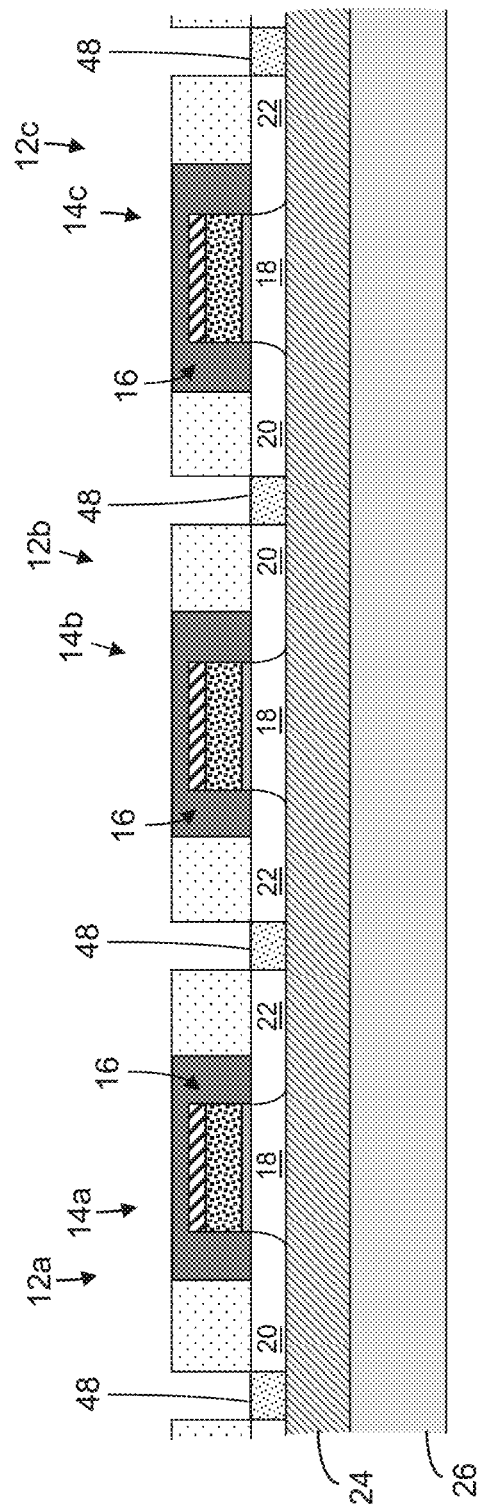

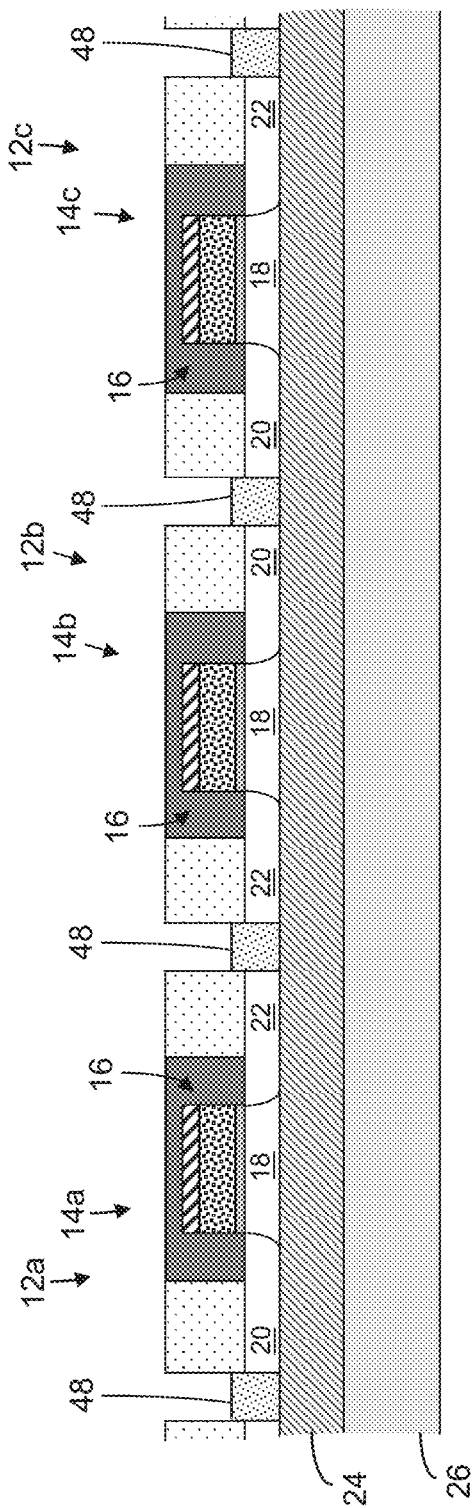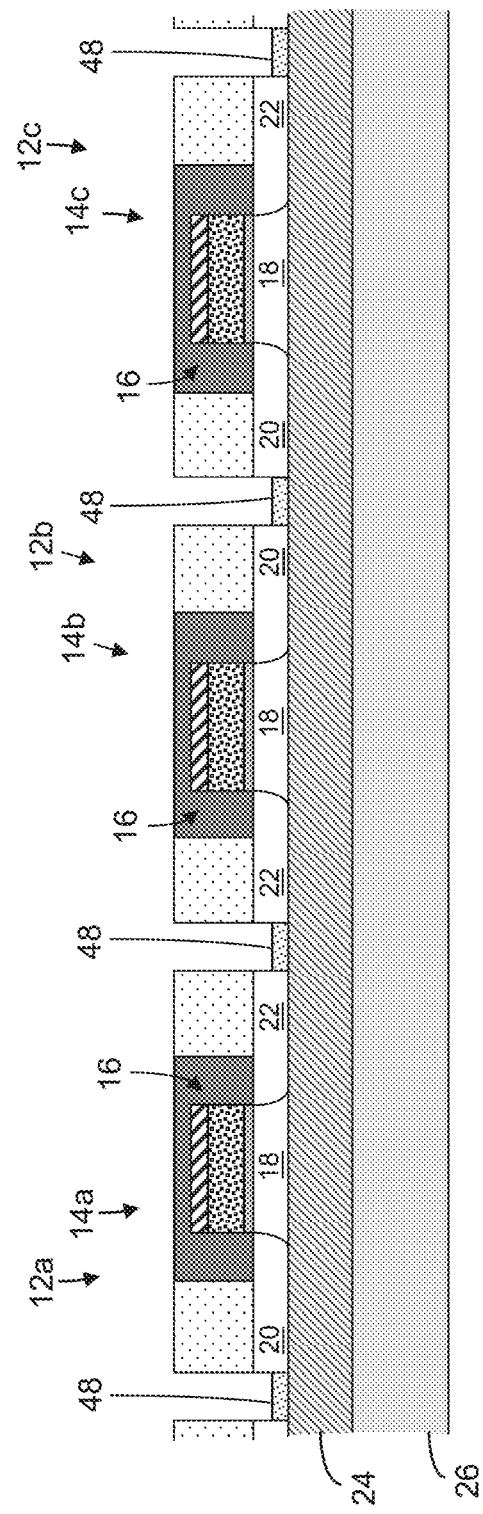

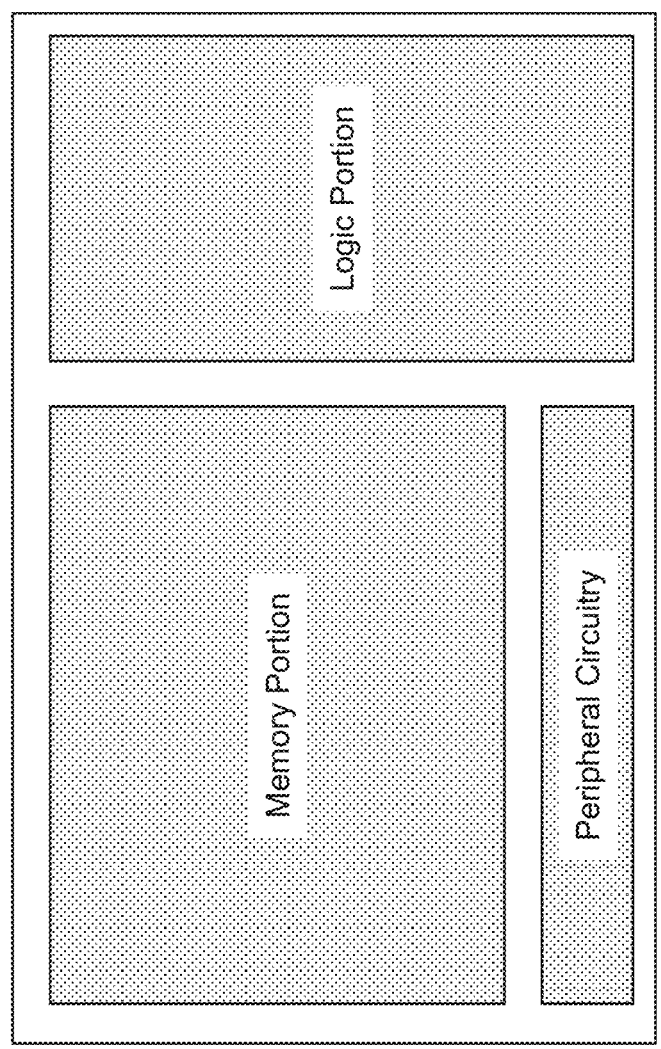

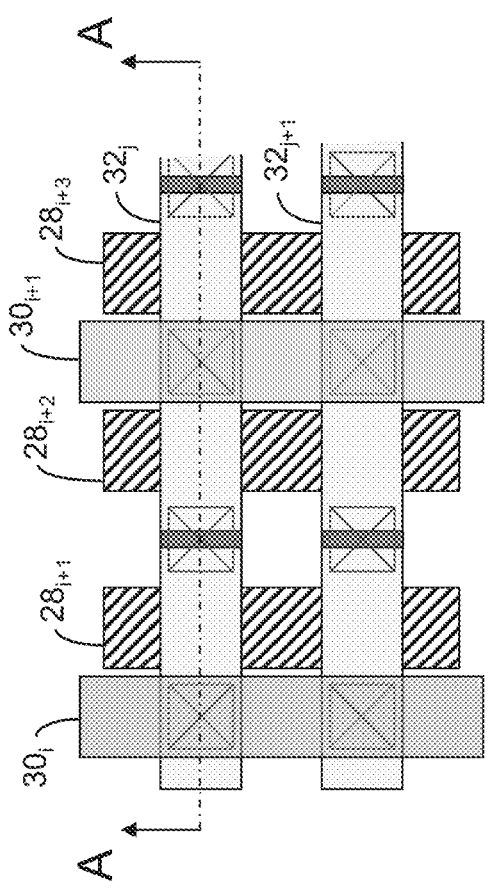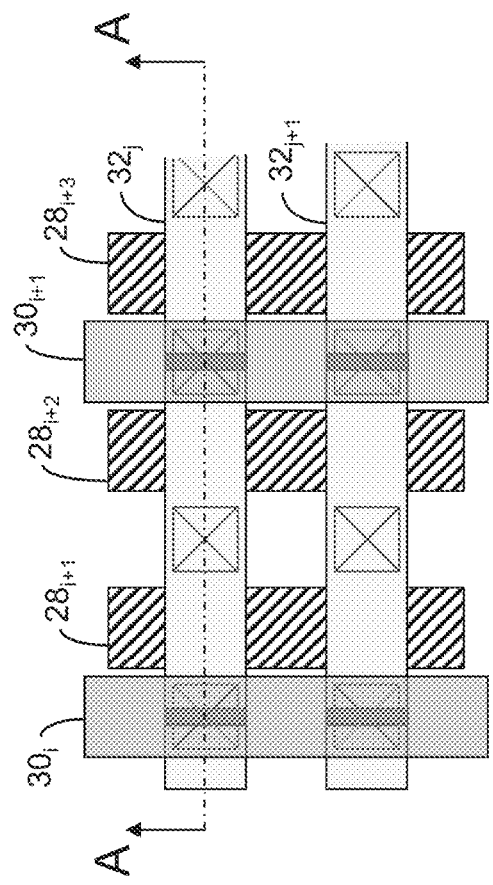

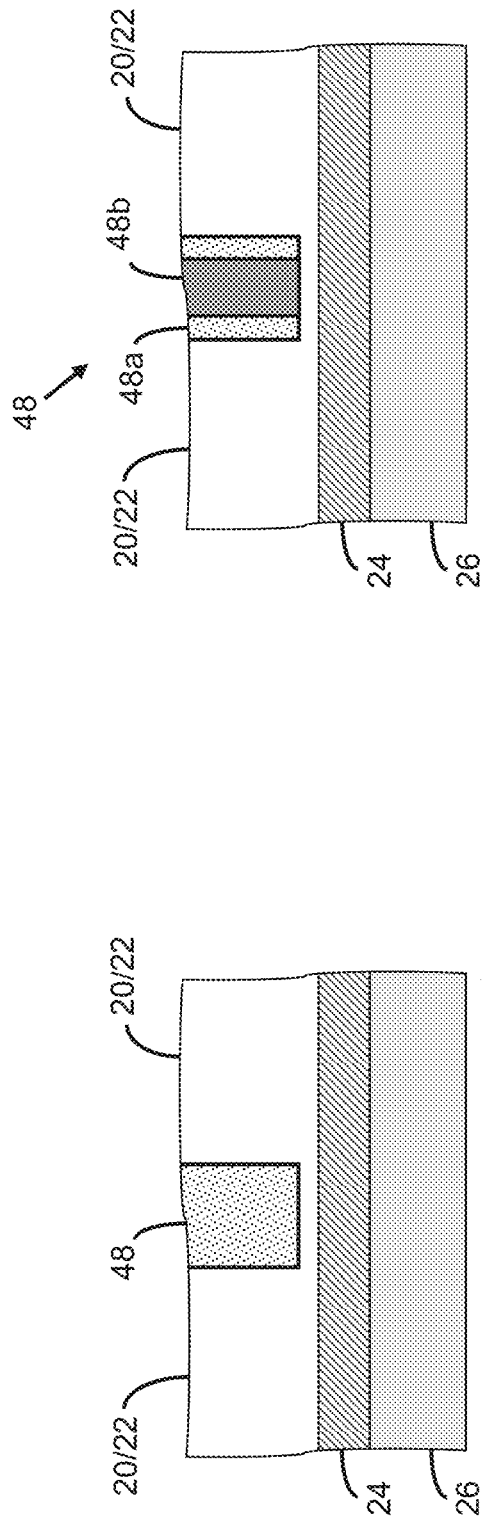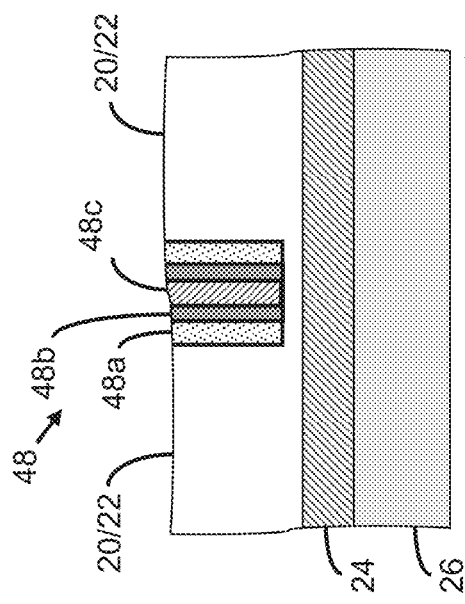
FIGURE 28A
FIGURE 28B
FIGURE 28C

INTEGRATED CIRCUIT HAVING MEMORY CELL ARRAY INCLUDING BARRIERS, AND METHOD OF MANUFACTURING SAME

CROSS-REFERENCE TO RELATED APPLICATIONS

This patent application is a continuation of U.S. patent application Ser. No. 14/028,309, filed on Sep. 16, 2012, now U.S. Pat. No. 10,304,837, which is a divisional of U.S. patent application Ser. No. 12/268,671, filed Nov. 11, 2008, now U.S. Pat. No. 8,536,628, which claims priority to U.S. Provisional Patent Application No. 61/004,672, filed Nov. 29, 2007, each of which is hereby incorporated by reference in its entirety.

BACKGROUND

The present inventions relate to a memory cell, array, architecture and device, and techniques for reading, controlling and/or operating such cell and device; and more particularly, in one aspect, to a semiconductor dynamic random access memory ("DRAM") cell, array, architecture and/or device wherein the memory cell includes a transistor having an electrically floating body in which an electrical charge is stored.

There is a continuing trend to employ and/or fabricate advanced integrated circuits using techniques, materials and devices that improve performance, reduce leakage current and enhance overall scaling. Semiconductor-on-Insulator (SOI) is a material in which such devices may be fabricated or disposed on or in (hereinafter collectively "on"). Such devices are known as SOI devices and include, for example, partially depleted (PD), fully depleted (FD) devices, multiple gate devices (for example, double or triple gate), and Fin-FET.

One type of dynamic random access memory cell is based on, among other things, the electrically floating body effect of SOI transistors. (See, for example, U.S. Pat. No. 6,969,662, incorporated herein by reference). In this regard, the dynamic random access memory cell may consist of a PD or a FD SOI transistor (or transistor formed in bulk material/substrate) having a channel, which is interposed between the body and the gate dielectric. The body region of the transistor is electrically floating in view of the insulation layer (or non-conductive region, for example, in a bulk-type material/substrate) disposed beneath the body region. The state of memory cell is determined by the concentration of charge within the body region of the SOI transistor.

With reference to FIGS. 1A, 1B and 1C, in one embodiment, semiconductor DRAM array 10 includes a plurality of memory cells 12 each consisting of transistor 14 having gate 16, body region 18, which is electrically floating, source region 20 and drain region 22. The body region 18 is disposed between source region 20 and drain region 22. Moreover, body region 18 is disposed on or above region 24, which may be an insulation region (for example, in an SOI material/substrate) or non-conductive region (for example, in a bulk-type material/substrate). The insulation or non-conductive region 24 may be disposed on substrate 26.

Data is written into or read from a selected memory cell by applying suitable control signals to a selected word line(s) 28, a selected source line(s) 30 and/or a selected bit line(s) 32. In response, charge carriers are accumulated in or emitted and/or ejected from electrically floating body region 18 wherein the data states are defined by the amount of carriers within electrically floating body region 18. Notably, the entire contents of the '662 Patent, including, for example, the features, attributes, architectures, configurations, materials, techniques and advantages described and illustrated therein, are incorporated by reference herein.

As mentioned above, memory cell 12 of DRAM array 10 operates by accumulating in or emitting/ejecting majority carriers (electrons or holes) 34 from body region 18 of, for example, N-channel transistors. (See, FIGS. 2A and 2B). In this regard, accumulating majority carriers (in this example, "holes") 34 in body region 18 of memory cells 12 via, for example, impact ionization near source region 20 and/or drain region 22, is representative of a logic high or "1" data state. (See, FIG. 2A). Emitting or ejecting majority carriers 34 from body region 18 via, for example, forward biasing the source/body junction and/or the drain/body junction, is representative of a logic low or "0" data state. (See, FIG. 2B).

Notably, for at least the purposes of this discussion, a logic high or State "1" corresponds to an increased concentration of majority carriers in the body region relative to an unprogrammed device and/or a device that is programmed with a logic low or State "0". In contrast, a logic low or State "0" corresponds to a reduced concentration of majority carriers in the body region relative to an unprogrammed device and/or a device that is programmed with logic high or State "1".

Conventional reading is performed by applying a small drain bias and a gate bias above the transistor threshold voltage. The sensed drain current is determined by the charge stored in the floating body giving a possibility to distinguish between the states "1" and "0". A floating body memory device has two different current states corresponding to the two different logical states: "1" and "0".

In one conventional technique, the memory cell is read by applying a small bias to the drain of the transistor as well as a gate bias which is above the threshold voltage of the transistor. In this regard, in the context of memory cells employing N-type transistors, a positive voltage is applied to one or more word lines 28 to enable the reading of the memory cells associated with such word lines. The amount of drain current is determined/affected by the charge stored in the electrically floating body region of the transistor. As such, conventional reading techniques sense the amount of the channel current provided/generated in response to the application of a predetermined voltage on the gate of the transistor of the memory cell to determine the state of the memory cell; a floating body memory cell may have two or more different current states corresponding to two or more different logical states (for example, two different current conditions/states corresponding to the two different logical states: "1" and "0").

In short, conventional writing programming techniques for memory cells having an N-channel type transistor often provide an excess of majority carriers by channel impact ionization (see, FIG. 3A) or by band-to-band tunneling (gate-induced drain leakage "GIDL") (see, FIG. 3B). The majority carriers may be removed via drain side hole removal (see, FIG. 4A), source side hole removal (see, FIG. 4B), or drain and source hole removal, for example, using the back gate pulsing (see, FIG. 4C).

Further, FIG. 5 illustrates the conventional reading technique. In one embodiment, the state of the memory cell may be determined by sensing the amount of the channel current provided/generated in response to the application of a predetermined voltage on the gate of the transistor of the memory cell.

The memory cell 12 having electrically floating body transistor 14 may be programmed/read using other techniques including techniques that may, for example, provide lower power consumption relative to conventional techniques. For example, memory cell 12 may be programmed, read and/or controlled using the techniques and circuitry described and illustrated in Okhonin et al., U.S. Patent Application Publication No. 2007/0058427 ("Memory Cell and Memory Cell Array Having an Electrically Floating Body Transistor, and Methods of Operating Same", U.S. Non-Provisional patent application Ser. No. 11/509,188, filed on Aug. 24, 2006 (hereinafter "the '188 Application")), which is incorporated by reference herein. In one aspect, the '188 Application is directed to programming, reading and/or control methods which allow low power memory programming and provide larger memory programming window (both relative to at least the conventional programming techniques).

With reference to FIG. 6, in one embodiment, the '188 Application employs memory cell 12 having electrically floating body transistor 14. The electrically floating body transistor 14, in addition to the MOS transistor, includes an intrinsic bipolar transistor (including, under certain circumstances, a significant intrinsic bipolar current). In this illustrative exemplary embodiment, electrically floating body transistor 14 is an N-channel device. As such, majority carriers are "holes".

With reference to FIG. 7, in one embodiment, the '188 Application employs, writes or programs a logic "1" or logic high using control signals (having predetermined voltages, for example, Vg=0V, Vs=3V, and Vd=0V) which are applied to gate 16, source region 20 and drain region 22 (respectively) of transistor 14 of memory cell 12. Such control signals induce or cause impact ionization and/or the avalanche multiplication phenomenon. (See, FIG. 7). The predetermined voltages of the control signals, in contrast to the conventional method program or write logic "1" in the transistor of the memory cell via impact ionization and/or avalanche multiplication in the electrically floating body. In one embodiment, it is preferred that the bipolar transistor current responsible for impact ionization and/or avalanche multiplication in the floating body is initiated and/or induced by a control pulse which is applied to gate 16. Such a pulse may induce the channel impact ionization which increases the floating body potential and turns on the bipolar current. An advantage of the described method is that larger amount of the excess majority carriers is generated compared to other techniques.

Further, with reference to FIG. 8, when writing or programming logic "0" in transistor 14 of memory cell 12, in one embodiment of the '188 Application, the control signals (having predetermined voltages (for example, Vg=0.5V, Vs=3V and Vd=0.5V) are different and, in at least one embodiment, higher than a holding voltage (if applicable)) are applied to gate 16, source region 20 and drain region 22 (respectively) of transistor 14 of memory cell 12. Such control signals induce or provide removal of majority carriers from the electrically floating body of transistor 14. In one embodiment, the majority carriers are removed, eliminated or ejected from body region 18 through source region 20 and drain region 22. (See, FIG. 8). In this embodiment, writing or programming memory cell 12 with logic "0" may again consume lower power relative to conventional techniques.

When memory cell 12 is implemented in a memory cell array configuration, it may be advantageous to implement a "holding" operation for certain memory cells 12 when programming one or more other memory cells 12 of the memory cell array to enhance the data retention characteristics of such certain memory cells 12. The transistor 14 of memory cell 12 may be placed in a "holding" state via application of control signals (having predetermined voltages) that are applied to gate 16 and source region 20 and drain region 22 of transistor 14 of memory cell 12. In combination, such control signals provide, cause and/or induce majority carrier accumulation in an area that is close to the interface between gate dielectric 16a and electrically floating body region 18. (See, FIG. 9). In this embodiment, it may be preferable to apply a negative voltage to gate 16 where transistor 14 is an N-channel type transistor.

With reference to FIG. 10, in one embodiment of the '188 Application, the data state of memory cell 12 may be read and/or determined by applying control signals (having predetermined voltages, for example, Vg=−0.5V, Vs=3V and Vd=0V) to gate 16 and source region 20 and drain region 22 of transistor 14. Such signals, in combination, induce and/or cause the bipolar transistor current in those memory cells 12 storing a logic state "1". For those memory cells that are programmed to a logic state "0", such control signals do not induce and/or cause a considerable, substantial or sufficiently measurable bipolar transistor current in the cells programmed to "0" state. (See, the '188 Application, which, as noted above, is incorporated by reference).

The reading may be performed using negative or positive voltages applied to word lines 28. As such, transistors 14 of device 10 are periodically pulsed between a positive gate bias, which (1) drives majority carriers (holes for N-channel transistors) away from the interface between gate insulator 32 and body region 18 of transistor 14 and (2) causes minority carriers (electrons for N-channel transistors) to flow from source region 20 and drain region 22 into a channel formed below gate 16, and the negative gate bias, which causes majority carriers (holes for N-channel device) to accumulate in or near the interface between gate 16 and body region 18 of transistor 14.

Notably, the illustrated/exemplary voltage levels to implement the write and read operations, with respect to the '188 Application are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.25, 0.5, 1.0 and 2.0 volts) whether one or more of the voltages (for example, the source, drain or gate voltages) become or are positive and negative.

SUMMARY

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In a first principle aspect, certain of the present inventions are directed to a method of manufacture of an integrated circuit device having a memory cell array including a plurality of memory cells, arranged in a matrix of rows and columns, wherein each memory cell includes at least one transistor having a gate, gate dielectric and first, second and body regions. The method of this aspect comprises forming the first and second regions of the transistors in a semiconductor, wherein the first regions of the transistors of adjacent memory cells are common regions. The method further includes etching a trench in each of the common first regions to remove a portion of the common first regions and depositing a barrier in each trench in each common first region, wherein each barrier includes one or more electrical characteristics that are different from one or more corresponding electrical characteristics of the common first regions. The method may further include depositing an electrical contact on each of the common first region and associated barrier which is disposed therein and/or therebetween.

The barriers may include one or more materials that are different from the material of the common first regions. For example, the barriers include one or more insulator, semiconductor and/or metal materials. In addition thereto, or in lieu thereof, the barriers may include one or more materials having one or more crystalline structures that are different from the crystalline structure of the material of the common first regions.

In one embodiment, the second regions of the transistors of adjacent memory cells are common regions, wherein the method may further include etching a trench in each of the common second regions to remove a portion of the common second regions, and depositing a barrier in each trench in each common second region, wherein the barriers include one or more electrical characteristics that are different from one or more corresponding electrical characteristics of the second regions. The barriers in each trench in the common second regions may include one or more materials that are different from the material of the common second regions. For example, these barriers include one or more insulator, semiconductor and/or metal materials. In addition thereto, or in lieu thereof, the barriers in each trench in the common second regions may include one or more materials having one or more crystalline structures that are different from the crystalline structure of the material of the common second regions. Indeed, the method may further include depositing an electrical contact on each of the common second region and associated barrier which is disposed therein and/or therebetween.

In a second principle aspect, certain of the present inventions are directed to a method of manufacture of an integrated circuit device having a memory cell array including a plurality of memory cells, arranged in a matrix of rows and columns, wherein each memory cell includes at least one transistor having a gate, gate dielectric and first, second and body regions. The method of this aspect comprises forming the first and second regions of the transistors in a semiconductor layer that is disposed on or above an insulating layer or region, wherein the first regions of the transistors of adjacent memory cells are common first regions. The method further includes etching a trench in each of the common first regions to remove a portion of the common first regions and depositing a barrier in each trench in each common first region, wherein each barrier provides a discontinuity in the associated common first region. The method may also include depositing an electrical contact on each of the common first region and associated barrier which is disposed therein and/or therebetween.

In one embodiment, etching a trench in each of the common first regions includes anisotropically etching each trench to remove a portion of the common first regions. In another embodiment, etching a trench in each of the common first regions includes anisotropically etching each trench to remove a portion of the common first regions to expose a portion of the insulating layer or region, and depositing the barrier in each trench in each common first region includes depositing the barrier in each trench and on the exposed portion or the insulating layer or region.

As before, the barriers may include one or more materials that are different from the material of the common first regions. For example, the barriers include one or more insulator, semiconductor and/or metal materials. In addition thereto, or in lieu thereof, the barriers may include one or more materials having one or more crystalline structures that are different from the crystalline structure of the material of the common first regions.

In another principal aspect, the present inventions are directed to an integrated circuit device comprising a memory cell array including a plurality of memory cells arranged in a matrix of rows and columns, wherein each memory cell includes at least one transistor having a gate, gate dielectric and first, second and body regions, wherein: (i) the body region of each transistor is electrically floating and (ii) the transistors of adjacent memory cells include a layout that provides a common first region. The integrated circuit device further includes a first plurality of barriers, wherein each common first region of transistors of adjacent memory cells includes a barrier disposed therein and/or therebetween, and wherein each barrier includes one or more electrical characteristics that are different from one or more corresponding electrical characteristics of the common first regions. The integrated circuit device may also include a plurality of electrical contacts, wherein an electrical contact is disposed on an associated common first region and barrier which is disposed therein and/or therebetween.

Again, the barriers may include one or more materials that are different from the material of the common first regions. For example, the barriers include one or more insulator, semiconductor and/or metal materials. In addition thereto, or in lieu thereof, the barriers may include one or more materials having one or more crystalline structures that are different from the crystalline structure of the material of the common first regions.

In certain embodiments, transistors of adjacent memory cells may also include a layout that provides a common second region. In this circumstance, the integrated circuit device may include a second plurality of barriers, wherein each common second region of transistors of adjacent memory cells includes at least one barrier of the second plurality of barriers disposed therein and/or therebetween. Notably, the barriers of the second plurality may include one or more materials that are different from the material of the common second regions (for example, the barriers include one or more insulator, semiconductor and/or metal materials). In addition thereto, or in lieu thereof, the barriers of the second plurality may include one or more materials having one or more crystalline structures that are different from the crystalline structure of the material of the common second regions.

The integrated circuit device may include electrically floating body transistors (wherein the body region of the transistor of each memory cell of the memory cell array is electrically floating), and wherein each memory cell is programmable to store one of a plurality of data states, each data state is representative of a charge in the body region of the associated transistor.

Again, there are many inventions, and aspects of the inventions, described and illustrated herein. This Summary is not exhaustive of the scope of the present inventions. Indeed, this Summary may not be reflective of or correlate to the inventions protected by the claims in this or in continuation/divisional applications hereof.

Moreover, this Summary is not intended to be limiting of the inventions or the claims (whether the currently presented claims or claims of a divisional/continuation application) and should not be interpreted in that manner. While certain embodiments have been described and/or outlined in this Summary, it should be understood that the present inventions are not limited to such embodiments, description and/or outline, nor are the claims limited in such a manner (which should also not be interpreted as being limited by this Summary).

Indeed, many other aspects, inventions and embodiments, which may be different from and/or similar to, the aspects, inventions and embodiments presented in this Summary, will be apparent from the description, illustrations and claims, which follow. In addition, although various features, attributes and advantages have been described in this Summary and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed and/or illustrated separately herein.

FIG. 1B is a three dimensional view of an exemplary prior art memory cell comprised of one electrically floating body transistor (PD-SOI NMOS);

FIG. 1C is a cross-sectional view of the prior art memory cell of FIG. 1B, cross-sectioned along line C-C';

FIGS. 3A and 3B are exemplary schematic and general illustrations of conventional methods to program a memory cell to logic state "1" (i.e., generate or provide an excess of majority carrier in the electrically floating body of the transistor (an N-type channel transistor in this exemplary embodiment) of the memory cell of FIG. 1B; majority carriers in these exemplary embodiments are generated or provided by the channel electron impact ionization (FIG. 3A) and by GIDL or band to band tunneling (FIG. 3B));

FIGS. 4A-4C are exemplary schematics and general illustrations of conventional methods to program a memory cell to logic state "0" (i.e., provide relatively fewer majority carriers by removing majority carriers from the electrically floating body of the transistor of the memory cell of FIG. 1B; majority carriers may be removed through the drain region/terminal of the transistor (FIG. 4A), the source region/terminal of the transistor (FIG. 4B), and through both drain and source regions/terminals of the transistor by using, for example, the back gate pulses applied to the substrate/backside terminal of the transistor of the memory cell (FIG. 4C));

FIGS. 16A-16M illustrate cross-sectional views (sectioned along dotted line A-A of FIG. 12) of the fabrication of the memory cell array of FIGS. 11, 12 and 15 at various stages of an exemplary process that provides barriers between the drain and source regions of adjacent memory cells, according to certain aspects of the present inventions, wherein the barriers are substantially planar with respect to the associated source and/or drain regions;

FIGS. 19A-19K illustrate cross-sectional views (sectioned along dotted line A-A of FIG. 12) of the fabrication of the memory cell array of FIGS. 11, 12 and 18 at various stages of an exemplary manufacturing process according to at least one aspect of the present inventions;

FIGS. 20A-20L illustrate cross-sectional views (sectioned along dotted line A-A of FIG. 12) of the fabrication of the memory cell array of FIGS. 11 and 12 at various stages of different exemplary manufacturing processes using a mask to, among other things, form certain trenches, according certain aspects of the present inventions;

FIGS. 21A-21C are schematic block diagram illustrations of an exemplary devices in which the layouts, architectures and/or processes described and/or illustrated herein may be implemented wherein FIGS. 21A and 21C are logic devices (having logic circuitry and resident memory) and FIG. 21B is a memory device (having primarily of a memory array), according to certain aspects of the present inventions;

FIG. 22A is an exemplary plan view layout (not drawn to scale) of a portion of the memory cell array of FIG. 11 illustrating the common source and common drain memory cell and/or memory cell array architecture wherein the barrier and/or one or more materials are disposed in or between the common drain regions in accordance with an exemplary embodiment of certain aspects of the present inventions;

FIG. 22B is an exemplary plan view layout (not drawn to scale) of a portion of the memory cell array of FIG. 11 illustrating the common source and common drain memory cell and/or memory cell array architecture wherein the barrier and/or one or more materials are disposed in or between the common source regions in accordance with an exemplary embodiment of certain aspects of the present inventions;

FIGS. 28A-28C illustrate exemplary embodiments of a portion of a barrier in conjunction with source or drain regions, the substrate, and the insulation region or non-conductive region, wherein the barrier does not extend to the exposed portions of insulation region or non-conductive region 24.

Figure 1A:
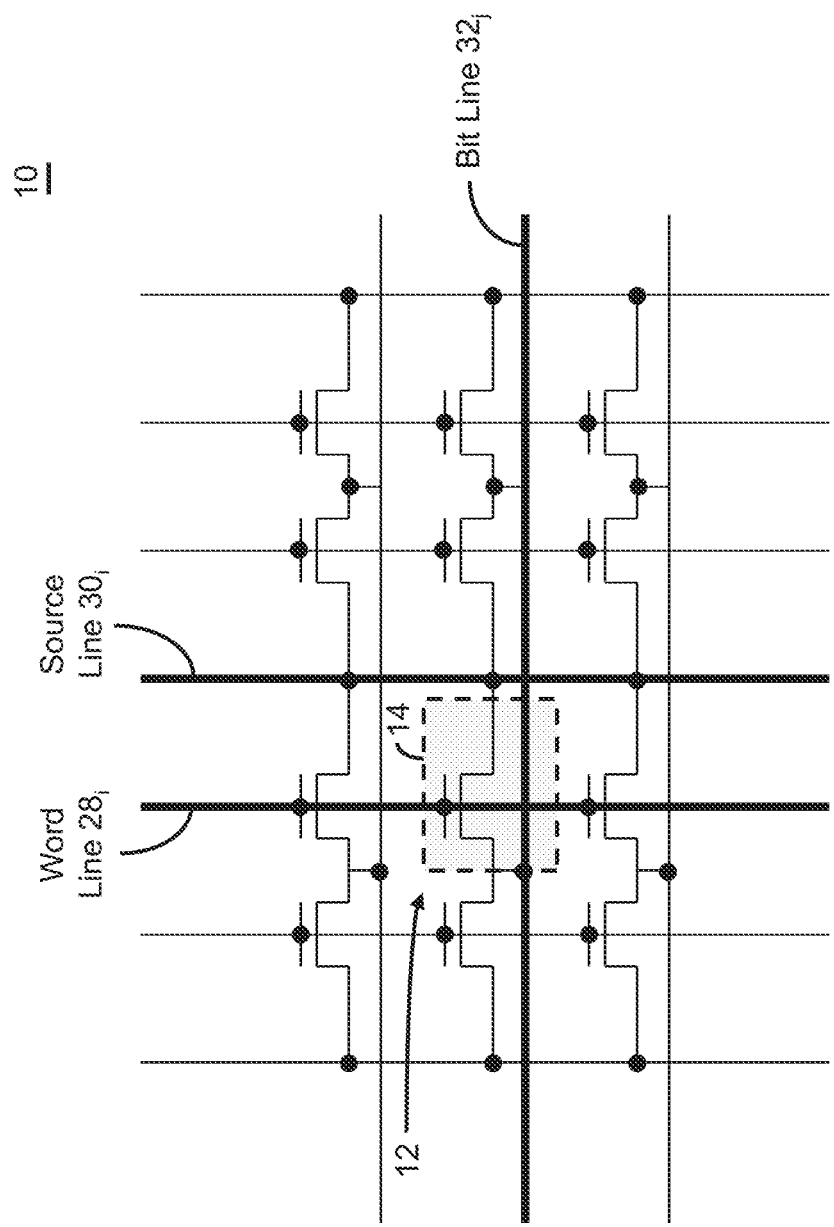
FIG. 1A is a schematic representation of a prior art DRAM array including a plurality of memory cells comprised of one electrically floating body transistor.
Figure 2A:
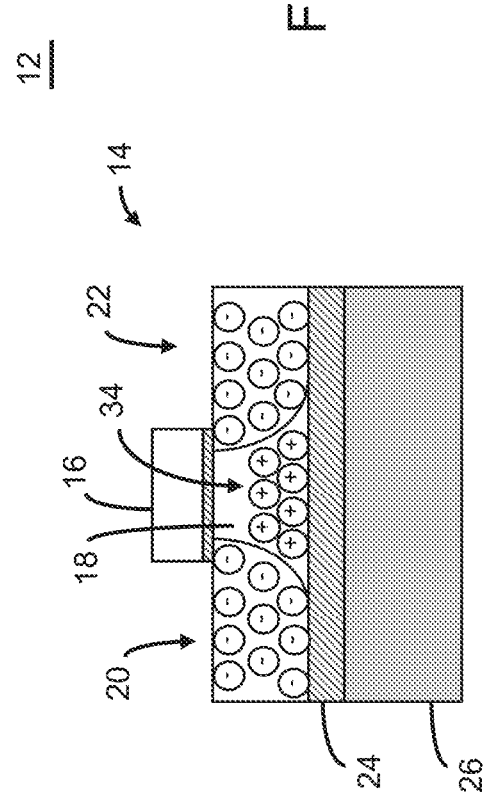
FIGS. 2A and 2B are exemplary schematic illustrations of the charge relationship, for a given data state, of the floating body, source and drain regions of a prior art memory cell comprised of one electrically floating body transistor (PD-SOI NMOS)
Figure 2B:
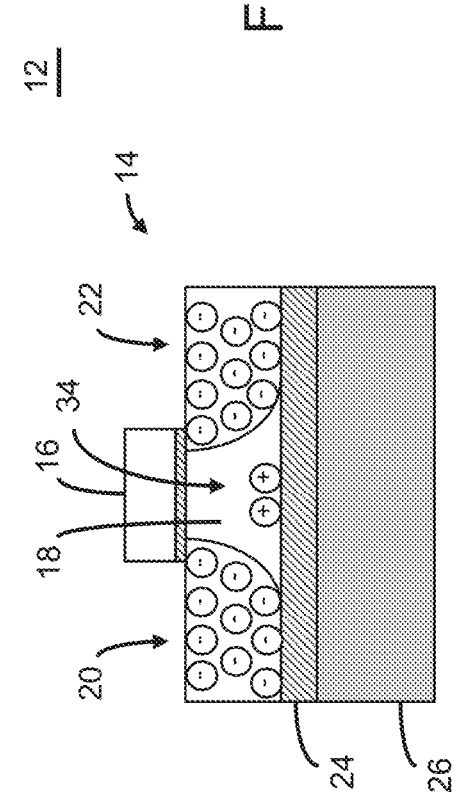
Figure 5:
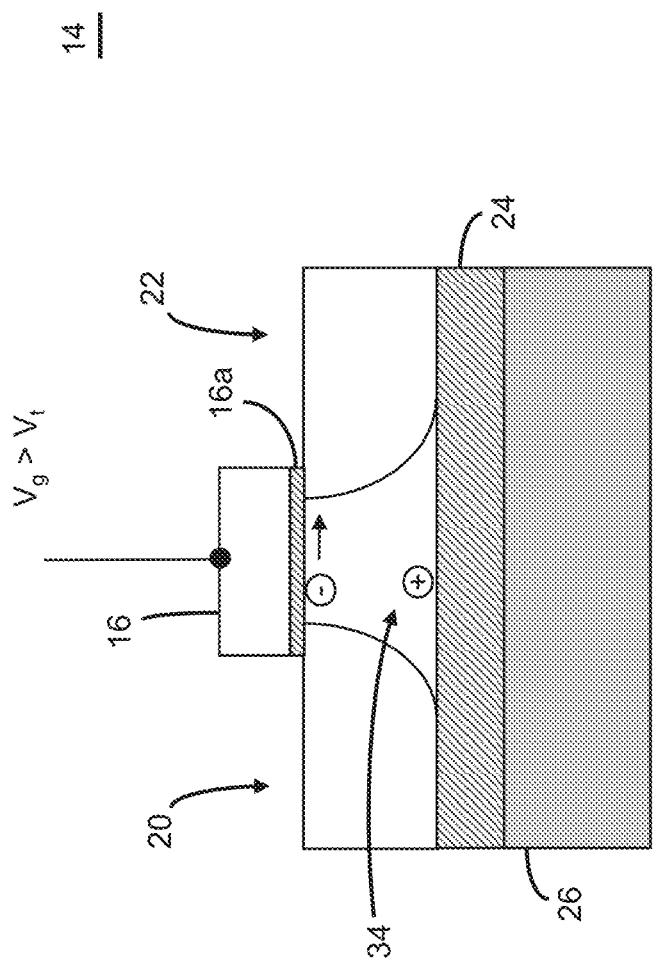
FIG. 5 illustrates an exemplary schematic (and control signal) of a conventional reading technique, the state of the memory cell may be determined by sensing the amount of the channel current provided/generated in response to the application of a predetermined voltage on the gate of the transistor of the memory cell.
Figure 6:
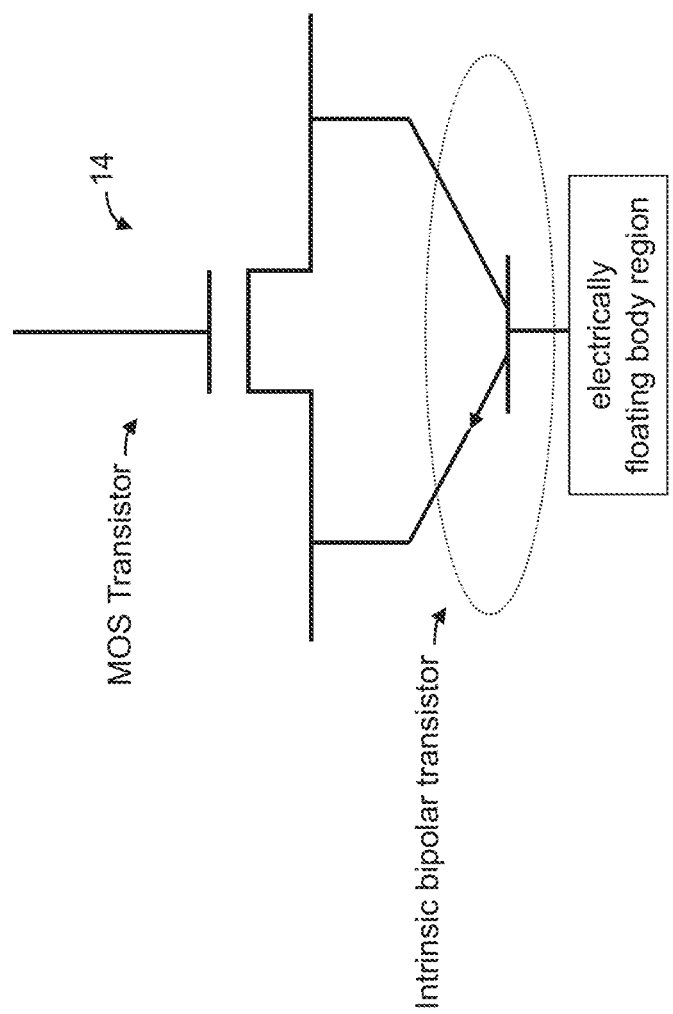
FIG. 6 is a schematic representation of an equivalent electrically floating body memory cell (N-channel type) including an intrinsic bipolar transistor in addition to the MOS transistor.
Figure 7:
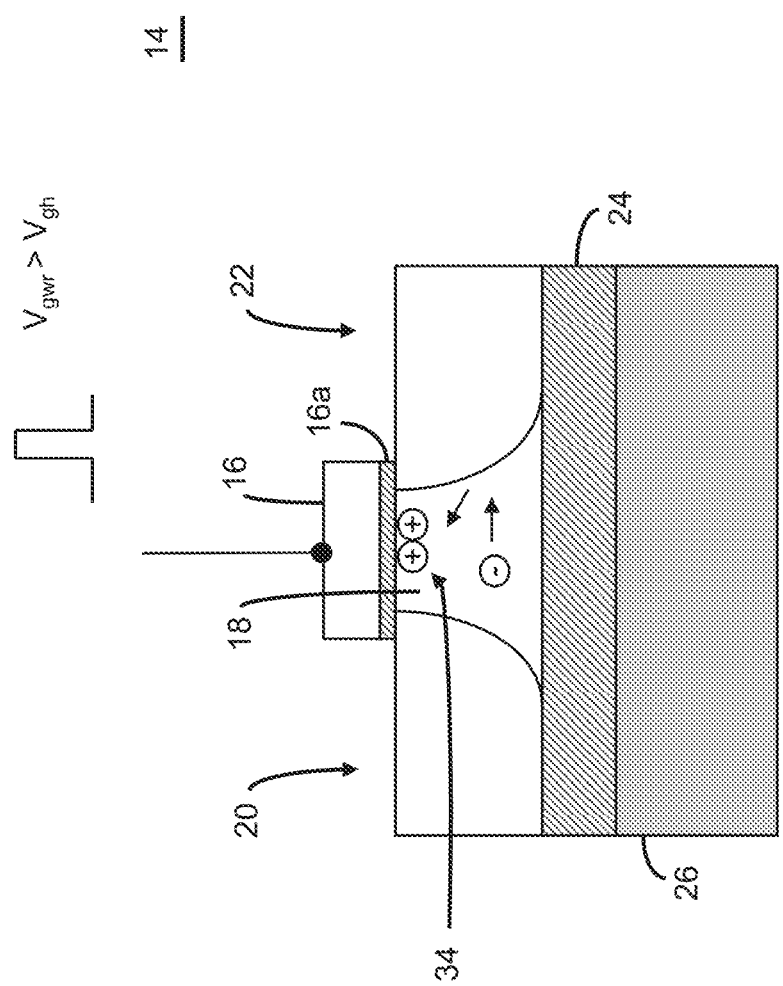
FIG. 7 illustrates an exemplary schematic (and control signal voltage relationship) of an exemplary embodiment of an aspect of the '188 Application of programming a memory cell to logic state "1" by generating, storing and/or providing an excess of majority carriers in the electrically floating body of the transistor of the memory cell.
Figure 8:
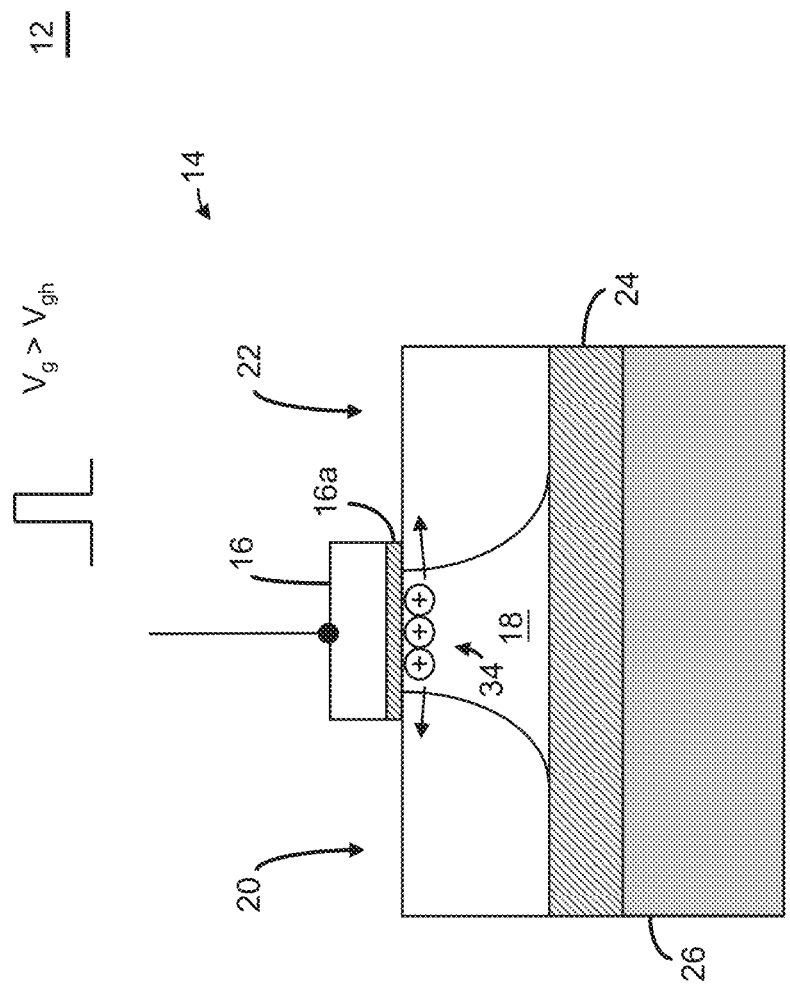
FIG. 8 illustrates an exemplary schematic (and control signals) of an exemplary embodiment of an aspect of the '188 Application of programming a memory cell to a logic state "0" by generating, storing and/or providing relatively fewer majority carriers (as compared to the number of majority carriers in the electrically floating body of the memory cell that is programmed to a logic state "1") in the electrically floating body of the transistor of the memory cell, wherein the majority carriers are removed (write "0") through both drain and source terminals by applying a control signal (for example, a programming pulse) to the gate of the transistor of the memory cell.
Figure 9:
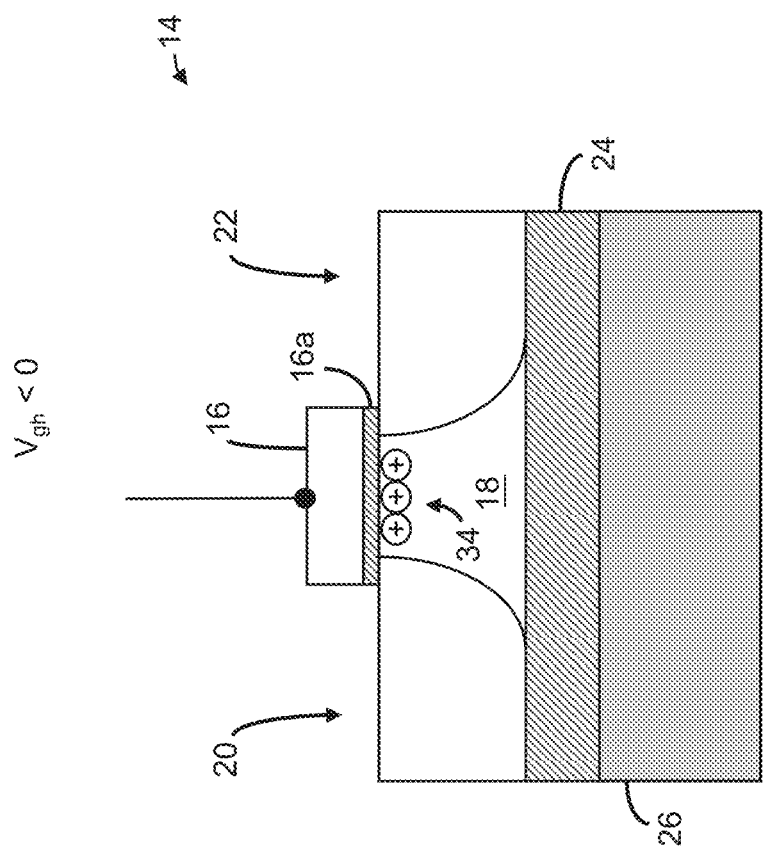
FIG. 9 illustrates an exemplary schematic (and control signals) of an exemplary embodiment of an aspect of the '188 Application of holding or maintaining the data state of a memory cell.
Figure 10:
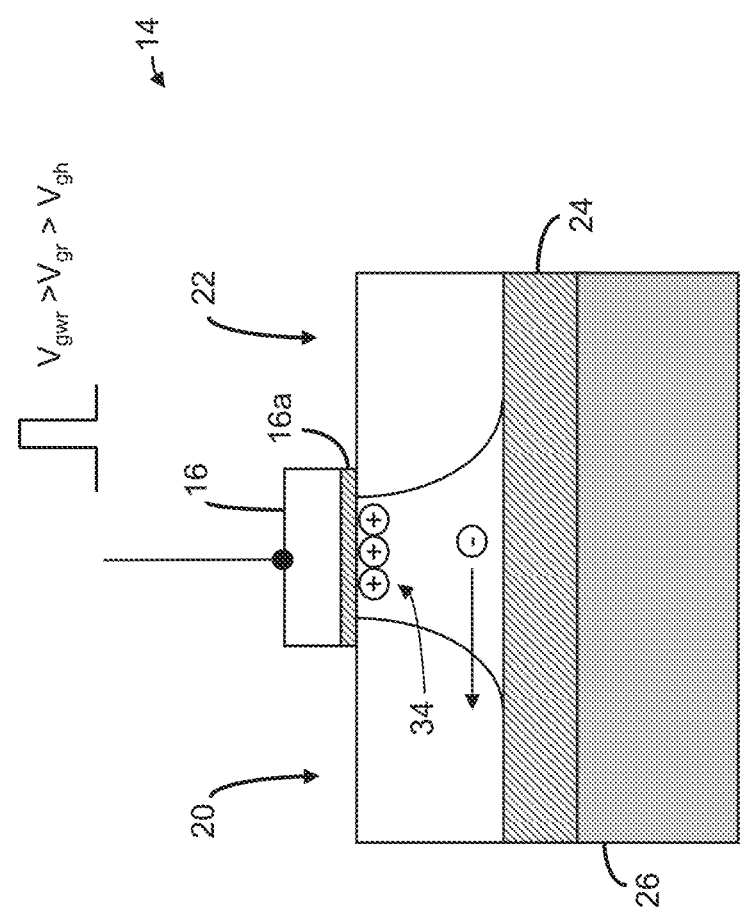
FIG. 10 illustrates an exemplary schematic (and control signals) of an exemplary embodiment of an aspect of the '188 Application of reading the data state of a memory cell by sensing the amount of the current provided/generated in response to an application of a predetermined voltage on the gate of the transistor of the memory cell.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

There are many inventions described and illustrated herein. In one aspect, the present inventions are directed to a memory cell array having a plurality of memory cells, arranged in a matrix of rows and columns, wherein each memory cell of a given row of memory cells shares a source region and/or a drain region with an adjacent memory cell of an adjacent row of memory cells. In certain embodiments, the memory cell array includes a barrier disposed in or between the shared source regions and/or shared drain regions of adjacent memory cells. The barrier may include one or more different materials and/or one or more different crystalline structures relative to the material(s) and/or crystalline structure(s) of the source and/or drain regions of the transistors of the memory cells.

The barrier includes a material and/or crystalline structure thereof which includes electrical characteristics that reduce, eliminate and/or minimize any disturbance and/or adverse impact on a given memory cell (for example, reduction in the read window), during performance of one or more memory operations (for example, a read and/or write operation(s)) on memory cells adjacent to such given memory cell. For example, such material may facilitate and/or provide for sufficiently rapid recombination of charge carriers (minority and/or majority) —relative to the material of the source and/or drain regions of the transistors of memory cells that share source regions and/or shared drain regions with transistors of adjacent memory cells.

In another aspect, the present inventions are directed to methods of manufacturing such memory cell arrays. Notably, the memory cell array may comprise a portion of an integrated circuit device, for example, a logic device (such as, a microcontroller or microprocessor) or a portion of a memory device (such as, a discrete memory).

The present inventions may be implemented in conjunction with any memory cell technology, whether now known or later developed. For example, the memory cells may include one or more transistors having electrically floating body regions (for example, as described in detail in the Introduction), one transistor-one capacitor architectures, electrically floating gate transistors, junction field effect transistors (often referred to as JFETs), or any other memory/transistor technology whether now known or later developed. All such memory technologies are intended to fall within the scope of the present inventions.

Moreover, the present inventions may be implemented in conjunction with any type of memory (including discrete or integrated with logic devices), whether now known or later developed. For example, the memory may be a DRAM, SRAM and/or Flash. All such memories are intended to fall within the scope of the present inventions.

In one embodiment, the memory cells of the memory cell array may include at least one transistor having an electrically floating body transistor which stores an electrical charge in the electrically floating body region thereof. The amount of charge stored in the in the electrically floating body region correlates to the data state of the memory cell. One type of such memory cell is based on, among other things, a floating body effect of semiconductor on insulator (SOI) transistors. (See, for example, (1) Fazan et al., U.S. Pat. No. 6,969,662, (2) Okhonin et al., U.S. Patent Application Publication No. 2006/0131650 ("Bipolar Reading Technique for a Memory Cell Having an Electrically Floating Body Transistor"), (3) Okhonin et al., U.S. Patent Application Publication No. 2007/0058427 ("Memory Cell and Memory Cell Array Having an Electrically Floating Body Transistor, and Methods of Operating Same"), (4) Okhonin, U.S. Patent Application Publication No. 2007/ 0138530 ("Electrically Floating Body Memory Cell and Array, and Method of Operating or Controlling Same"), and (5) Okhonin et al., U.S. Patent Application Publication No. 2007/0187775, ("Multi-Bit Memory Cell Having Electrically Floating Body Transistor, and Method of Programming and Reading Same"), all of which are incorporated by reference herein in its entirety). In this regard, the memory cell may consist of a partially depleted (PD) or a fully depleted (FD) SOI transistor or bulk transistor (transistor which formed in or on a bulk material/substrate) having a gate, which is disposed adjacent to the electrically floating body and separated therefrom by a gate dielectric. The body region of the transistor is electrically floating in view of the insulation or non-conductive region, for example, in bulk-type material/substrate, disposed beneath the body region. The state of memory cell may be determined by, for example, the concentration or amount of charge contained or stored in the body region of the SOI or bulk transistor.

With reference to FIGS. 11, 12, 13 and 14A, the discussion of an exemplary method of manufacturing a memory cell array, including a plurality of memory cells having electrically floating body transistors (as described above), may begin with source/drain implantation into semiconductor layer 25 (for example, silicon-germanium, gallium arsenide, silicon carbide or monocrystalline silicon) using conventional and/or unconventional semiconductor processing techniques (for example, doping, implantation and annealing techniques). In this exemplary method, dopant ions (p-type or n-type such as boron, phosphorus or arsenic) are implanted in a semiconductor layer 25. In this way, the conductivity of semiconductor layer 25 which is exposed to the implantation (and thereafter annealing) may be different from the conductivity of the portions of the semiconductor layer 25 not exposed to implantation (for example, the portions beneath gates 16). Notably, in this embodiment, the dopant is introduced into semiconductor layer 25 using gate 16 and associated spacers to provide a self-aligned source/drain regions of the transistor.

After annealing and formation of a lightly doped region of the source/drain regions via annealing after ion implantation (if any), the illustrated portion of the memory cell array includes transistors 14a-14c of memory cells 12a-12c, respectively. The transistors 14a-14c are disposed on region 24 (for example, insulation region (for example, silicon oxide or silicon nitride) or non-conductive region (for example, region of a bulk semiconductor die or wafer)). The transistor 14a includes gate 16 and gate dielectric 16a, which is disposed between gate 16 and body region 18 of transistor 14. The body region 18 is disposed between source region 20 and drain region 22 of transistor 14a. The body, source and drain regions (18, 20 and 22, respectively) may be fabricated and/or formed in a semiconductor layer (for example, a monocrystalline material such as silicon) using conventional and/or unconventional semiconductor processing techniques (for example, lithographic, doping and implantation techniques). For example, cap/spacer structure 38 (for example, a silicon nitride and/or a silicon oxide material) may be employed to provide desired, suitable, predetermined and/or proper relative alignment of body, source and drain regions (18, 20 and 22, respectively) as well as insulation and/or protection of gate 16 from adjacent structures and/or subsequent processing. Notably, gate 16 and gate dielectric 16a may also be fabricated and/or formed using conventional and/or unconventional processing techniques. Moreover, the substrate of the integrated circuit may be comprised of region 24 and substrate 26.

Figure 11:
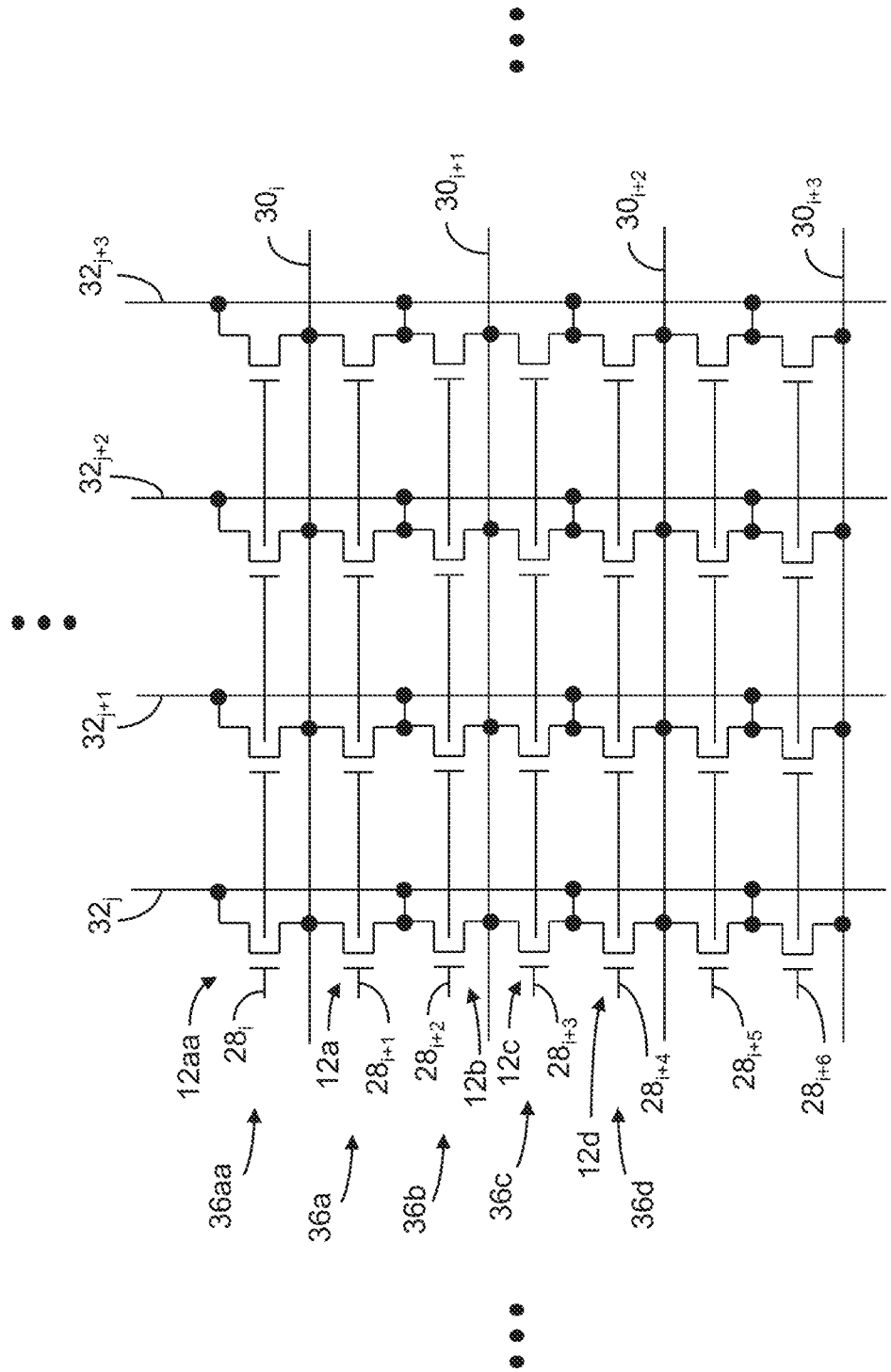
FIG. 11 is a schematic representation of a memory cell array including a plurality of memory cells having one electrically floating body transistor wherein the memory cell array layout includes memory cells having shared source regions and shared drain regions wherein the transistor of a memory cell of a given or predetermined row of memory cells (i) shares a source region with a source region of an adjacent memory cell of first adjacent row of memory cells and (ii) shares a drain region with a drain region of an adjacent memory cell of second adjacent row of memory cells.
Figure 12:
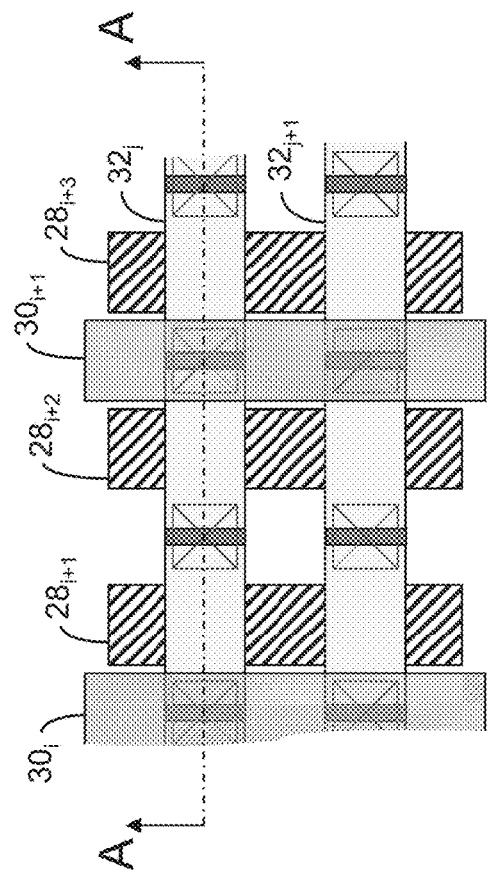
FIG. 12 is an exemplary plan view layout (not drawn to scale) of a portion of the memory cell array of FIG. 11 illustrating the common source and common drain transistor of the memory cell and memory cell array architecture, according to an exemplary embodiment of certain aspects of the present inventions.

With continued reference to FIG. 14B, in this exemplary embodiment, transistor 14a shares source region 20 with the transistor of an adjacent memory cell (see memory cell 12aa in FIG. 11) of an adjacent row of memory cells (see row 36aa in FIG. 11). In addition, transistor 14a shares drain region 22 with transistor 14b of adjacent memory cell 12b.

Further, transistors 14b and 14c each also include a gate 16 and a gate dielectric 16a disposed between gate 16 and a body region 18. The transistor 14b, in addition to sharing drain region 22 with transistor 14a, shares source region 20 with transistor 14c of adjacent memory cell 12c (which is a part of adjacent row 36c). Moreover, transistor 14c shares drain region 22 with transistor 14d of adjacent memory cell 12d which is a part of adjacent row 36d (illustrated in circuit form in FIG. 11).

Notably, although gate 16 of transistors 14 is illustrated as including a plurality of materials (for example, a polycide material disposed on a polysilicon) gate 16 may be fabricated from one material (for example, a polysilicon); indeed any conventional or non-conventional structure, arrangement and/or material may be employed. Moreover, gate dielectric 16a may include one (for example, a silicon oxide or a high dielectric constant material) or more than one material (for example, an oxide-nitride-oxide "sandwich" structure or a high dielectric constant composite material). All gate and gate dielectric structures, arrangements and/or materials, whether known or unknown (whether conventional or unconventional), are intended to fall within the scope of the present invention.

With reference to FIG. 14C, layer 40 is deposited, grown and/or formed on cap/spacer structure 38, source region 20 and drain region 22 of transistors 14 of the memory cell array. The layer 40 may include an insulating material, for example, a silicon oxide and/or a silicon nitride. Thereafter, layer 40 may be etched, removed and/or patterned to form and/or provide trenches 42a which expose selected portions 44 of source and drain regions (20 and 22, respectively) of transistors 14 of memory cells 12 of the memory cell array. (See, FIG. 14D). In one embodiment, an anisotropic etch technique is employed to form trenches 42a.

With reference to FIGS. 14D and 14E, portions 44 of source and drain regions (20 and 22, respectively) of transistors 14 of memory cells 12 may then be etched and/or removed to form and/or provide trenches 42b. In one embodiment, portions 44 of source and drain regions (20 and 22, respectively) are etched and/or removed to or substantially to insulation region or non-conductive region 24. Where selected portions of 44 are removed entirely, trenches 42b expose selected portions 46 of insulation region or non-conductive region 24 in the memory cell array.

Figure 14F:
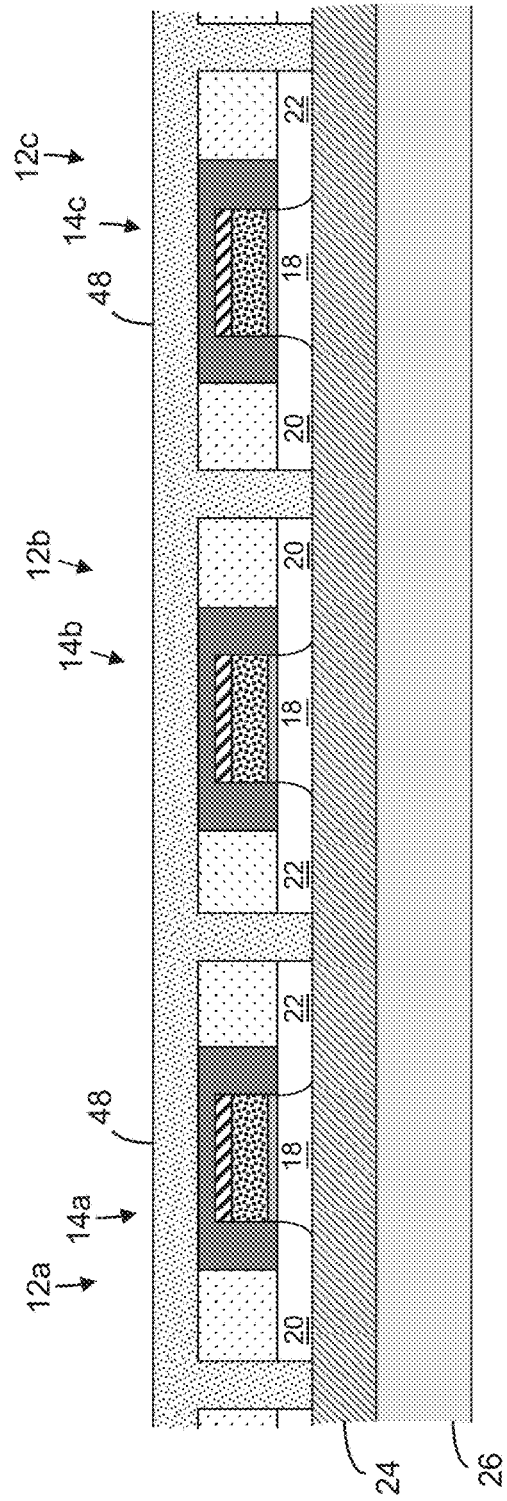
FIGS. 14A-14N illustrate cross-sectional views (sectioned along dotted line A-A of FIG. 12) of the fabrication of the memory cell array of FIGS. 11, 12 and 13 at various stages of an exemplary process that provides barriers between the drain and source regions of adjacent memory cells, according to certain aspects of the present inventions.
Figure 14G:
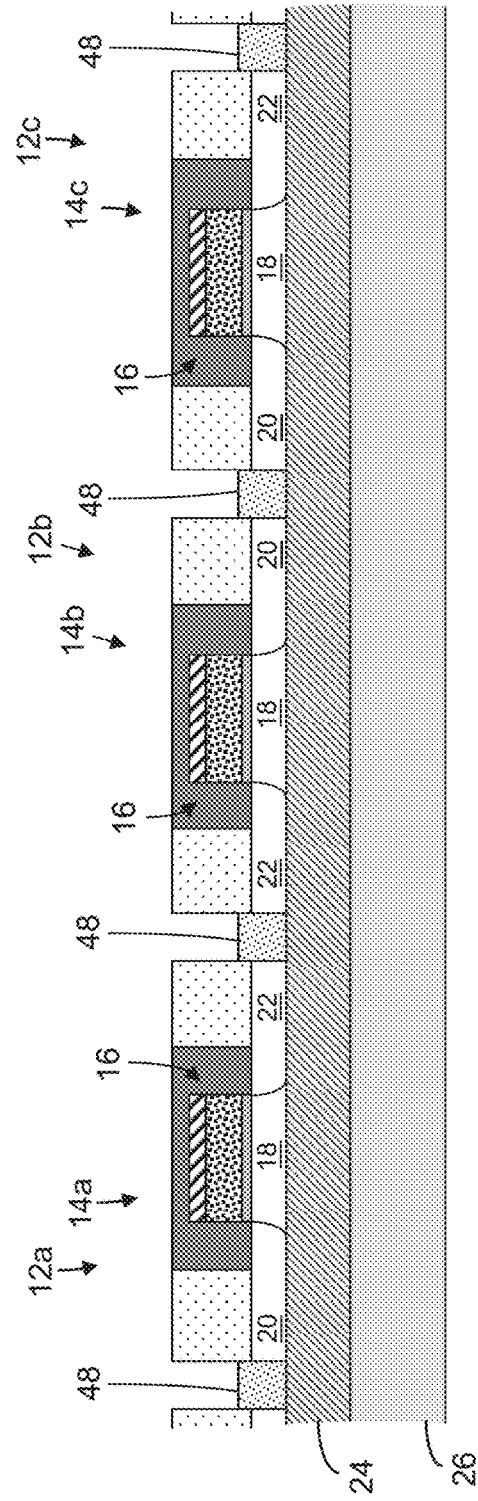
Figure 14L:
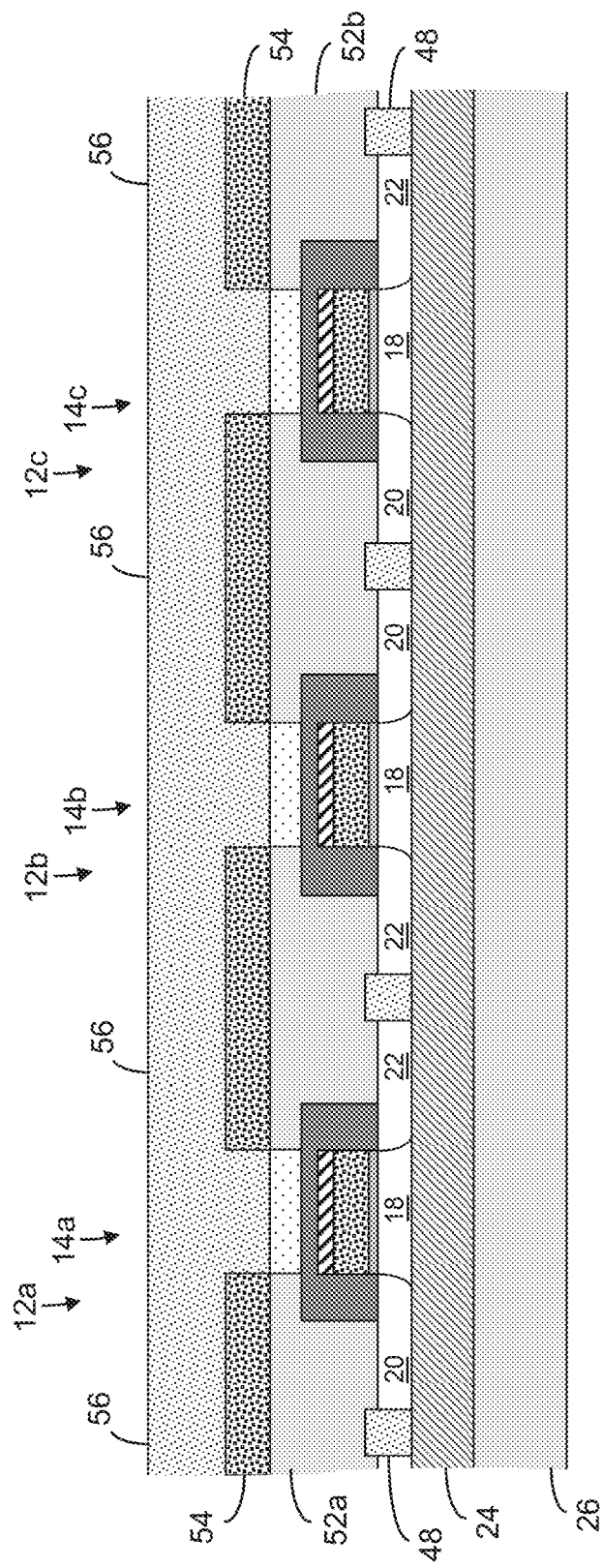
Figure 14M:
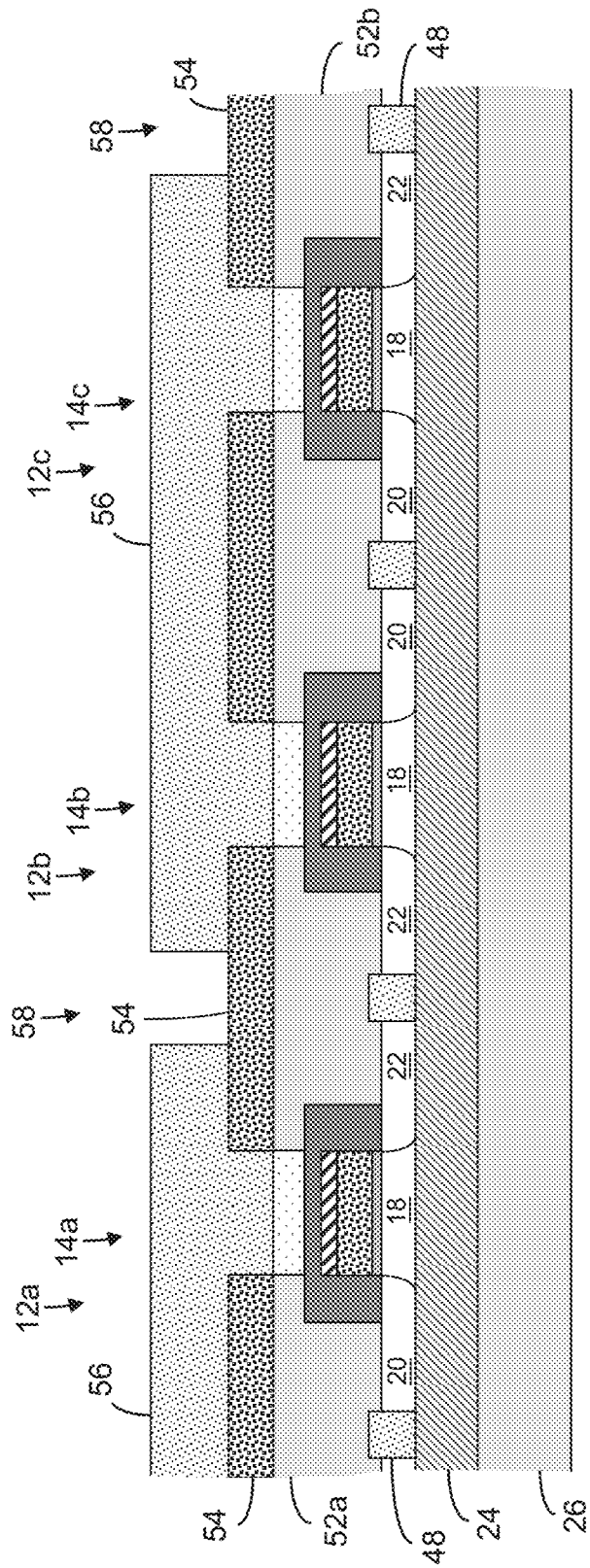

Thereafter, with reference to FIGS. 14F and 14G, barriers 48 may be deposited, grown and/or provided in trenches 42b and a certain, selective and/or predetermined amount is thereafter etched and/or removed (see, FIG. 14G). In those circumstances where exposed, barriers 48 may be deposited, grown and/or provided on selected portions 46 of insulation region or non-conductive region 24 in the memory cell array. Thus, in this embodiment, a barrier 48 is disposed between drain regions 22 of transistors 14a and 14b; similarly, a barrier 48 is disposed between source regions 20 of transistors 14b and 14c.

The barriers 48 may provide a discontinuity between the common source regions and/or common drain regions of the transistors of adjacent memory cells. The material and/or crystalline structure of the barriers 48 may include electrical characteristics that facilitate and/or provide for sufficiently and relatively rapid recombination of charge carriers (minority and/or majority) in the source and/or drain regions of the transistors of memory cells that share source regions and/or shared drain regions with transistors of adjacent memory cells. In this way, any disturbance and/or adverse impact on a given memory cell (for example, reduction in the read window), during performance of one or more memory operations (for example, a read and/or write operation(s)) on memory cells adjacent to such given memory cell, is reduced, eliminated and/or minimized.

The barriers 48 may include an insulator, semiconductor or metal material. The barriers 48 may include materials in column IV of the periodic table, for example, silicon, germanium, carbon; also combinations of these, for example, silicon germanium, or silicon carbide; also of III-V compounds for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium.

The materials of barriers 48 may include various crystal structures, including monocrystalline, polycrystalline, nanocrystalline, or amorphous, or combinations thereof, for example, regions of a first crystalline structure (for example, polycrystalline) and regions of a second crystalline structure (for example, amorphous). Indeed, barriers 48 may be the same material as the material of source regions 20 and/or drain regions 22 but include a different crystalline structure. In this regard, source and drain regions (20 and 22, respectively) of transistors 14 are often formed in a monocrystalline semiconductor layer or material (for example, monocrystalline silicon) disposed on insulation or non-conductive region 24. Under this circumstance, barriers 48 may be fabricated or formed from the same material (for example, silicon) but include a different crystalline structure (for example, a polycrystalline or amorphous structure).

Notably, layer 40, in this embodiment, provides a desired, suitable, predetermined and/or proper alignment of barriers 48 between source regions 18 of transistors 14 of adjacent memory cells 12 and/or barriers between drain regions 22 of transistors 14 of adjacent memory cells 12. Indeed, in this embodiment, such barriers 48 are substantially self-aligned.

With reference to FIGS. 14H and 14I, in one embodiment, insulating layer 50 may be deposited, grown and/or formed on and/or over barriers 48. After planarization (for example, via chemical mechanical polishing) and patterning/etching, portions (50a, 50b, 50c) of insulating layer 50 reside on and over cap/spacer structure 38 and the gate of transistors 14a-14c of memory cells 12a-12c, respectively. In this way, the bit line and source line contacts to the drain and source regions (respectively) of the transistors of the memory cells are substantially self-aligned.

Thereafter, contacts 52a are deposited, grown and/or formed on source regions 20 and barriers 48 disposed therebetween. (See, FIG. 14J). Concurrently, contacts 52b are deposited, grown and/or formed on drain regions 22 as well as barriers 48 disposed therebetween. The contacts 52a and 52b may include a conductive material (for example, a metal such as tungsten, titanium, titanium nitride, copper and/or aluminum) and/or a semiconductor material (for example, a silicon or silicon germanium, whether doped or undoped).

With reference to FIGS. 14K-14N, in one embodiment, a conductive material 54 may be deposited, grown and/or formed on contacts 52a and 52b. The conductive material facilitates electrical connection of source and bit lines 30 and 32, respectively, to contacts 52a and 52b, respectively. Indeed, conductive material 54 may be employed as or form at least a portion of source and/or bit lines 30 and 32, respectively.

Thereafter, insulation material 56 may be deposited, grown and/or formed on contacts 52a and 52b (see FIG. 14L) and via holes 58 (see, FIG. 14M) formed to facilitate electrical connection to an associated bit line 32. In this regard, with reference to FIG. 14N), a material (for example, a metal such as copper, aluminum, chromium, gold, silver, molybdenum, platinum, palladium, tungsten and/or titanium), metal stacks, complex metals and/or complex metal stacks) and/or a semiconductor material (for example, a silicon or silicon-germanium, whether doped or undoped) may then be deposited, grown and/or formed to provide bit line 32. Notably, although not illustrated or fabricated in this manner in the exemplary embodiments, source line 30 may be fabricated in the same or similar manner as bit line 32 (i.e., the source lines may be connected to associated source regions of transistors of associated memory cells by way of the same or similar material as described above with respect to bit lines 32). Moreover, as discussed below, material 54 may be eliminated before deposition, growth and/or formation of bit line 32 (and/or source line 30 in those embodiments where the source lines are connected to associated source regions of transistors of associated memory cells by way of the same or similar material and manner as described above with respect to bit lines 32).

Thereafter (for example, immediately or after additional circuitry and/or conductive layers are deposited, formed or grown), a passivation layer (not illustrated) may be deposited, formed or grown on the exposed surfaces (for example, exposed portions of bit line and/or source line, circuitry and/or conductive layers) to protect and/or insulate integrated circuit device. The passivation layer may include one or more layers including, for example, polymers, a silicon dioxide and/or a silicon nitride. Indeed, passivation layer may include a combination of silicon dioxide and a silicon nitride in a stack configuration; indeed, all materials and deposition, formation and/or growth techniques, whether now known or later developed, are intended to be within the scope of the present inventions.

Notably, additional processing may be employed to "protect" transistors and/or other elements (active and/or passive) in the periphery circuitry or logic portion of the integrated circuit. In this regard, a mask (soft or hard) or other protective layer may be disposed on or over such transistors and/or other elements (active and/or passive) in such periphery circuitry or logic portion during formation of barriers 48.

In another embodiment, the barriers may be substantially planar relative to the source and/or drain regions. In this regard, the height of the barriers is substantially the same as the height of the source and/or drain regions. For example, with reference to FIG. 15, barriers 48 are substantially planar with respect to the upper surface of source regions 20 and drain regions 22. The memory cell array of FIG. 15 may be manufactured using the processing steps which are illustrated in FIGS. 16A-16M. In this embodiment, however, the timing of the etch of barriers 48 and/or the amount of material of barriers 48 which is removed is selected and/or predetermined to provide the structure illustrated in FIG. 16F. This notwithstanding, the discussion is substantially the same as the technique/steps described above with respect to the memory cell array of FIG. 13. For the sake of brevity, those discussions will not be repeated.

Notably, in another embodiment, the height of the barriers may be less than the height of the source and/or drain regions. For example, with reference to FIG. 17, barriers 48 do not provide a substantially planar relative to the source and/or drain regions and, as such, the height of barriers 48 is less than the height of the upper or top surface of source regions 20 and drain regions 22. In this embodiment, barrier 48, in combination or conjunction with portions of contact 52, may provide a discontinuity between the common source regions and/or common drain regions of the transistors of adjacent memory cells. The barrier-contact structure which is disposed between or in the common source and/or drain may include electrical characteristics that that reduce, eliminate and/or minimize any disturbance and/or adverse impact on a given memory cell (for example, reduction in the read window), during performance of one or more memory operations (for example, a read and/or write operation(s)) on memory cells adjacent to such given memory cell. For example, the material and/or crystalline structure may facilitate and/or provide for sufficiently and relatively rapid recombination of charge carriers (minority and/or majority) in the source and/or drain regions of the transistors of memory cells that share source regions and/or shared drain regions with transistors of adjacent memory cells.

Figure 13:
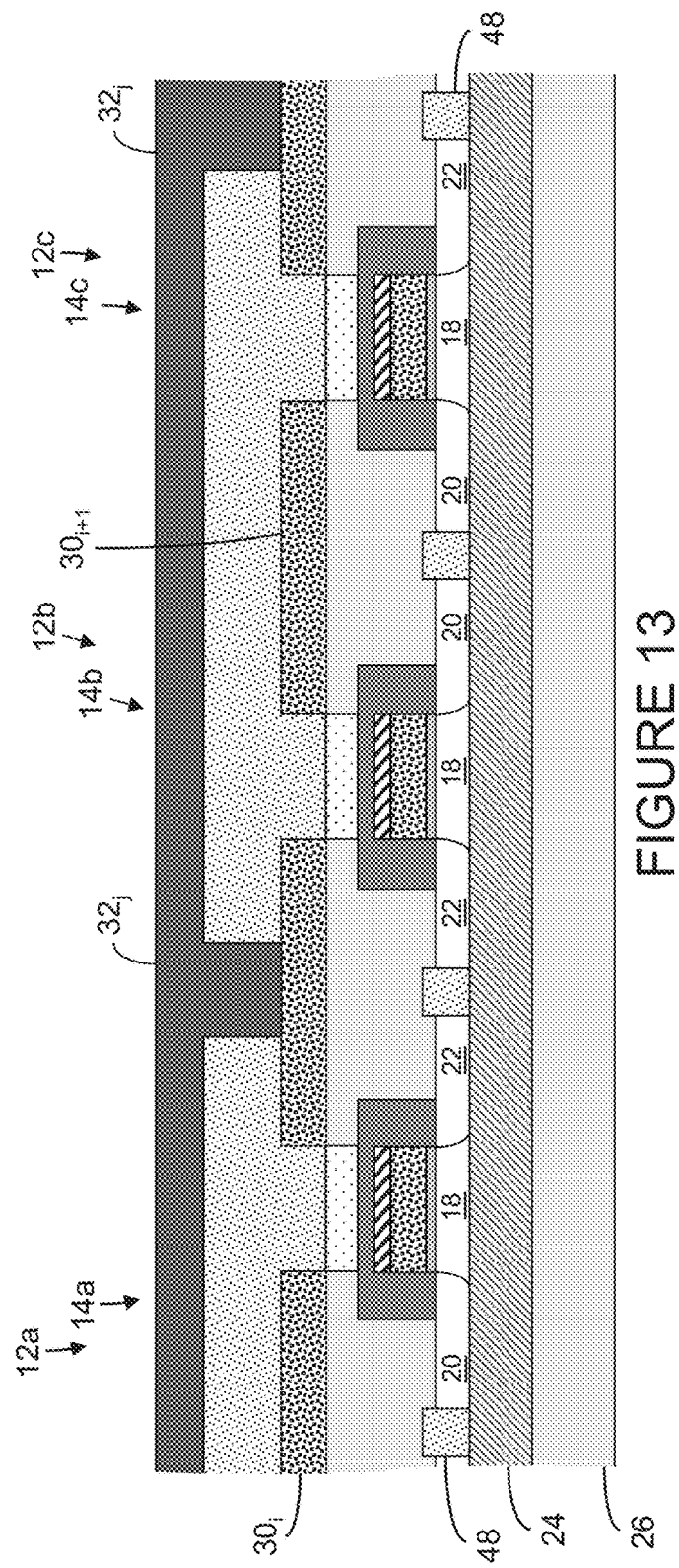
FIG. 13 is a cross-sectional view (sectioned along dotted line A-A of FIG. 12) of a portion of memory cell array of FIGS. 11 and 12 illustrating an exemplary embodiment of the present inventions according to at least one aspect of the present inventions.
Figure 14N:
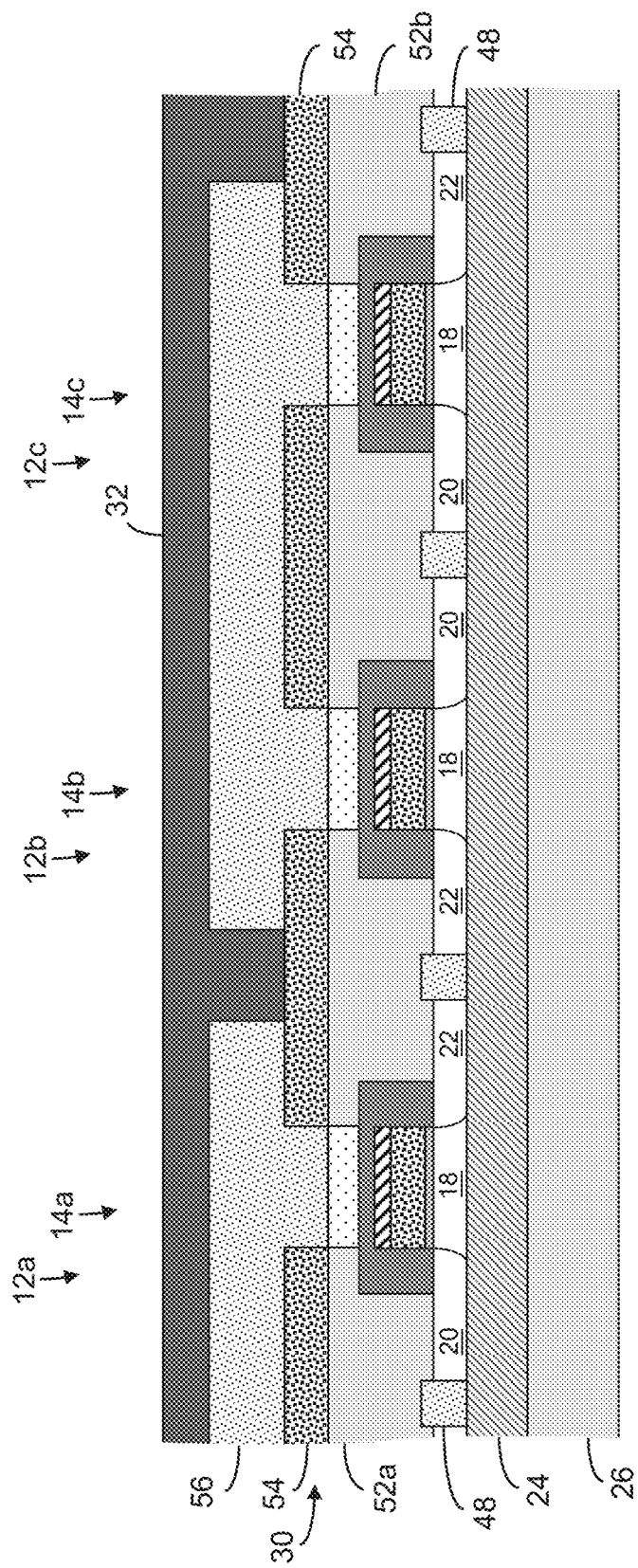
Figure 17:
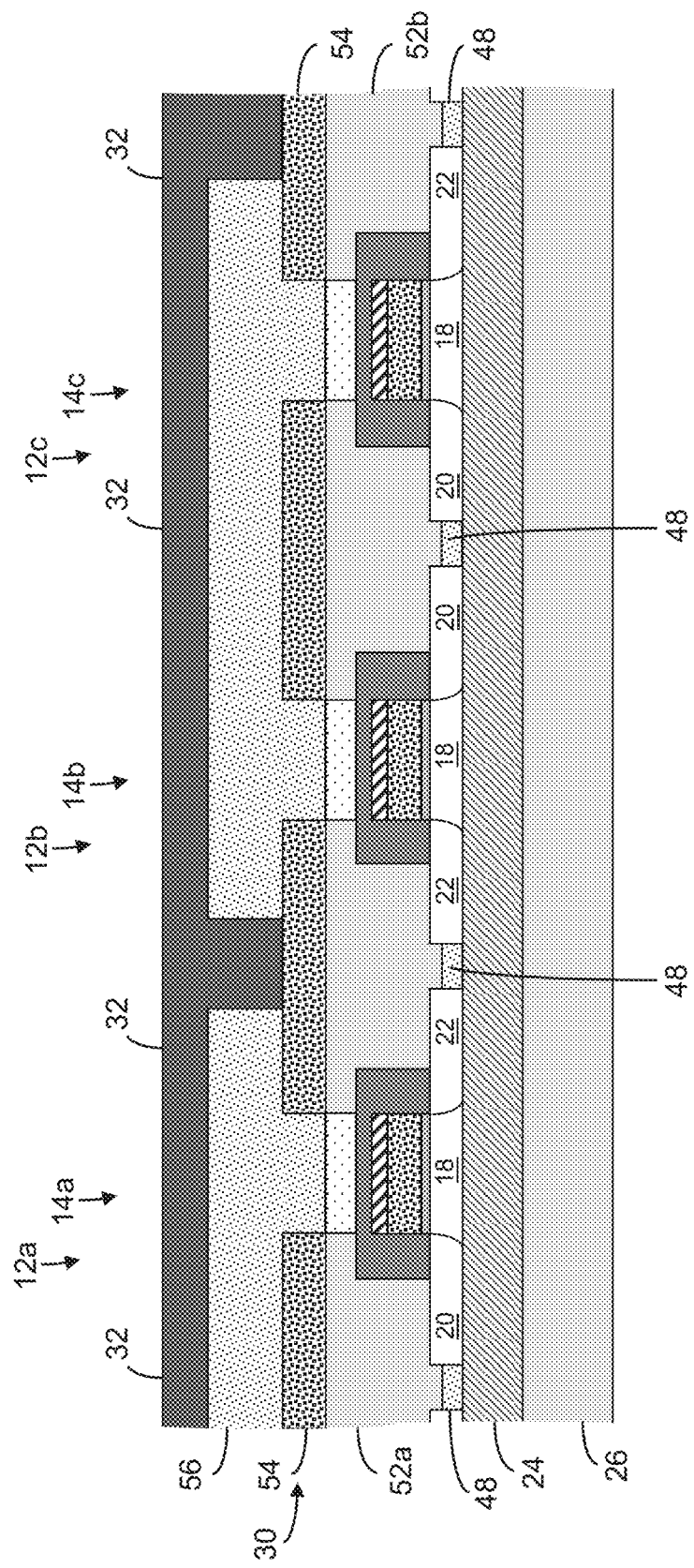
FIG. 17 is a cross-sectional view (sectioned along dotted line A-A of FIG. 12) of a portion of memory cell array of FIGS. 11 and 12 illustrating an exemplary embodiment of the present inventions, according to at least one aspect, wherein the barriers are not substantially planar with respect to the associated source and/or drain regions and the height of such barriers is less than the height of the associated source and/or drain regions.

The memory cell array of FIG. 17 may be manufactured using the processing steps which are illustrated in FIGS. 14A-14N and/or 16A-16M. Again, however, the timing of the etch of barriers 48 and/or the amount of material of barriers 48 which is removed may be selected and/or predetermined to provide the desired structure. This notwithstanding, the discussion is substantially the same as the technique/steps described above with respect to the memory cell array of FIGS. 13 and 15. For the sake of brevity, those discussions will not be repeated.

In another embodiment, the barriers are fabricated or formed from the material of the contact. For example, with reference to FIG. 18, contacts 52a and 52b are disposed between or in common source regions 20 and/or common drain regions 22 of transistors 14a-14c such that the electrical characteristics of the material and/or crystalline structure of such material of contacts 52a and 52b facilitate and/or provide for sufficiently rapid recombination of charge carriers (minority and/or majority) from the source and/or drain regions of the memory cells that share source regions and/or shared drain regions with adjacent memory cells. Such sufficiently and relatively rapid recombination may minimize, reduce and/or eliminate any disturbance and/or adverse impact on a given memory cell (for example, reduction in the read window) during implementation of one or more memory operations (for example, a read and/or write operation(s)) on memory cells adjacent to such given memory cell. Thus, in this embodiment, the contacts 52 provide a "discontinuity" (based on material and/or crystalline structure) between the common source regions and/or common drain regions of the transistors of adjacent memory cells.

Figure 15:
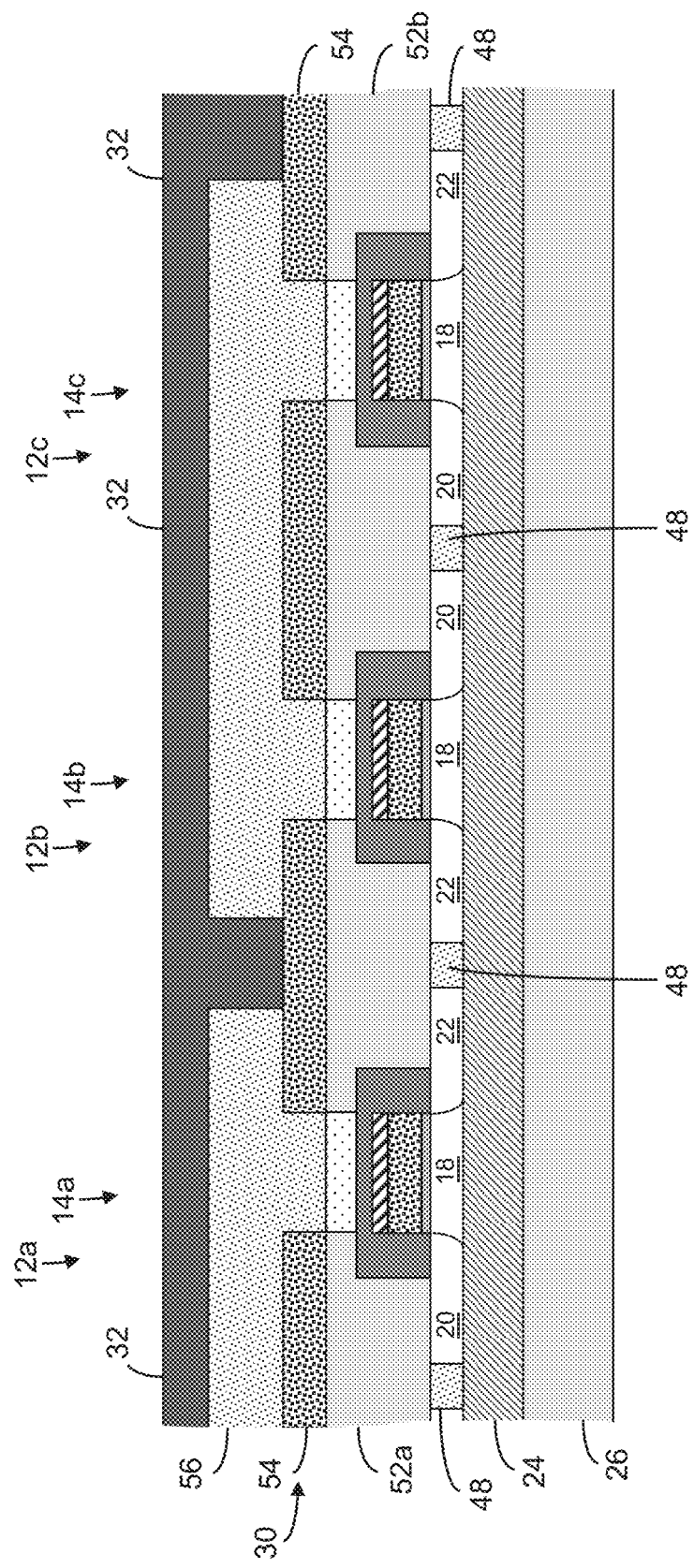
FIG. 15 is a cross-sectional view (sectioned along dotted line A-A of FIG. 12) of a portion of memory cell array of FIGS. 11 and 12 illustrating an exemplary embodiment of the present inventions, according to at least one aspect, wherein the barriers are substantially planar with respect to the associated source and/or drain regions.
Figure 16A:
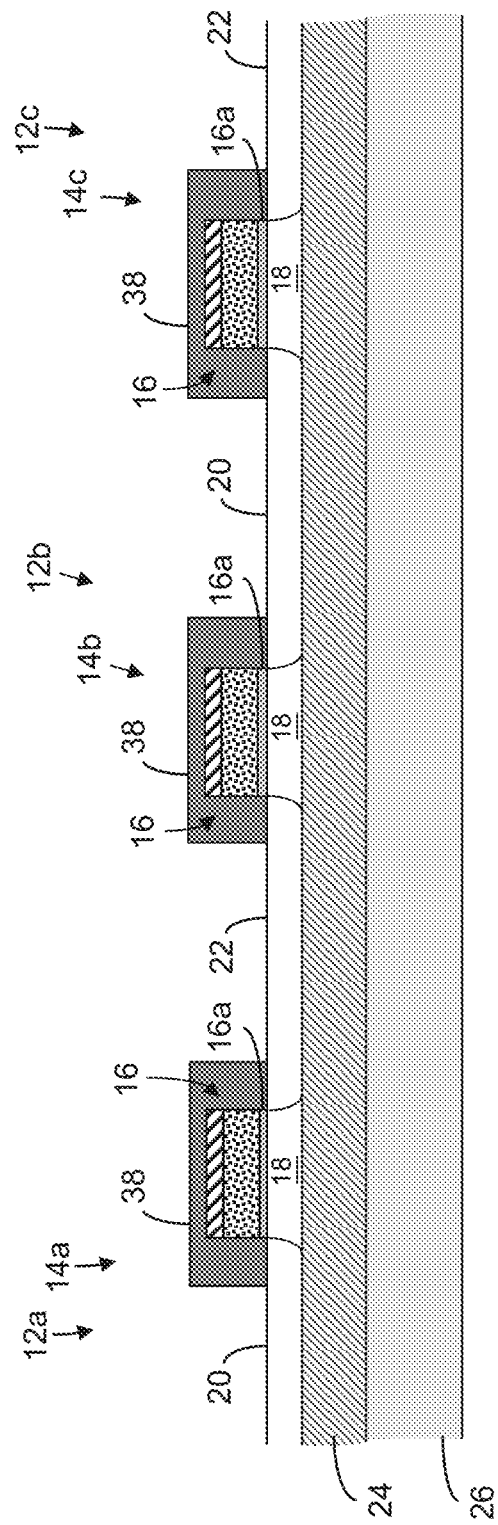
Figure 16B:
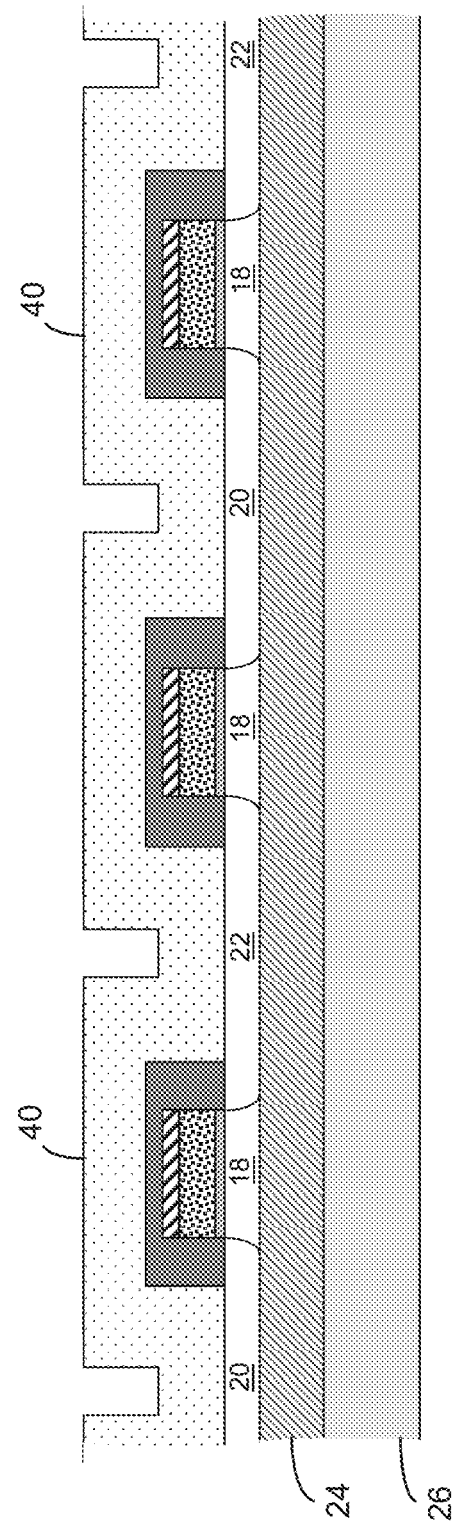
Figure 16K:
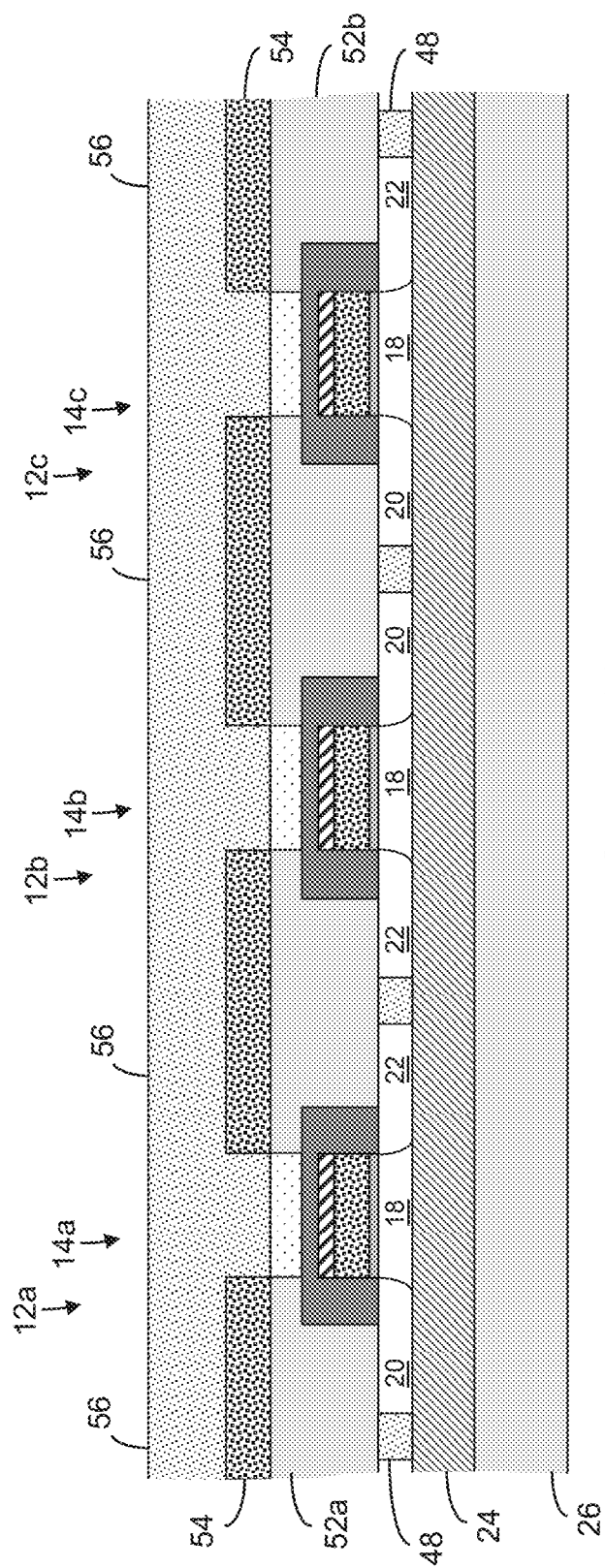
Figure 16L:
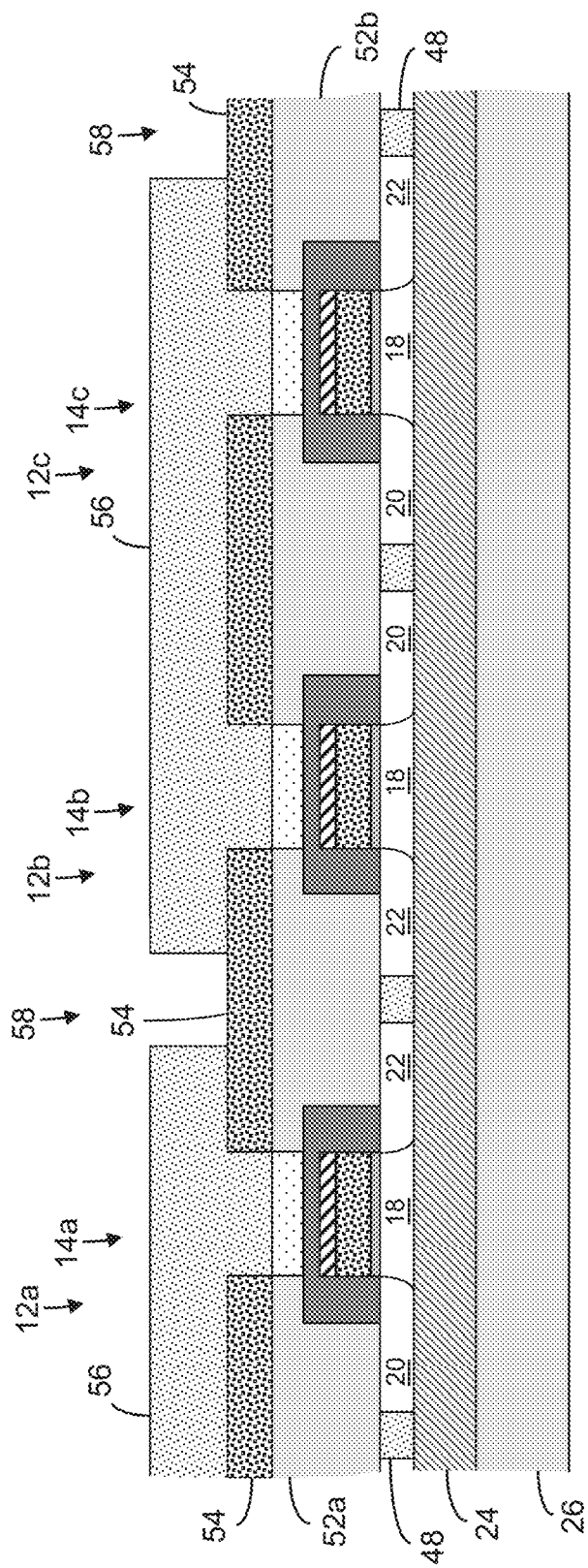
Figure 16M:
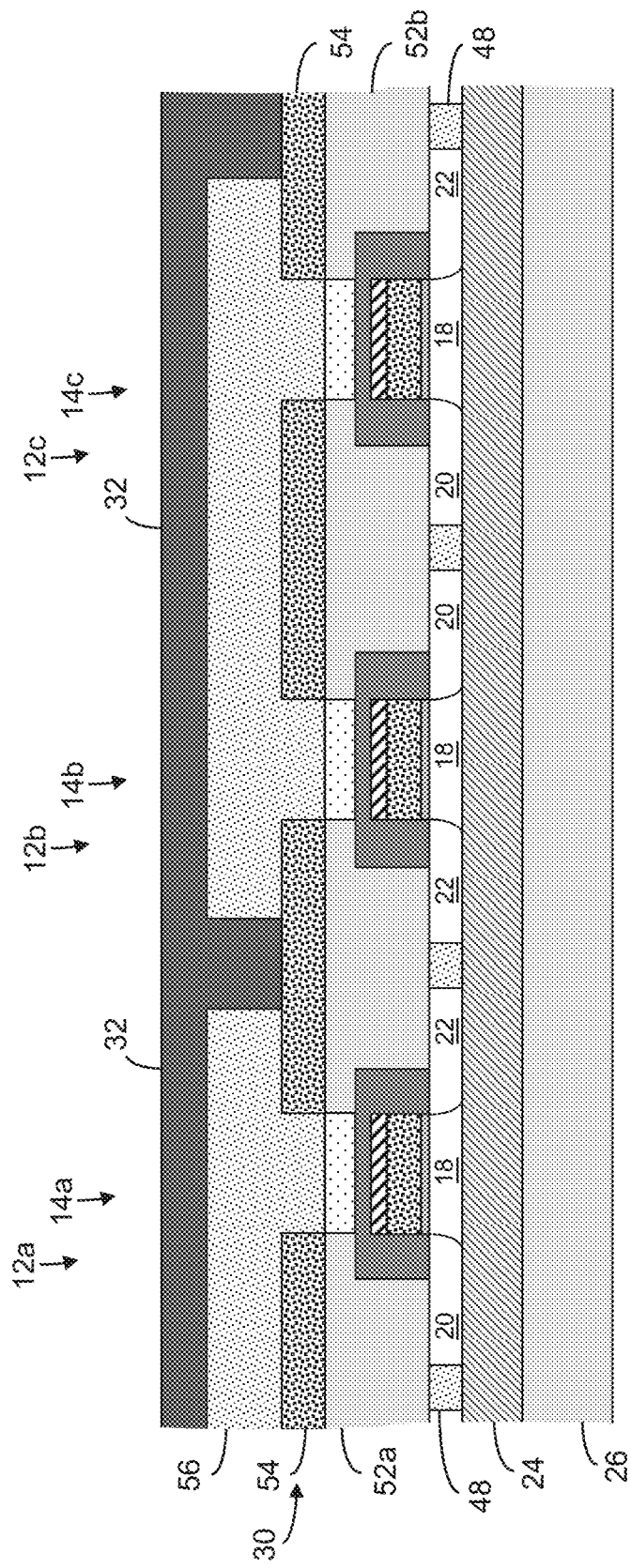
Figure 18:
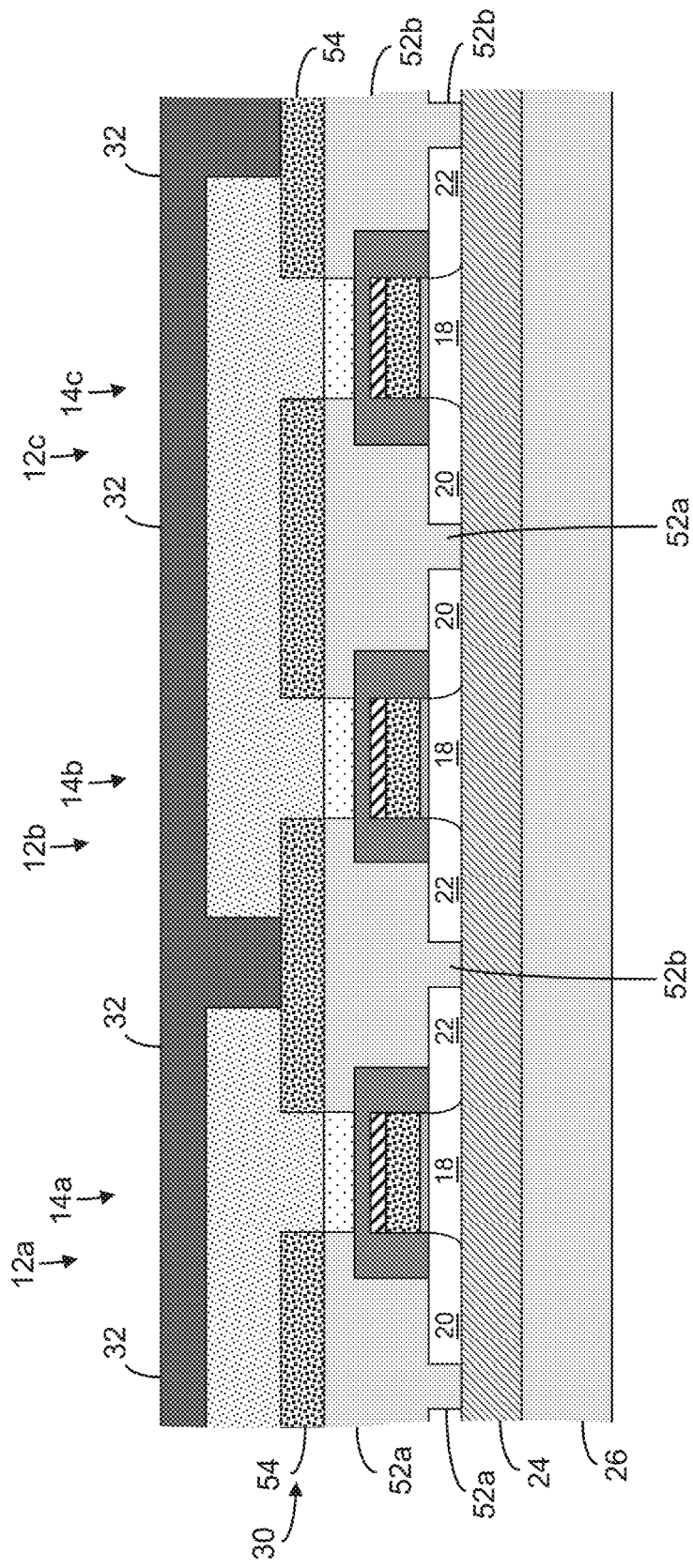
FIG. 18 is a cross-sectional view (sectioned along dotted line A-A of FIG. 12) of a portion of memory cell array of FIGS. 11 and 12 illustrating an exemplary embodiment of the present inventions, according to at least one aspect, wherein portions of the source line and bit line contacts are disposed between the source and/or drain regions of the transistors of adjacent memory cells.
Figure 19I:
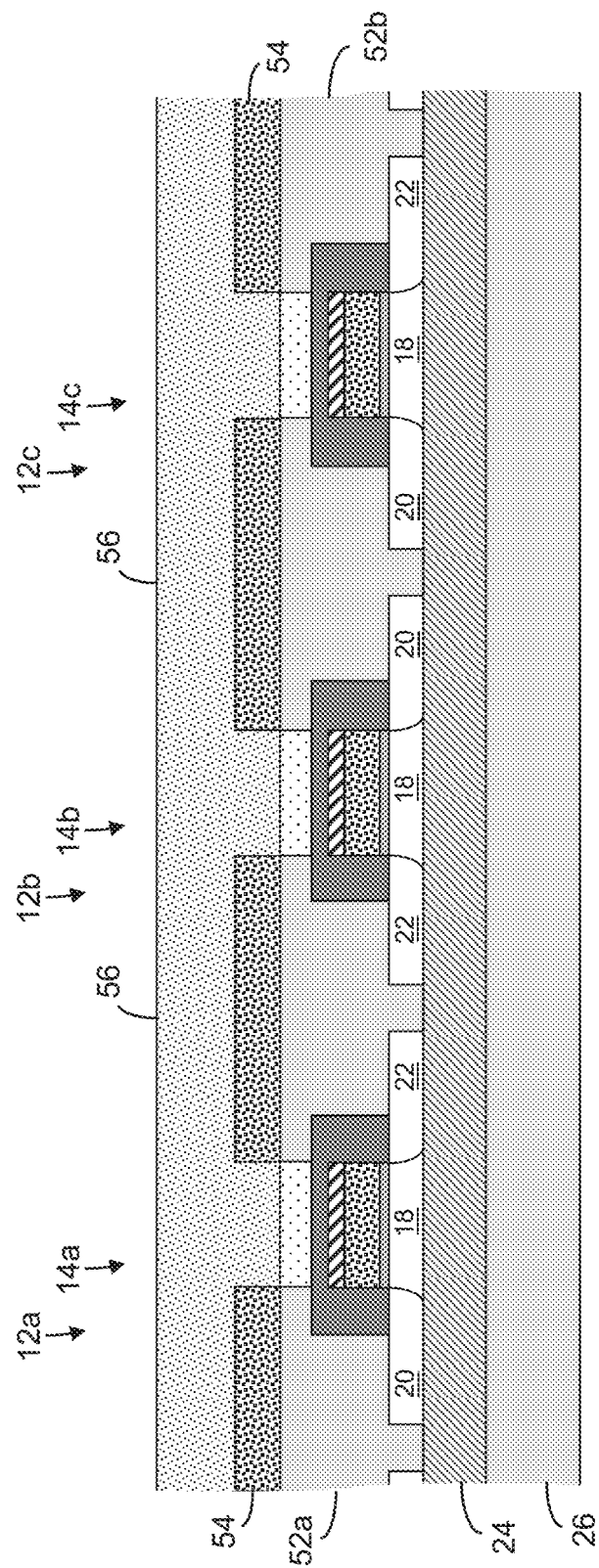
Figure 19J:
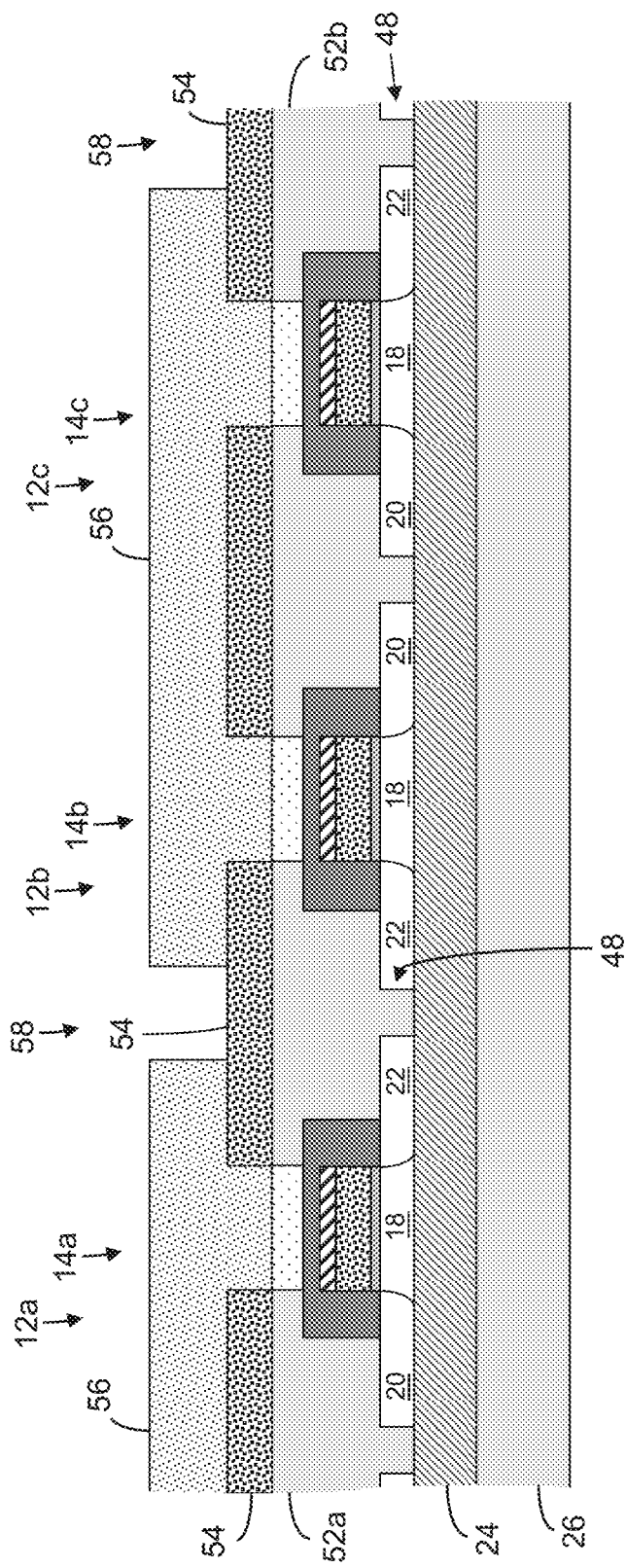
Figure 19K:
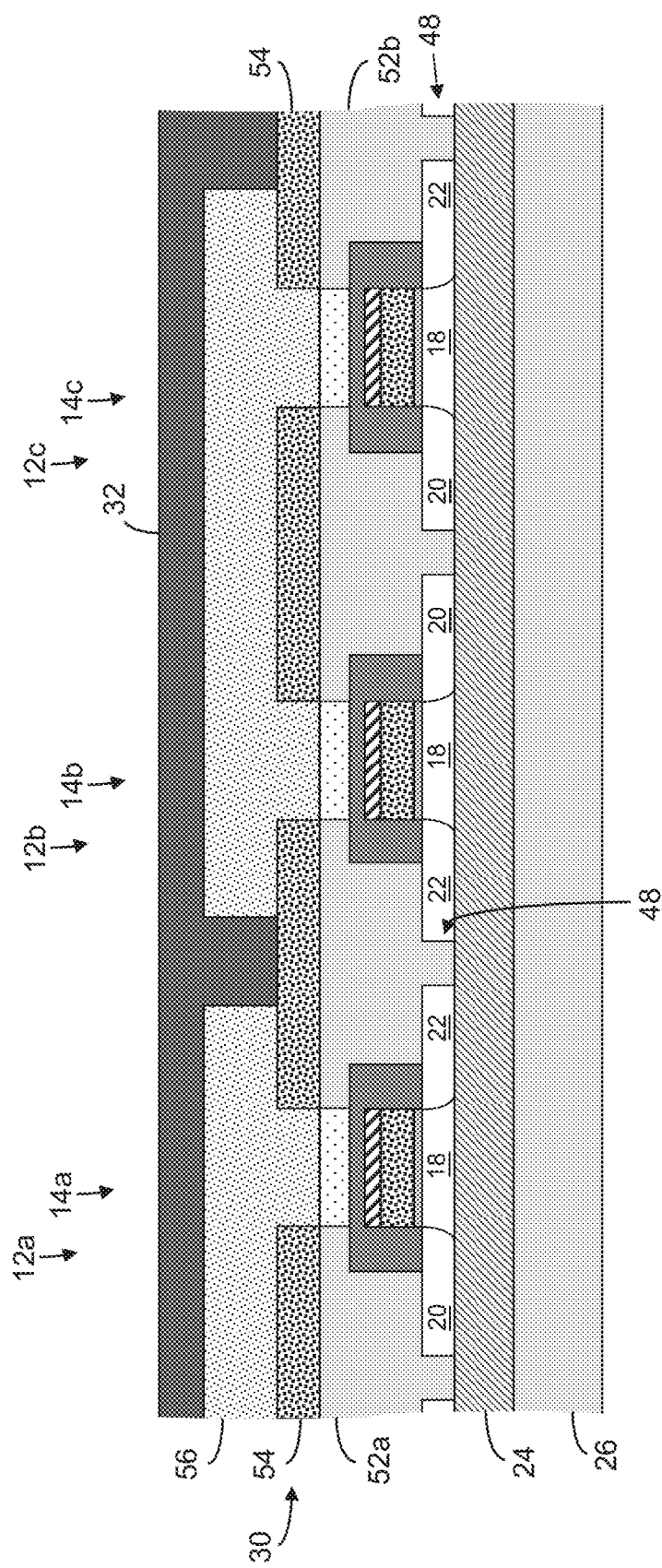

Initially, the manufacturing of the memory cell array of FIG. 18 may be similar to the manufacturing of the memory cell arrays of FIGS. 13 and 15. (Compare, FIGS. 19A-19D with FIGS. 14A-14E and/or 16A-16D). For the sake of brevity, the discussions pertaining to FIGS. 19A-19D will not be repeated.

With reference to FIGS. 19E and 19F, an insulating material 50a-50c may then be deposited, grown, formed and/or provided on the on and over cap/spacer structure 38 and the gate of transistors 14a-14c of memory cells 12a-12c, respectively. In this way, the source line and bit line contacts to source and drain regions 20 and 22, respectively, are substantially self-aligned.

Thereafter, contact 52a is deposited, grown and/or formed on source regions 20 and in trench 42b. (See, FIG. 19G). Concurrently, contact 52b is deposited, grown and/or formed on drain regions 22 and in trench 42b. The contacts 52a and 52b may include a conductive material (for example, a metal such as tungsten, titanium, titanium nitride, copper and/or aluminum) and/or a semiconductor material (for example, a polycrystalline semiconductor (such as silicon), amorphous semiconductor (such as silicon) and/or silicon germanium; all semiconductor examples may be doped or undoped.

The contacts 52a and 52b may be the same material as the material of source regions 20 and/or drain regions 22 but include a different crystalline structure. In this regard, as noted above, source and drain regions (20 and 22, respectively) of transistors 14 are often formed in a monocrystalline semiconductor layer or material (for example, monocrystalline silicon) disposed on insulation or non-conductive region 24. Under this circumstance, contacts 52a and 52b may be fabricated or formed from the same material (for example, silicon) but include a different crystalline structure (for example, a polycrystalline or amorphous structure). In this way, the barriers (i.e., those portions of the contact that are disposed in and between the common source and/or drain regions) provide a "discontinuity" based on differing crystalline structure.

With reference to FIGS. 19H-19K, in one embodiment, a conductive material 54 may be deposited, grown and/or formed on contacts 52a and 52b. The conductive material facilitates electrical connection of source and bit lines 30 and 32, respectively, to contacts 52a and 52b, respectively. Indeed, conductive material 54 may be employed as or form at least a portion of source and bit lines 30 and 32, respectively. Thereafter, insulation material 56 may be deposited, grown and/or formed on contacts 52a and 52b (see FIG. 19I) and via holes 58 (see, FIG. 19J) formed to facilitate electrical connection to an associated bit line 32 (see, FIG. 19K).

As mentioned above, additional processing may be employed to "protect" transistors and/or other elements (active and/or passive) in the periphery circuitry or logic portion of the integrated circuit. In this regard, a mask (soft or hard) or other protective layer may be disposed on or over such transistors and/or other elements (active and/or passive) in the periphery circuitry or logic portion of the integrated circuit during formation of, for example, trenches 42a and 42b.

Figure 20C:
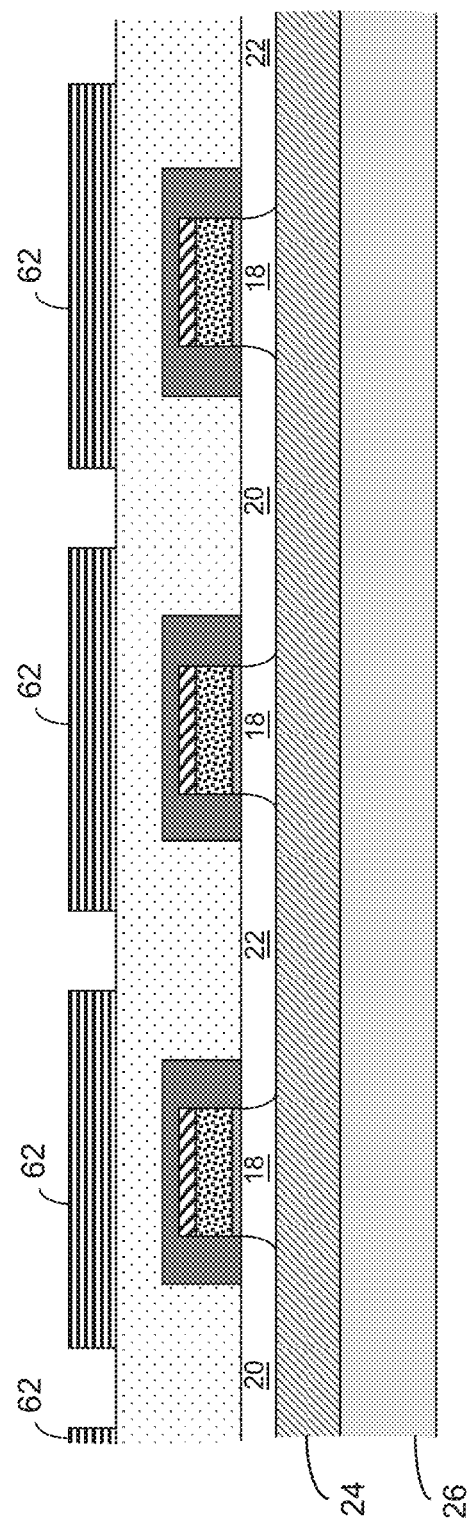

Notably, certain of the process or manufacturing flow/stages of the above exemplary embodiments have been described in the context of a self-aligned process. The inventions described herein may also be employed in processes that are partially self-aligned or process that are not self-aligned. For example, with reference to FIGS. 20A and 20B, after formation of transistors 14 of memory cells 12 in the manner, for example, as described above (see, FIG. 20A), a sacrificial layer 60 may be deposited, formed, grown and/or provided. The sacrificial layer 60 may include an insulating material, for example, a silicon oxide and/or a silicon nitride.

Thereafter, mask 62 may be formed on sacrificial layer 60 using, for example, conventional techniques. (See, FIG. 20C). Selected portions of sacrificial layer 60 may then be etched, removed and/or patterned to form and/or provide trenches 42a which expose selected portions 44 of source and drain regions (20 and 22, respectively) of transistors 14 of memory cells 12 of the memory cell array. (See, FIG. 20D). In one embodiment, an anisotropic etch technique is employed to form trenches 42a.

With reference to FIGS. 20D and 20E, portions 44 of source and drain regions (20 and 22, respectively) of transistors 14 of memory cells 12 may then be etched and/or removed to form and/or provide trenches 42b. In one embodiment, portions 44 of source and drain regions (20 and 22, respectively) are etched and/or removed to or substantially to insulation region or non-conductive region 24. Where selected portions of 44 are removed entirely, trenches 42b expose selected portions 46 of insulation region or non-conductive region 24 in the memory cell array.

Figure 20F:
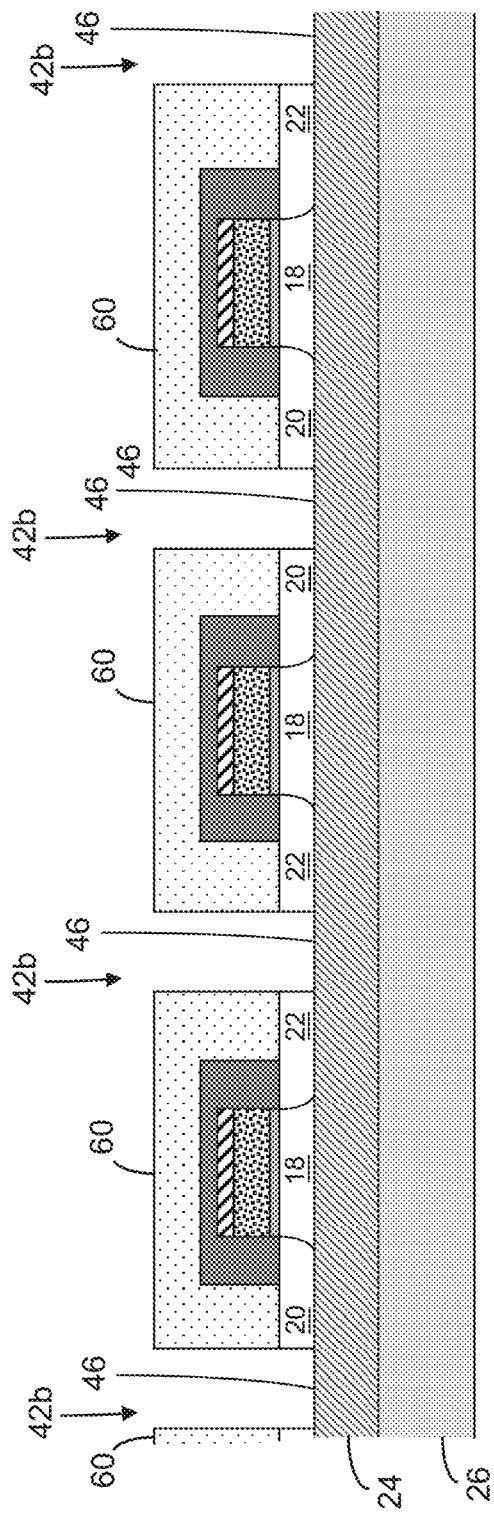
Figure 20G:
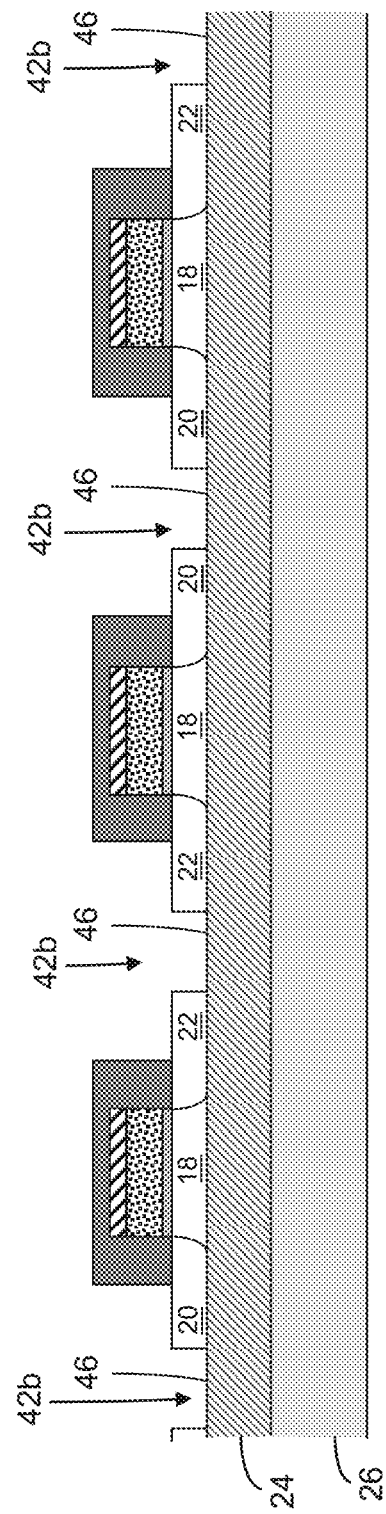
Figure 20H:
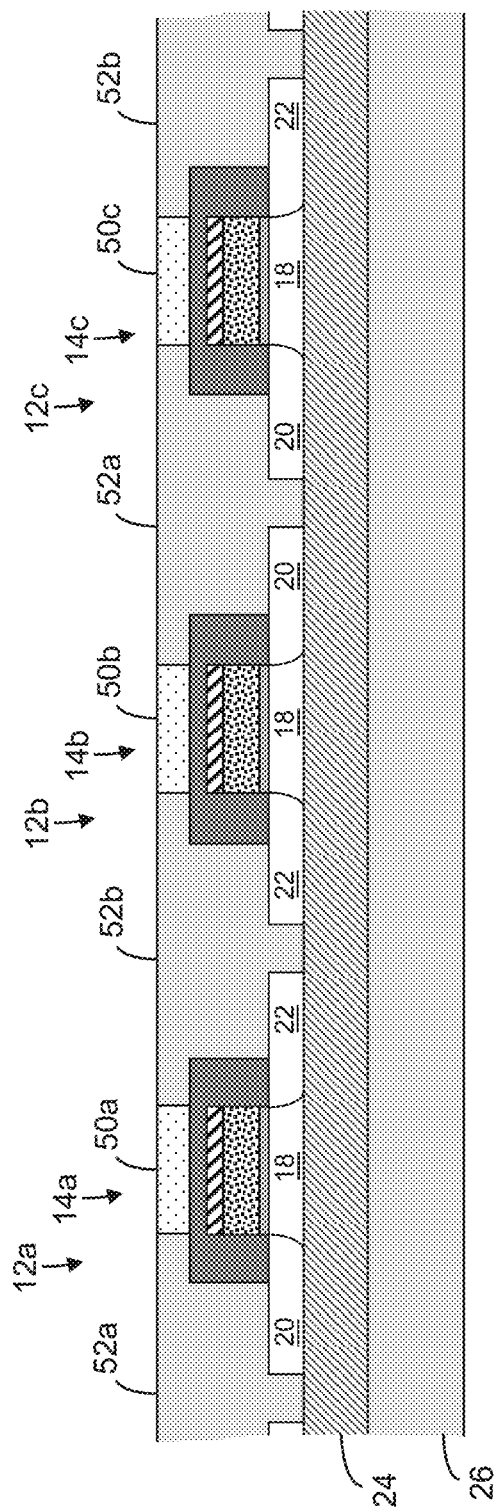

Thereafter, mask 62 may be removed (see, FIG. 20F) and the sacrificial layer 60 may be removed (see, FIG. 20G). The memory cell array may be completed using any of the techniques described herein. For example, contact 52a may be deposited, grown and/or formed on source regions 20 and therebetween (i.e., in trench 42b). (See, FIG. 20H). Concurrently, contact 52b is deposited, grown and/or formed on drain regions 22 and therebetween (i.e., in trench 42b). The contacts 52a and 52b may include a conductive material (for example, a metal such as tungsten, titanium, titanium nitride, copper and/or aluminum) and/or a semiconductor material (for example, a polycrystalline semiconductor (such as silicon), amorphous semiconductor (such as silicon) and/or silicon germanium. The semiconductor material may be doped or undoped.

Alternatively, in another embodiment, mask 62 may be removed (see, FIG. 20F) and barrier 48 may be disposed in trench 42b (see, FIG. 20I). The timing of the etch of barrier 48 and/or the amount of material of barriers 48 which is removed may be selected and/or predetermined to provide the desired structure. For example, barrier 48 may be substantially planar relative to the source and/or drain regions. (See, FIG. 20J). The barrier 48 need not be substantially planar relative to the source and/or drain regions. (See, for example, FIGS. 20K and 20L). The memory cell array of FIGS. 20H, 20J, 20K and 20L may be completed using any of the processing techniques which are described and/or illustrated herein. (See, for example, FIGS. 16G-16M). For the sake of brevity, those discussions will not be repeated.

In each of the embodiments of FIGS. 20H, 20J, 20K and 20L, the electrical characteristics of the material(s) disposed between the common source regions and/or common drain regions of transistors of adjacent memory cells may facilitate and/or provide for sufficiently and relatively rapid recombination of charge carriers (minority and/or majority) from adjacent memory cells that share source regions and/or shared drain regions. Such sufficiently and relatively rapid recombination may minimize, reduce and/or eliminate any disturbance and/or adverse impact on a given memory cell (for example, reduction in the read window) during implementation of one or more memory operations (for example, a read and/or write operation(s)) on memory cells adjacent to such given memory cell. Thus, in these embodiments, the material(s) disposed between the common source regions and/or common drain regions provide a discontinuity (due to, for example, the different material(s) and/or different crystalline structure(s)) between or in the common source regions and/or common drain regions of the transistors of adjacent memory cells.

Figure 21A:
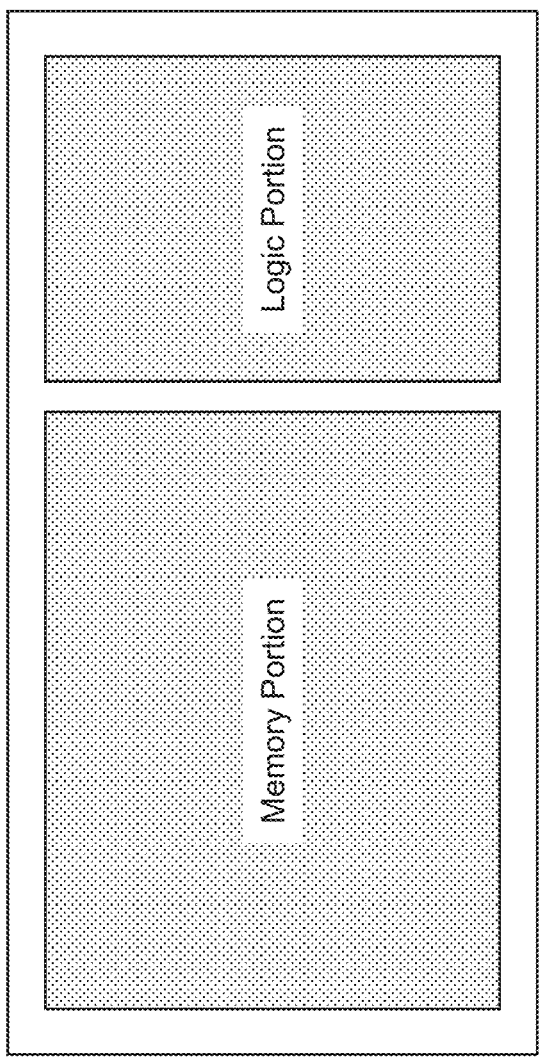
Figure 21B:
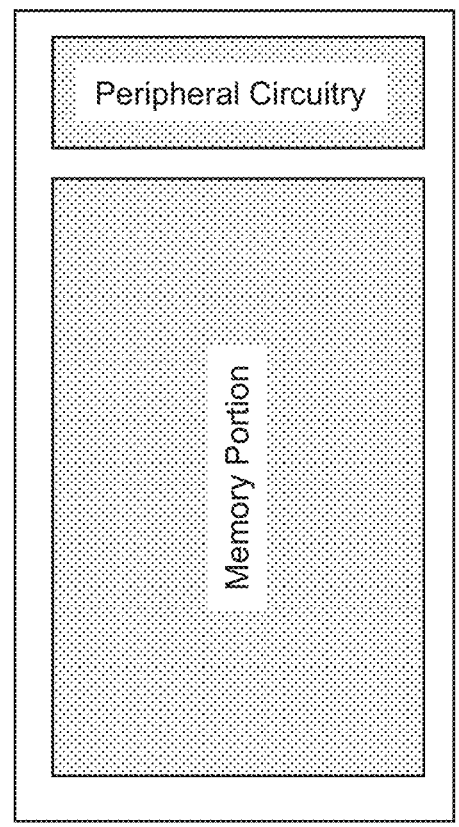
Figure 23A:
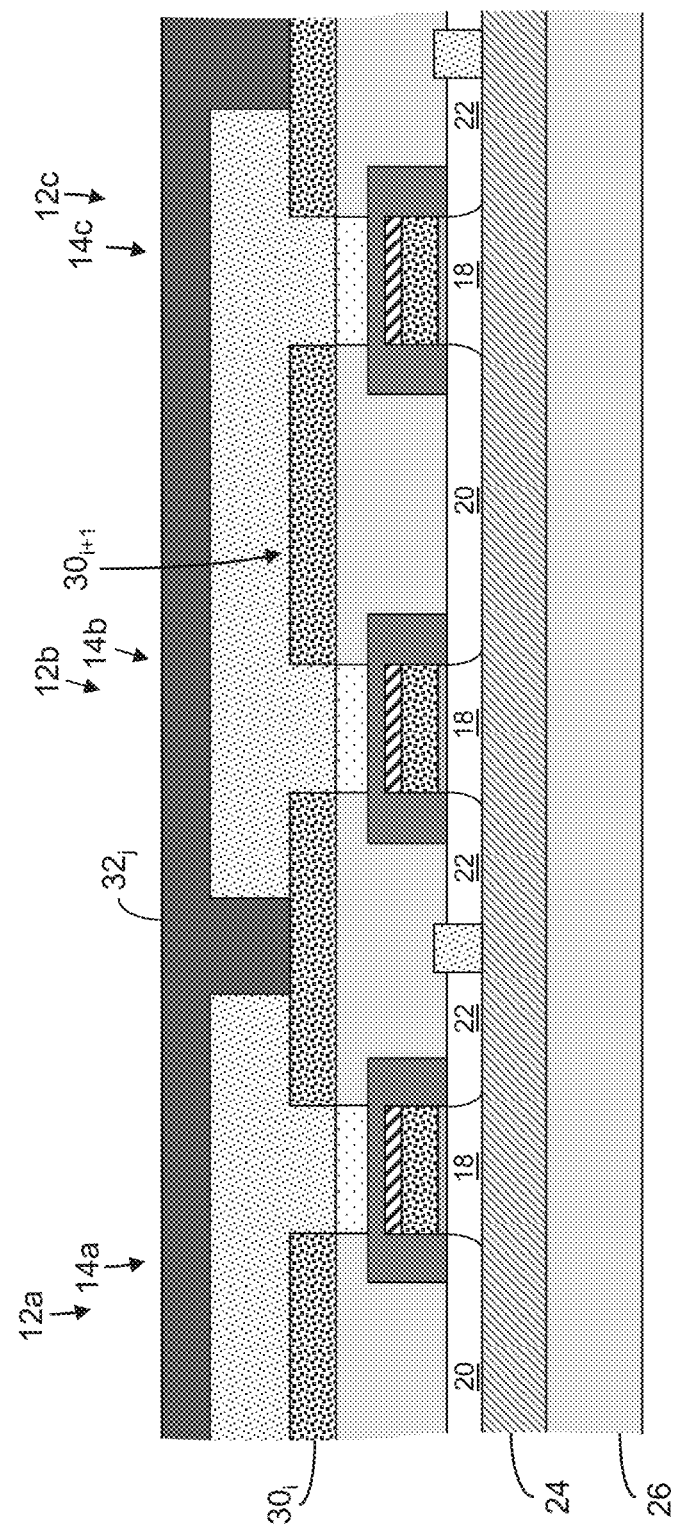
FIGS. 23A-23D are cross-sectional view of a portion of memory cell array of FIG. 22A wherein each illustrates an exemplary embodiment of the present inventions in conjunction with the shared drain region according to an aspect of the present inventions.
Figure 23B:
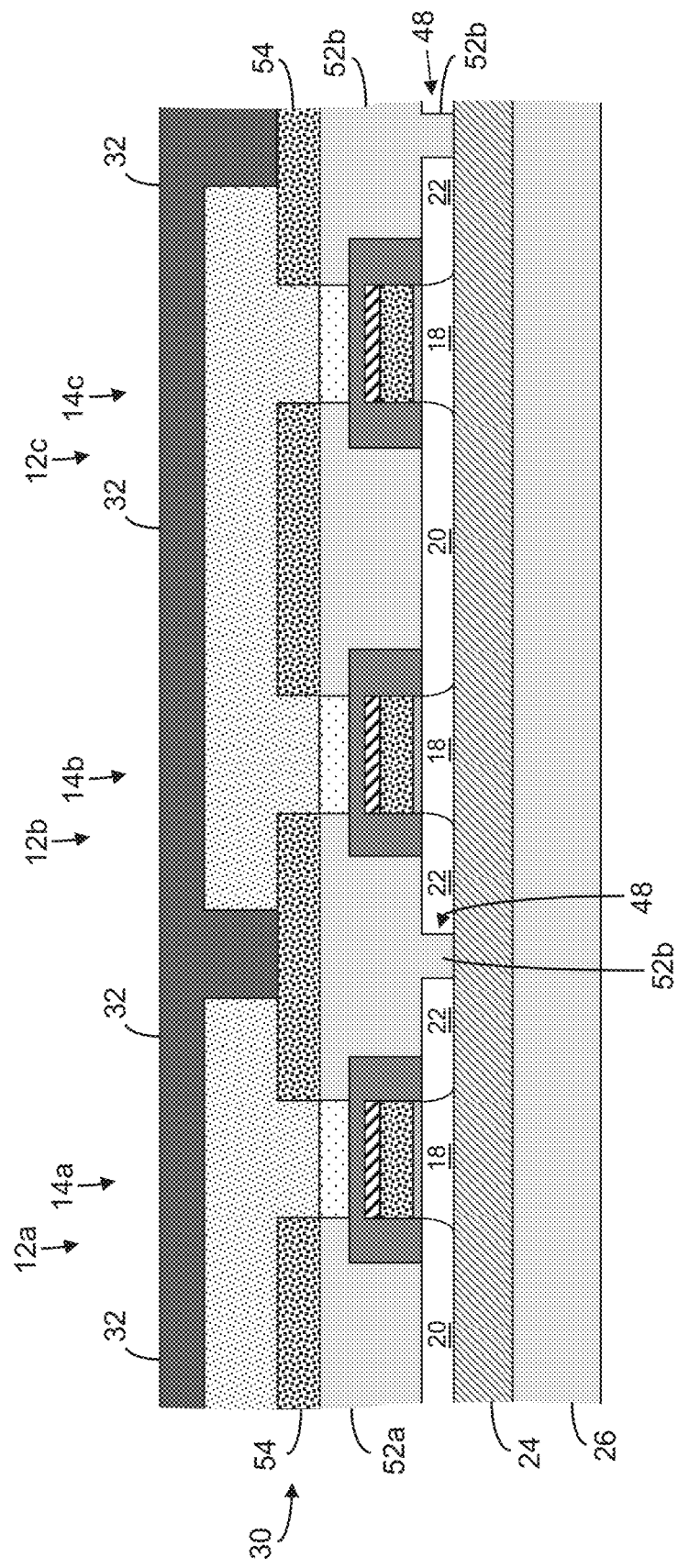
Figure 23C:
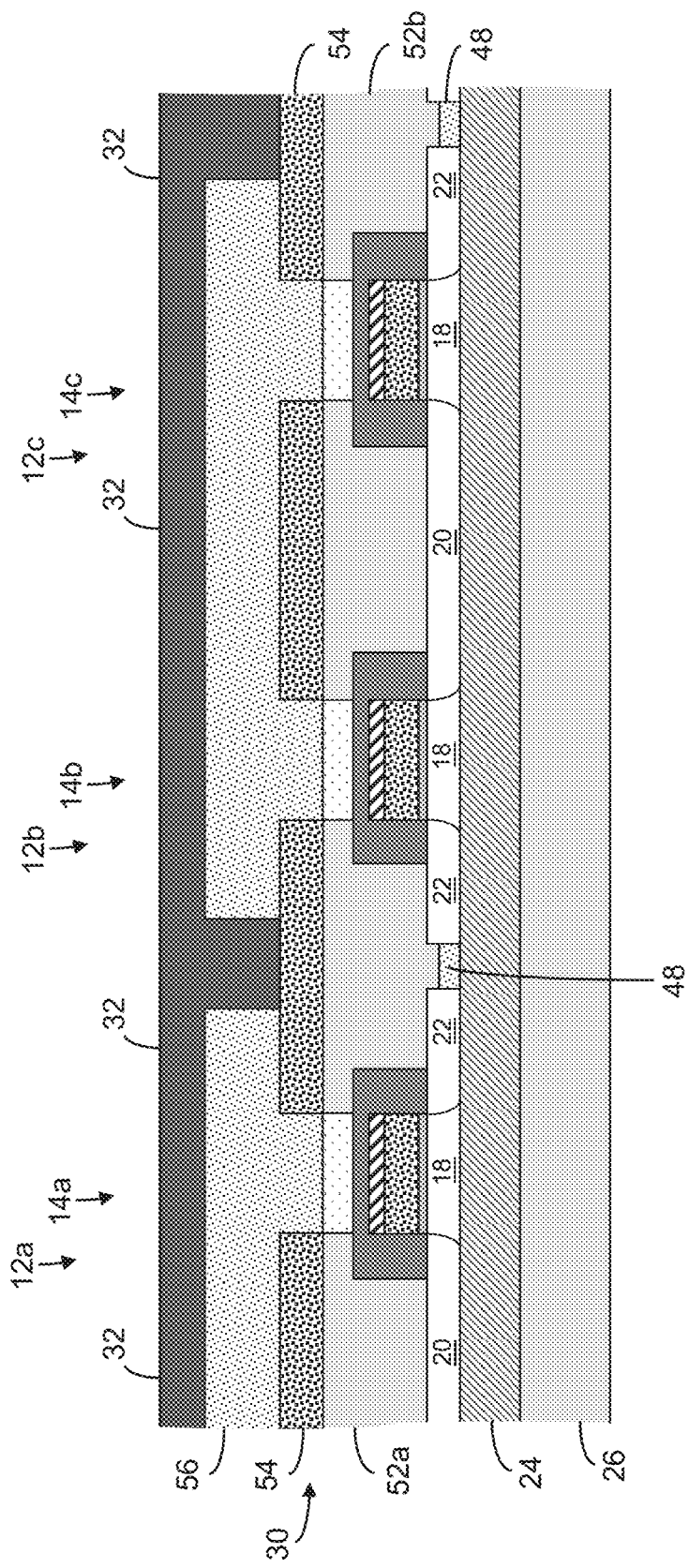
Figure 23D:
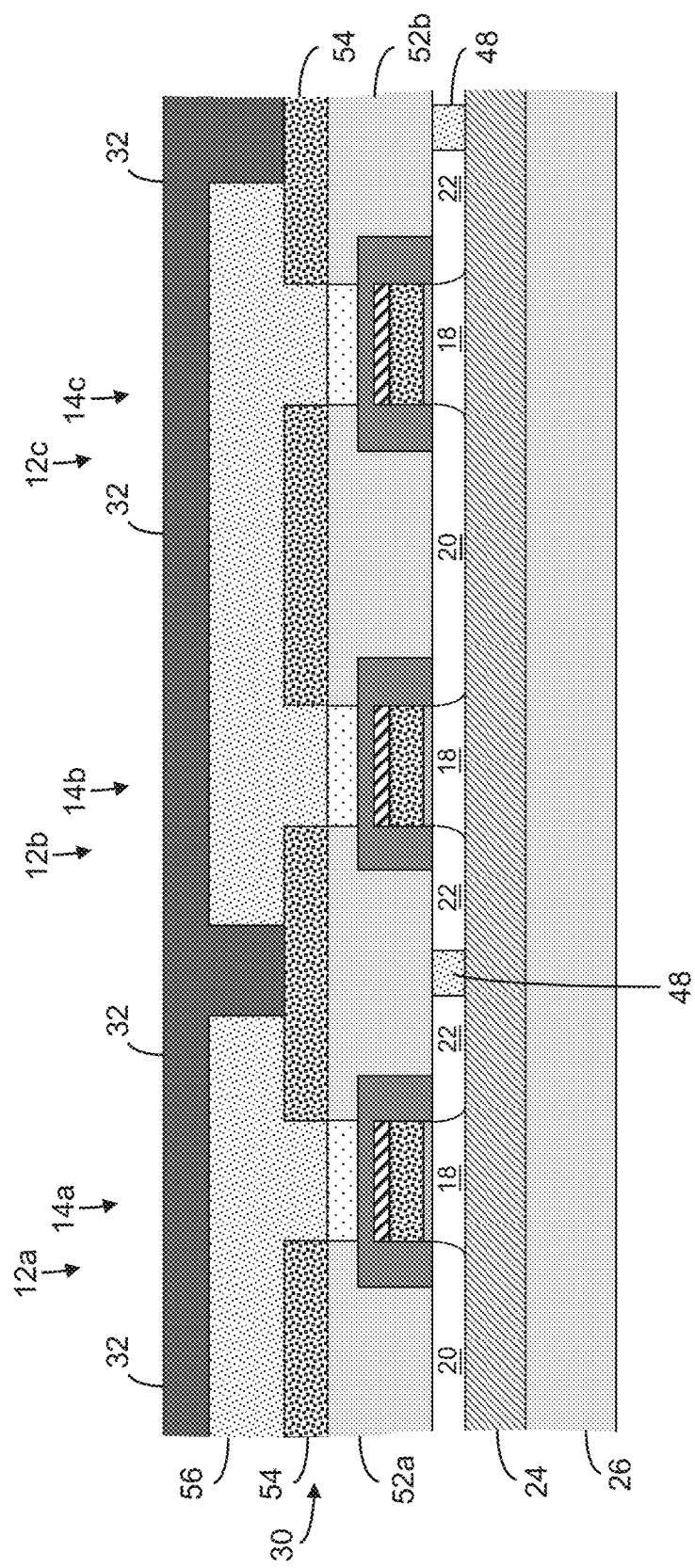
Figure 24A:
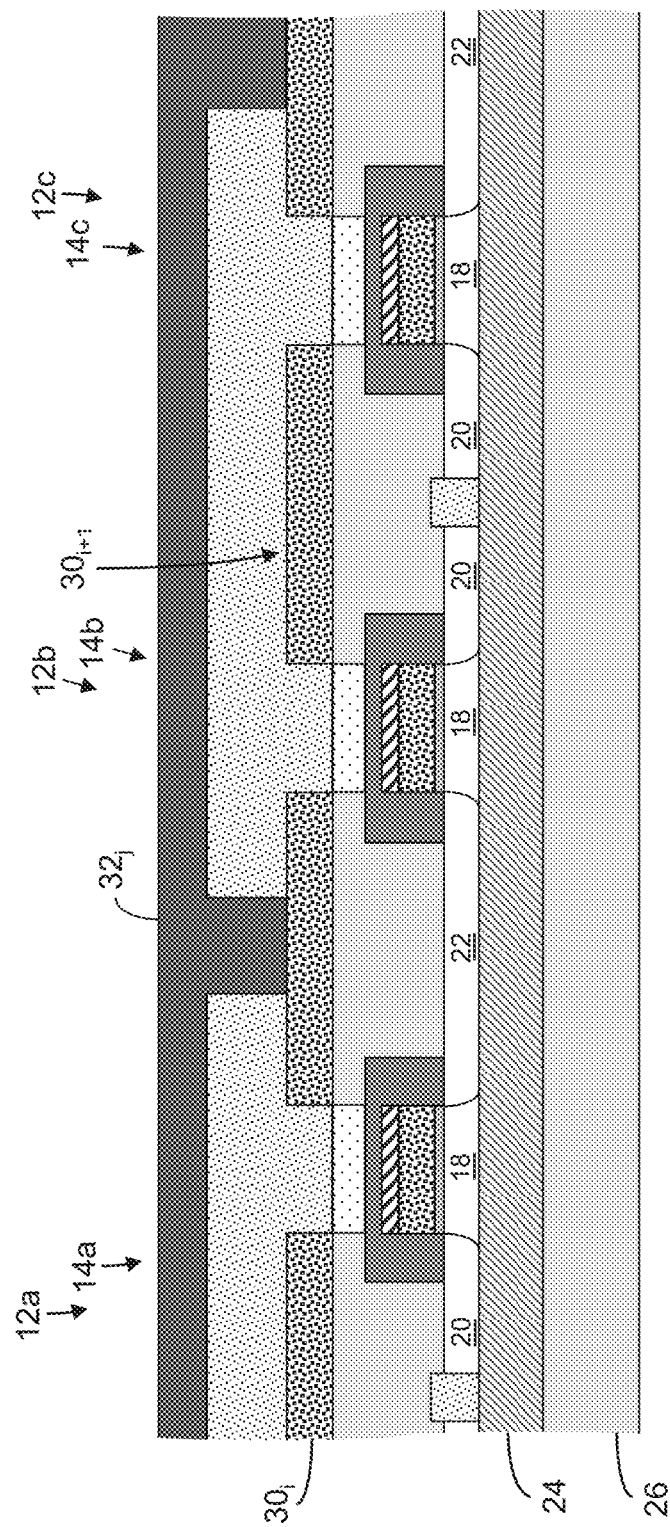
FIGS. 24A-24D are cross-sectional view of a portion of memory cell array of FIG. 22B wherein each illustrates an exemplary embodiment of the present inventions in conjunction with the shared source region according to an aspect of the present inventions.
Figure 24B:
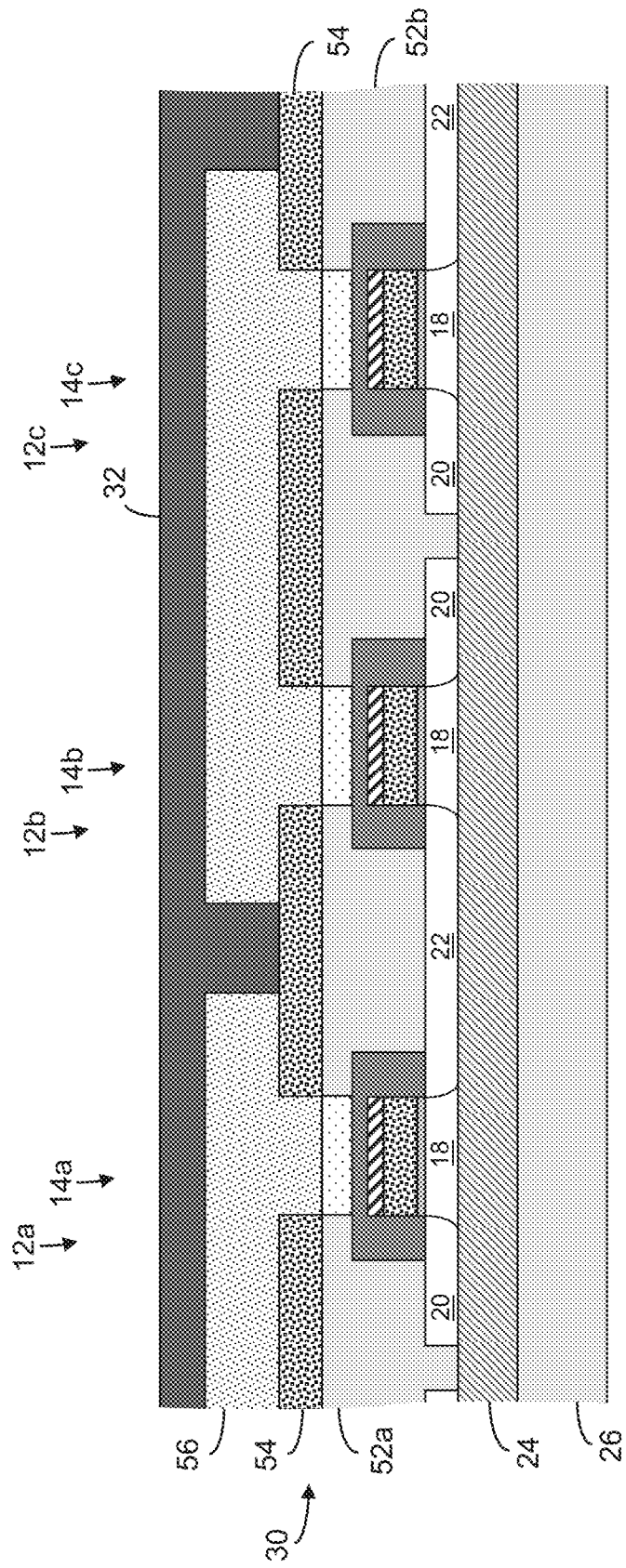
Figure 24C:
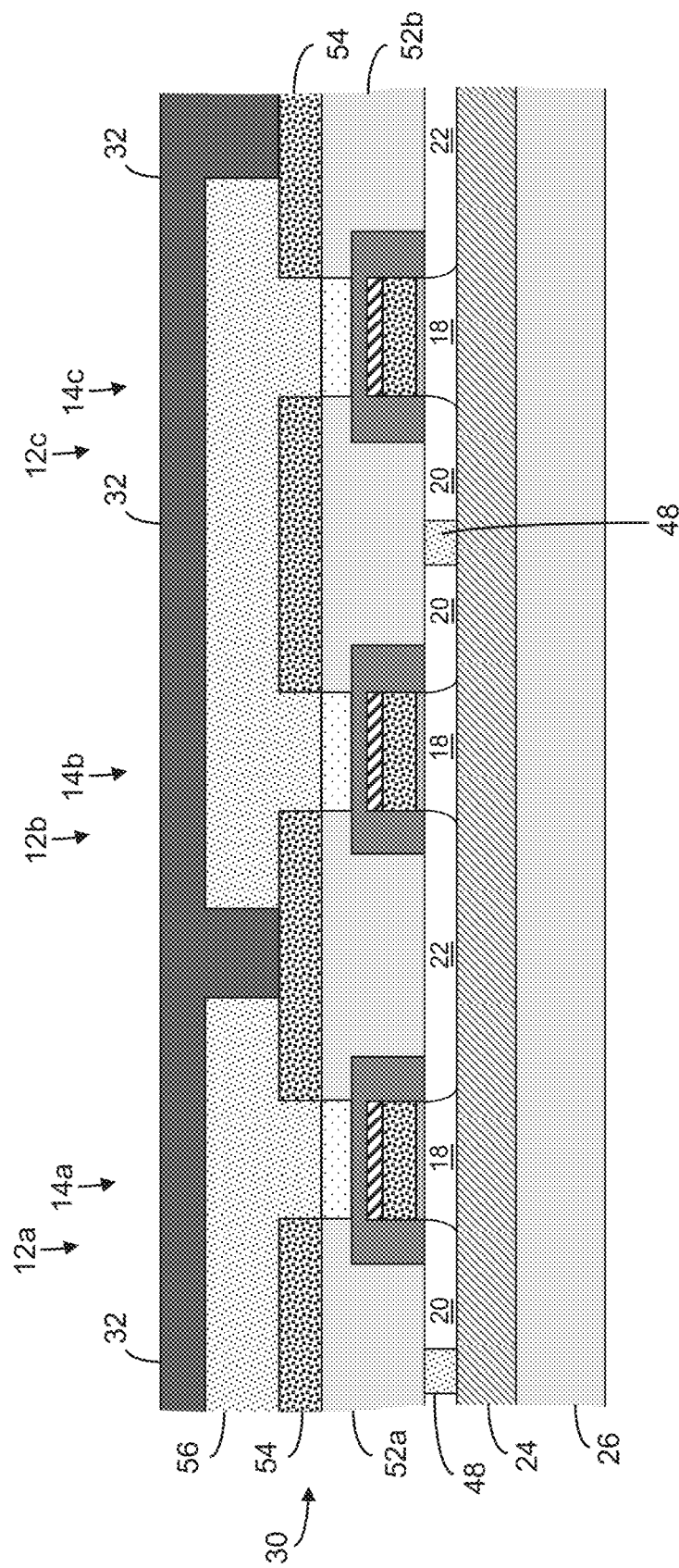
Figure 24D:
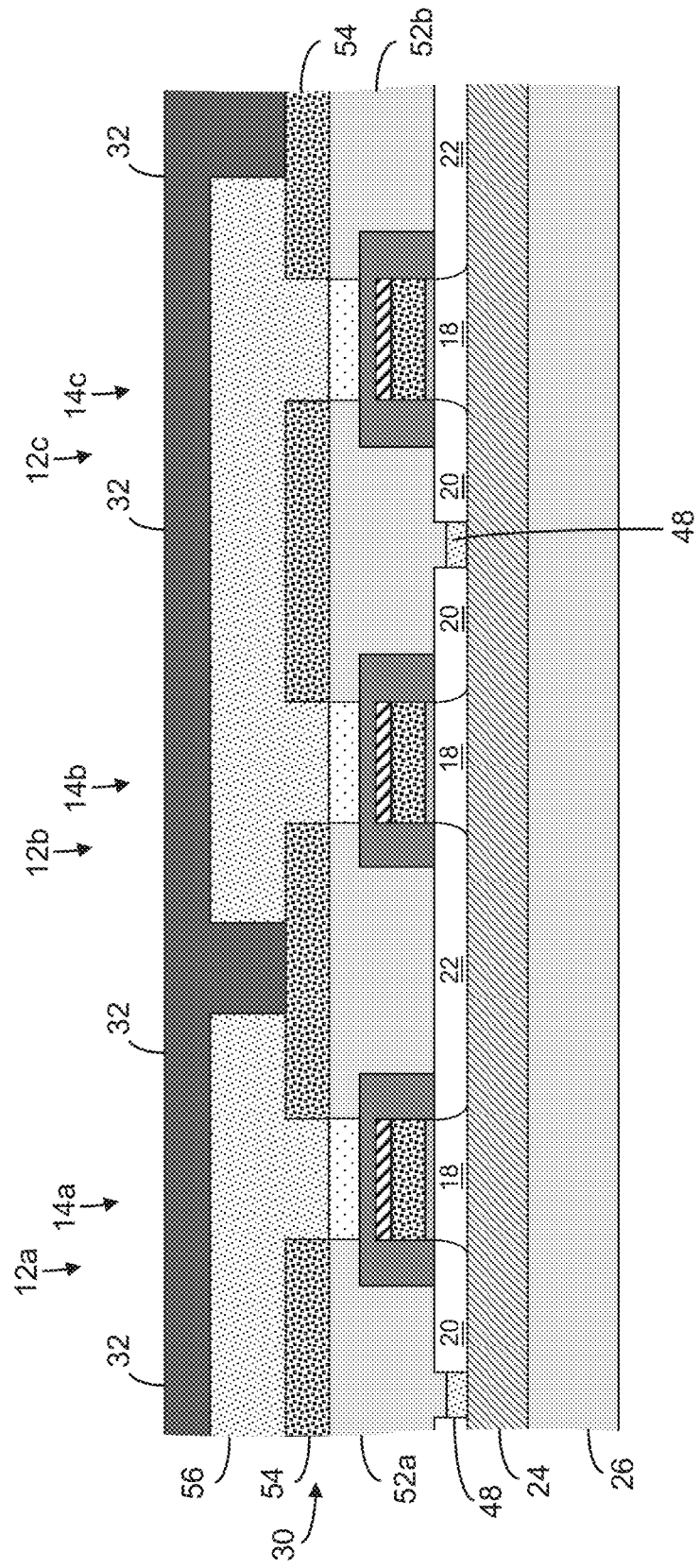

As noted above, the present inventions may be implemented in an integrated circuit device includes memory section (having a plurality of memory cells, for example, PD or FD SOI memory transistors) whether or not the integrated circuit includes a logic section (having, for example, high performance transistors, such as FinFET, multiple gate transistors, and/or non-high performance transistors (for example, single gate transistors that do not possess the performance characteristics of high performance transistors—not illustrated)). In this regard, the present inventions may be implemented in an integrated circuit device having a memory portion and a logic portion (see, for example, FIGS. 21A and 21C), or an integrated circuit device that is primarily a memory device (see, for example, FIG. 21B). The memory cell arrays may be comprised of N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), and/or the row and column address decoders) may include P-channel and/or N-channel type transistors.

Further, as mentioned above, the present inventions may be employed in conjunction with any memory cell technology now known or later developed. For example, the present inventions may be implemented in conjunction with a memory array, having a plurality of memory cells each including an electrically floating body transistor. (See, for example, (1) U.S. Pat. No. 6,969,662, (2) Okhonin et al., U.S. Patent Application Publication No. 2006/0131650 ("Bipolar Reading Technique for a Memory Cell Having an Electrically Floating Body Transistor"), (3) Okhonin et al., U.S. Patent Application Publication No. 2007/0058427 ("Memory Cell and Memory Cell Array Having an Electrically Floating Body Transistor, and Methods of Operating Same"), (4) Okhonin, U.S. Patent Application Publication No. 2007/0138530 ("Electrically Floating Body Memory Cell and Array, and Method of Operating or Controlling Same"), and (5) Okhonin et al., U.S. Patent Application Publication No. 2007/0187775 ("Multi-Bit Memory Cell Having Electrically Floating Body Transistor, and Method of Programming and Reading Same"). In this regard, the memory cell may consist of a PD or a FD SOI transistor (or transistor formed on or in bulk material/substrate) having a gate, which is disposed adjacent to the electrically floating body and separated therefrom by a gate dielectric. The body region of the transistor is electrically floating in view of the insulation or non-conductive region (for example, in bulk-type material/substrate) disposed beneath the body region. The state of memory cell is determined by the concentration of charge within the body region of the SOI transistor.

The memory cells of the memory cell array may be comprised of N-channel, P-channel and/or both types of transistors. Indeed, circuitry that is peripheral to the memory array (for example, sense amplifiers or comparators, row and column address decoders, as well as line drivers (not illustrated in detail herein)) may include P-channel and/or N-channel type transistors. Moreover, the present inventions may be implemented in conjunction with any memory cell array configuration and/or arrangement of the memory cell array.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Figure 25:
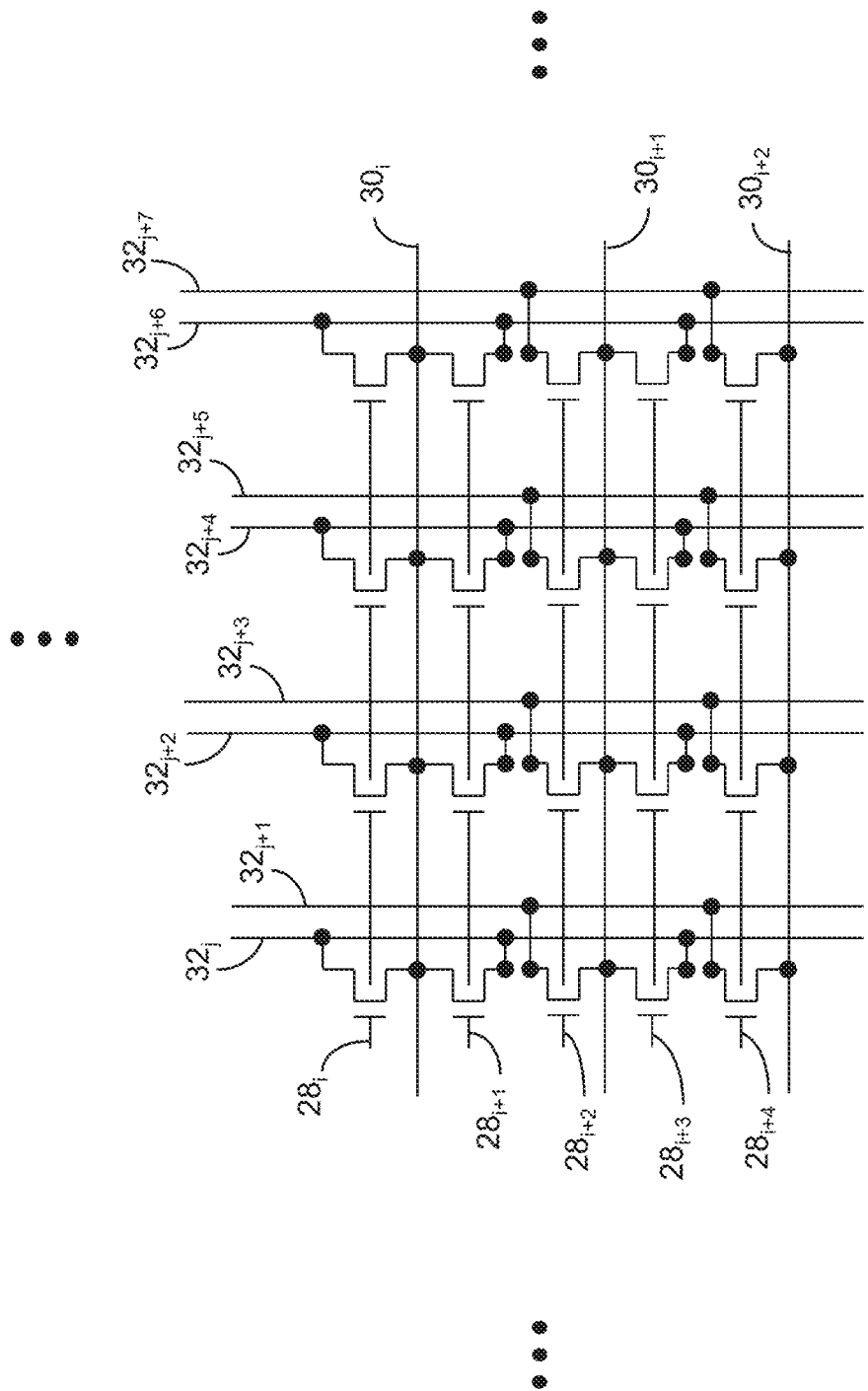
FIG. 25 is a schematic representation of a memory cell array including a plurality of memory cells comprised of one electrically floating body transistor wherein the memory cell array includes separate source lines such that the source region of each memory cell of a given row of memory cells are separated from the source region of each memory cell of the adjacent row(s) of memory cells.
Figure 26:
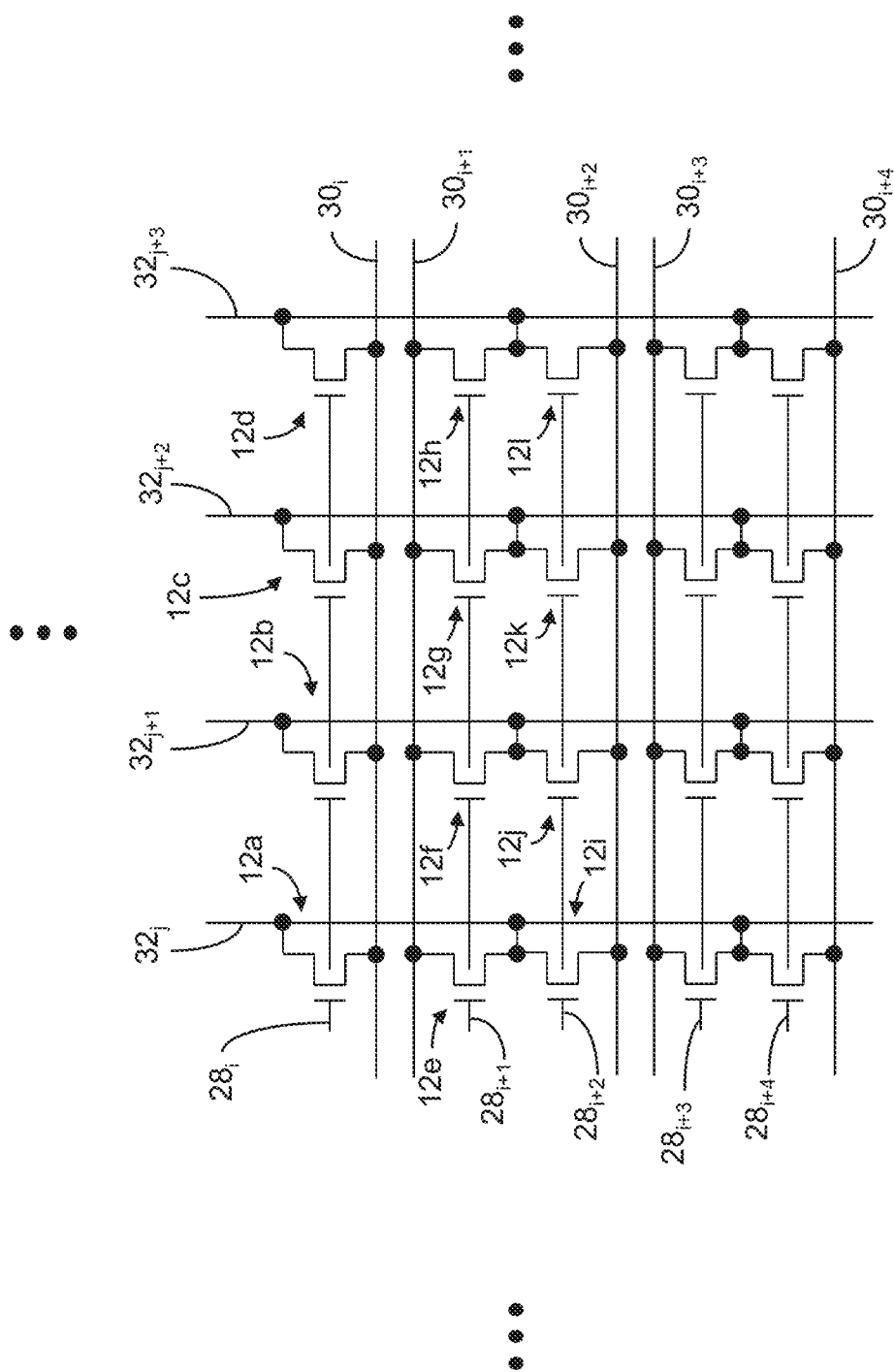
FIG. 26 is a schematic representation of a memory cell array including a plurality of memory cells comprised of one electrically floating body transistor wherein the memory cell array includes separate drain lines such that the drain region of each memory cell of a given row of memory cells are separated from the drain region of each memory cell of the adjacent row(s) of memory cells.
Figure 27B:
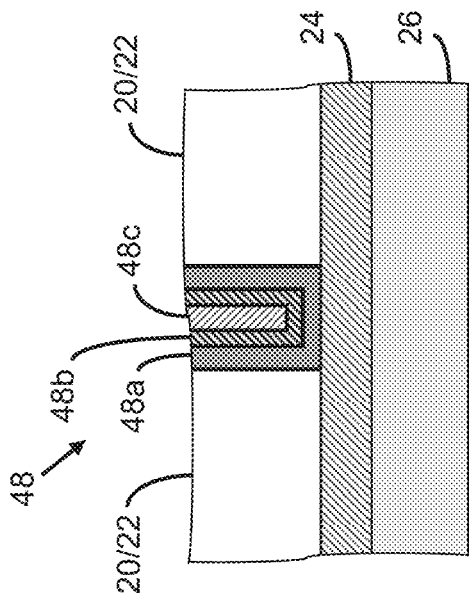
FIGS. 27A-27D illustrate exemplary embodiments of a portion of a barrier in conjunction with source or drain regions, the substrate, and the insulation region or non-conductive region; wherein the barrier includes a plurality of different materials and/or different crystalline structures; notably, in the embodiments of FIGS. 27A and 27B, the outer barrier material extend to the insulation region or non-conductive region and, in comparison, in the embodiments of FIGS. 27C and 27D, the plurality of barrier materials extend to the insulation region or non-conductive region.
Figure 27D:
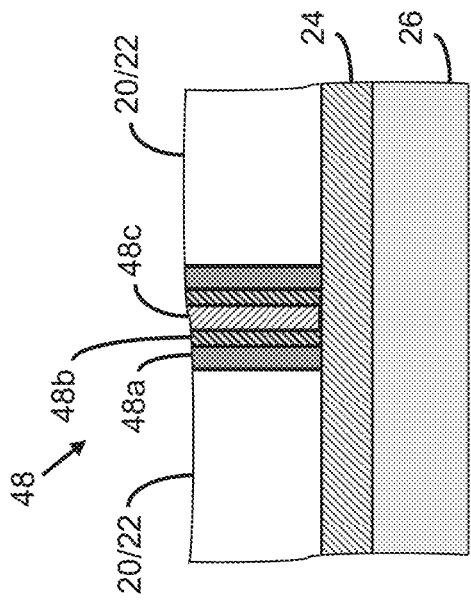
Figure 27A:
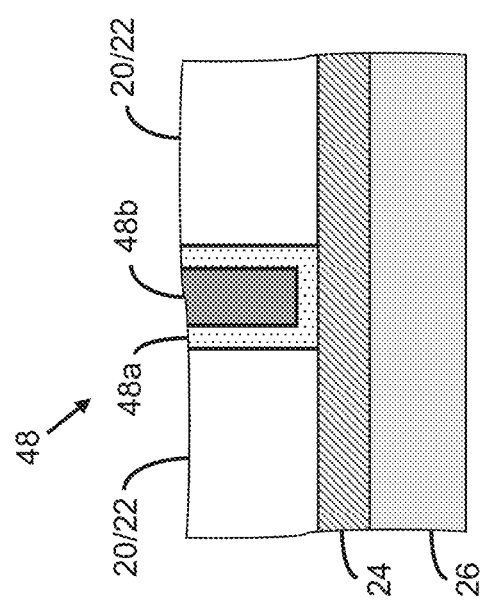
Figure 27C:
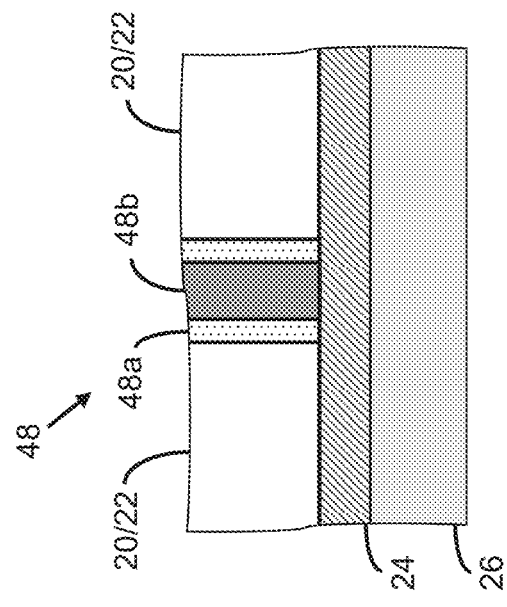

Moreover, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For example, the present inventions may employ barriers between the common drain regions (see, FIGS. 22A and 23A-23D) or barriers between the common source regions (see, FIGS. 22B and 24A-24D) or between both the common drain regions and common source regions (see, FIGS. 13, 15, 17 and/or 18). Indeed, the present inventions may be implemented in memory cell array architectures that do not include both common drain regions (see, FIG. 25) and/or common source regions (see, FIG. 26). For the sake of brevity, many of those permutations and combinations are not discussed separately herein.

Further, barriers may include more than one material and/or material(s) having one or more crystalline structures. For example, in one exemplary embodiment, barriers are formed via successive depositions of different materials and/or materials having different crystalline structures (See, for example, FIGS. 27A-27D). In one exemplary embodiment, material 48a may have a first crystalline structure (for example, amorphous) and material 48b may have a second crystalline structure (for example, polycrystalline). In this embodiment, materials 48a and 48b may be the same material (for example, silicon) or different materials.

With continued reference to FIGS. 27A-27D, in another exemplary embodiment, material 48a may have a first material (for example, silicon oxide) and material 48b may have a second material crystalline structure (for example, polycrystalline silicon or silicon nitride). Indeed, in FIG. 27A, material 48b may be material of contact 52; similarly, in FIG. 27B, material 48c may be material of contact 52.

Notably, in the exemplary embodiments of FIGS. 27A-27D, the materials on the sidewalls (i.e., material 48a) may provide a suitable electrical characteristics to reduce, eliminate and/or minimize any disturbance and/or adverse impact on a given memory cell (for example, reduction in the read window), during performance of one or more memory operations (for example, a read and/or write operation(s)) on memory cells adjacent to such given memory cell. For example, such material may facilitate and/or provide for sufficiently rapid recombination of charge carriers (minority and/or majority) in the source and/or drain regions of the transistors of memory cells that share source regions and/or shared drain regions with transistors of adjacent memory cells. The embodiments of FIGS. 27A-27D may be employed in conjunction with any of the embodiment described and/or illustrated herein. (For example, FIGS. 13, 15, 17 and/or 18). For the sake of brevity, such discussions will not be repeated.

In addition, although in the illustrative embodiments, the barriers are depicted as being disposed on portions of insulation region or non-conductive region, the barriers may be disposed on the material of the source/drain regions. For example, with reference to FIGS. 28A-28C, barriers 48 are disposed on an un-etched portion of source/drain regions 20/22. In these embodiments, trench 42b does not extend to portions 46 of insulation region or non-conductive region. (Compare, for example, FIG. 14E. Indeed, trenches 42b may extend "into" insulation region or non-conductive region 24

(i.e., "overetched"). In these embodiments, barriers 48 extend into insulation region or non-conductive region 24.

Notably, the embodiments of FIGS. 28A-28D (as well as the embodiments wherein barriers 48 extend into insulation region or non-conductive region 24) may be employed in conjunction with any of the embodiment described and/or illustrated herein. (For example, FIGS. 13, 15, 17 and/or 18). For the sake of brevity, such discussions will not be repeated.

As such, the above embodiments of the present inventions are merely exemplary embodiments. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present inventions. As such, the foregoing description of the exemplary embodiments of the inventions has been presented for the purposes of illustration and description. Many modifications and variations are possible in light of the above teaching. It is intended that the scope of the inventions not be limited solely to the description above.

Further, although exemplary embodiments and/or processes have been described above according to a particular order, that order should not be interpreted as limiting but is merely exemplary. Moreover, implementing and/or including certain processes and/or materials may be unnecessary and/or may be omitted. For example, material 54 may be eliminated before deposition, growth and/or formation of bit line 32 and/or source line 30 (i.e., in those embodiments where the source lines are connected to associated source regions of transistors of associated memory cells by way of the same or similar material and manner as described above with respect to bit lines 32).

Notably, electrically floating body transistor 14 of memory cell 12 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel transistor of the memory cell (whether the source and drain regions are interchangeable or not) is that region of the transistor that is connected to the bit line which is coupled to data sense circuitry (for example, a sense amplifier and/or an analog-to-digital converter).

The term "depositing" and other forms thereof (i.e., deposit, deposition and/or deposited) in the claims, means, among other things, depositing, creating, forming and/or growing a material (for example, a layer of material). Further, in the claims, the term "etching" and other forms thereof (i.e., etch and/or etched) in the claims, means, among other things, etching, removing and/or patterning a material (for example, all or a portion of a layer of material). In addition, the term "forming" and other forms thereof (i.e., form, formation and/or formed) in the claims means, among other things, fabricating, creating, depositing, implanting, manufacturing and/or growing a region (for example, in a material or a layer of a material).

The invention claimed is:

1. A system comprising:
    a memory cell array including a plurality of memory cells, wherein a memory cell of the plurality of memory cells comprises:
        a transistor having a gate, a gate dielectric, and source, drain, and body regions, wherein: (i) the body region is electrically floating; and (ii) the source region is a first source region and is a portion of a common source region that is shared with a transistor of an adjacent memory cell;
        wherein the common source region is formed with an associated barrier disposed therein to form a discontinuity between separate portions of the common source region such that a first portion of the common source region forming the first source region of the transistor of the memory cell is separated from a second portion of the common source region forming a second source region of the transistor of the adjacent memory cell, wherein the associated barrier comprises a first lateral surface that abuts a first lateral surface of the first source region, wherein the associated barrier comprises a second lateral surface, opposite the first lateral surface of the associated barrier, that abuts a second lateral surface of the second source region, and wherein the associated barrier is disposed non-adjacent to the gate and the gate dielectric;
    memory cell selection and control circuitry for selecting individual memory cells within the memory cell array; and
    data sense circuitry for sensing a logic state of data stored within each selected individual memory cell within the memory cell array.

2. The system of claim 1, further comprising:
    row and column address decoders for decoding address signals to provide gate, source, and drain signals for selecting the individual memory cells within the memory cell array.

3. The system of claim 1, wherein the associated barrier includes one or more materials that are different from a material of the common source regions.

4. The system of claim 1, wherein the associated barrier includes one or more insulator, semiconductor and/or metal materials.

5. The system of claim 1, wherein the associated barrier includes one or more materials having one or more crystalline structures that are different from a crystalline structure of a material of the common source regions.

6. The system of claim 1, wherein a transistor of a second adjacent memory cell is formed with a common second region, and wherein the memory cell array further includes: a second associated barrier, wherein the common second region is formed with the second associated barrier disposed therein.

7. The system of claim 6, wherein the second associated barrier includes one or more materials that are different from a material of the common second region.

8. The system of claim 6, wherein the second associated barrier includes one or more insulator, semiconductor and/or metal materials.

9. The system of claim 6, wherein the second associated barrier includes one or more materials having one or more crystalline structures that are different from a crystalline structure of a material of the common second region.

10. The system of claim 1, wherein the body region of the transistor of each memory cell of the memory cell array is electrically floating, and wherein each memory cell is programmable to store one of a plurality of logic states, each logic state is representative of a charge in the body region of the associated transistor.

11. The system of claim 1, wherein the body region of the transistor of each memory cell of the memory cell array is electrically floating, and wherein each memory cell is programmable to store one of two logic states, each logic state is representative of a charge in the body region of the associated transistor.

12. The system of claim 1, wherein the memory cell array further comprises a plurality of electrical contacts, wherein at least one electrical contact is electrically and directly coupled to separate portions of an associated common source region and its associated barrier which is disposed therein.

13. The system of claim 12, wherein the at least one electrical contact is disposed over the separate portions of the associated common source region and its associated barrier which is disposed therein.

14. The system of claim 13, wherein the at least one electrical contact is disposed on the separate portions of the associated common source region and its associated barrier which is disposed therein.

15. The system of claim 1, wherein the associated barrier includes a plurality of different materials.

16. The system of claim 1, wherein the associated barrier includes at least one insulator and at least one semiconductor.

17. The system of claim 1, wherein the associated barrier includes a plurality of materials which are different from a material of its associated common source region.

18. The system of claim 1, wherein the associated barrier includes a plurality of materials each having a different crystalline structure.

19. The system of claim 1, wherein the associated barrier includes a plurality of materials each having a crystalline structure which is different from a crystalline structure of a material of its associated common source region.

20. The system of claim 1, wherein a first portion of the common source region forming the source region of a respective transistor is separated from a second portion of the common source region forming the source region of a respective adjacent transistor, wherein the associated barrier includes one or more electrical characteristics that are different from one or more corresponding electrical characteristics of the common source region, wherein the associated barrier and the common source region are disposed over and directly coupled to a common base region.

* * * * *